US012622132B2

(12) United States Patent
Nagasaka et al.

(10) Patent No.: US 12,622,132 B2
(45) Date of Patent: May 5, 2026

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Atsugi (JP)

(72) Inventors: Akira Nagasaka, Atsugi (JP); Kunihiko Suzuki, Isehara (JP); Ryo Narukawa, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 142 days.

(21) Appl. No.: 18/229,808

(22) Filed: Aug. 3, 2023

(65) Prior Publication Data

US 2024/0081090 A1 Mar. 7, 2024

(30) Foreign Application Priority Data

Aug. 10, 2022 (JP) ................................ 2022-127992
Dec. 7, 2022 (JP) ................................ 2022-195341

(51) Int. Cl.

| | |
|---|---|
| ***H10K 50/16*** | (2023.01) |
| ***H10K 50/15*** | (2023.01) |
| ***H10K 59/131*** | (2023.01) |
| ***H10K 59/35*** | (2023.01) |
| ***H10K 59/40*** | (2023.01) |

(Continued)

(52) U.S. Cl.

CPC ......... *H10K 50/167* (2023.02); *H10K 50/157* (2023.02); *H10K 59/131* (2023.02); *H10K 59/351* (2023.02); *H10K 59/40* (2023.02); *H10K 85/6572* (2023.02); *H10K 85/6574* (2023.02);

(Continued)

(58) Field of Classification Search

None

See application file for complete search history.

(56) References Cited

U.S. PATENT DOCUMENTS

| | | | |
|---|---|---|---|
| 9,905,782 | B2 | 2/2018 | Inoue et al. |
| 10,586,931 | B2 | 3/2020 | Kanamoto et al. |

(Continued)

FOREIGN PATENT DOCUMENTS

| | | | |
|---|---|---|---|
| JP | 2014-076999 | A | 5/2014 |
| JP | 2023-090678 | A | 6/2023 |
| WO | WO-2023/094936 | | 6/2023 |

OTHER PUBLICATIONS

Sun.J et al., "Exceptionally stable blue phosphorescent organic light-emitting diodes", Nature Photonics, Feb. 24, 2022, vol. 16, pp. 212-218, Nature Publishing Group.

*Primary Examiner* — Anthony Ho

(74) *Attorney, Agent, or Firm* — Eric J. Robinson; Robinson Intellectual Property Law Office, P.C.

(57) ABSTRACT

The reliability of a light-emitting device is improved. Provided is a light-emitting device including a light-emitting layer between a first electrode and a second electrode. The light-emitting layer contains a light-emitting substance and a first organic compound. A difference between a sum of energy of the first organic compound in a ground state and energy of an oxygen molecule in a ground state and energy of a transition state formed by the first organic compound and the oxygen molecule is greater than or equal to 1.84 eV. A difference between the energy of the transition state formed by the first organic compound and the oxygen molecule and energy of an oxygen adduct of the first organic compound in a ground state is less than or equal to 0.87 eV.

12 Claims, 20 Drawing Sheets

(51) Int. Cl.
*H10K 85/60* (2023.01)
*H10K 101/10* (2023.01)
*H10K 101/30* (2023.01)

(52) U.S. Cl.
CPC ..... *H10K 85/6576* (2023.02); *H10K 2101/10* (2023.02); *H10K 2101/30* (2023.02)

(56) References Cited

U.S. PATENT DOCUMENTS

| | | | |
|---|---|---|---|
| 11,225,488 | B2 | 1/2022 | Takeda et al. |
| 11,495,753 | B2 | 11/2022 | Kurihara et al. |
| 12,043,624 | B2 | 7/2024 | Kurihara et al. |
| 12,091,416 | B2 | 9/2024 | Seo et al. |
| 12,120,900 | B2 | 10/2024 | Seo |
| 12,252,496 | B2 | 3/2025 | Watabe et al. |
| 2011/0068683 | A1 | 3/2011 | Kawamura et al. |

SiTrzCz2

PSiCzCz

PCCP

8BP-4mDBtPBfpm

αN-βNPAnth

4mDBtBPBffpm

9Ph-4mDBtBPBffpm

Compound 1

Compound 2

CzPFlt

LIGHT-EMITTING DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to a light-emitting device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

2. Description of the Related Art

A light-emitting device (also referred to as an organic EL element) including an organic compound that is a light-emitting substance between a pair of electrodes has characteristics such as being thin and light in weight, high-speed response, and low voltage driving. Thus, displays including such light-emitting devices have been developed. When a voltage is applied to this light-emitting device, electrons and holes injected from the electrodes recombine to put the light-emitting substance into an excited state. Light is emitted when the light-emitting substance returns to a ground state from the excited state. The excited state can be a singlet excited state (S*) and a triplet excited state (T*). Light emission from a singlet excited state is referred to as fluorescence, and light emission from a triplet excited state is referred to as phosphorescence. The statistical generation ratio in the light-emitting device is considered to be S*:T*=1:3.

As the above light-emitting substance, a compound capable of converting singlet excitation energy into light emission is called a fluorescent compound (fluorescent material), and a compound capable of converting triplet excitation energy into light emission is called a phosphorescent compound (phosphorescent material).

Accordingly, on the basis of the above generation ratio, the internal quantum efficiency (the ratio of the number of generated photons to the number of injected carriers) of a light-emitting device containing a fluorescent material is thought to have a theoretical limit of 25%, while the internal quantum efficiency of a light-emitting device containing a phosphorescent material is thought to have a theoretical limit of 75%.

Since light-emitting layers of such light-emitting devices can be successively formed two-dimensionally, planar light emission can be achieved. This feature is difficult to realize with point light sources typified by incandescent lamps or LEDs or linear light sources typified by fluorescent lamps; thus, such light-emitting devices also have great potential as planar light sources, which can be applied to lighting devices and the like.

To improve device characteristics of the light-emitting devices, development of a substance, improvement of a device structure, and the like have been carried out. For example, Patent Document 1 discloses a light-emitting device or the like in which a novel anthracene derivative is used as a host material to obtain a light-emitting element with high emission efficiency.

REFERENCE

[Patent Document 1] Japanese Published Patent Application No. 2014-076999

SUMMARY OF THE INVENTION

As described above, for the improvement of the characteristics of light-emitting devices, organic compounds with characteristics suitable for light-emitting elements have been developed. In blue fluorescent light-emitting devices, for example, high emission efficiency can be obtained when an anthracene derivative is used as a host material; thus, many materials using an anthracene derivative have been developed. However, an anthracene skeleton easily results in formation of an oxygen adduct by reacting with oxygen in an oxygen-existing environment. When oxygen is added to an anthracene skeleton, the characteristics of a light-emitting device using an anthracene derivative are decreased. Hence, one embodiment of the present invention uses a host material from which an oxygen adduct is less likely to be formed to provide a light-emitting device with high emission efficiency. With the use of a novel organic compound, which is one embodiment of the present invention, a light-emitting device with high emission efficiency is provided. Furthermore, a highly reliable light-emitting device is provided.

Note that the description of these objects does not preclude the existence of other objects. One embodiment of the present invention does not need to achieve all of these objects. Other objects can be derived from the description of the specification, the drawings, and the claims.

One embodiment of the present invention is a light-emitting device including a light-emitting layer between a first electrode and a second electrode. The light-emitting layer contains a light-emitting substance and a first organic compound. A difference between a sum of energy of the first organic compound in a ground state and energy of an oxygen molecule in a ground state and energy of a transition state formed by the first organic compound and the oxygen molecule is greater than or equal to 1.84 eV. A difference between the energy of the transition state formed by the first organic compound and the oxygen molecule and energy of an oxygen adduct of the first organic compound in a ground state is less than or equal to 0.87 eV.

One embodiment of the present invention is a light-emitting device including a light-emitting layer between a first electrode and a second electrode. The light-emitting layer contains a light-emitting substance and a first organic compound. A difference between a sum of energy of the first organic compound in a ground state and energy of an oxygen molecule in a ground state and energy of a transition state formed by the first organic compound and the oxygen molecule is greater than or equal to 1.84 eV. A difference between the energy of the transition state formed by the first organic compound and the oxygen molecule and energy of an oxygen adduct of the first organic compound in a ground state is less than or equal to 0.87 eV. The energy of the oxygen adduct of the first organic compound in a ground state is higher than the sum of the energy of the first organic compound in a ground state and the energy of the oxygen molecule in a ground state. A difference between the energy of the oxygen adduct of the first organic compound in a ground state and the sum of the energy of the first organic compound in a ground state and the energy of the oxygen molecule in a ground state is greater than or equal to 0.97 eV.

One embodiment of the present invention is any of the above light-emitting devices, in which the first organic compound includes a first partial structure and a second partial structure different from the first partial structure. Highest occupied molecular orbital distribution of the first organic compound is located on the first partial structure. The oxygen adduct is formed when an oxygen molecule is added to the second partial structure.

One embodiment of the present invention is a light-emitting apparatus including any of the above light-emitting devices, and a transistor or a substrate.

One embodiment of the present invention is an electronic device including the above light-emitting apparatus, and a sensor unit, an input unit, or a communication unit.

One embodiment of the present invention is a lighting device including the above light-emitting apparatus and a housing.

One embodiment of the present invention can provide a highly reliable light-emitting device. Another embodiment of the present invention can provide a light-emitting device having high emission efficiency. Another embodiment of the present invention can provide a novel light-emitting device.

Another embodiment of the present invention can provide a light-emitting apparatus, an electronic device, or a lighting device having a long lifetime. Another embodiment of the present invention can provide a light-emitting apparatus, an electronic device, or a lighting device having low power consumption. Another embodiment of the present invention can provide a novel light-emitting device, a novel electronic device, or a novel lighting device.

Note that the description of these effects does not preclude the existence of other effects. One embodiment of the present invention does not necessarily have all of these effects. Other effects can be derived from the description of the specification, the drawings, and the claims.

DETAILED DESCRIPTION OF THE INVENTION

Figure 1:
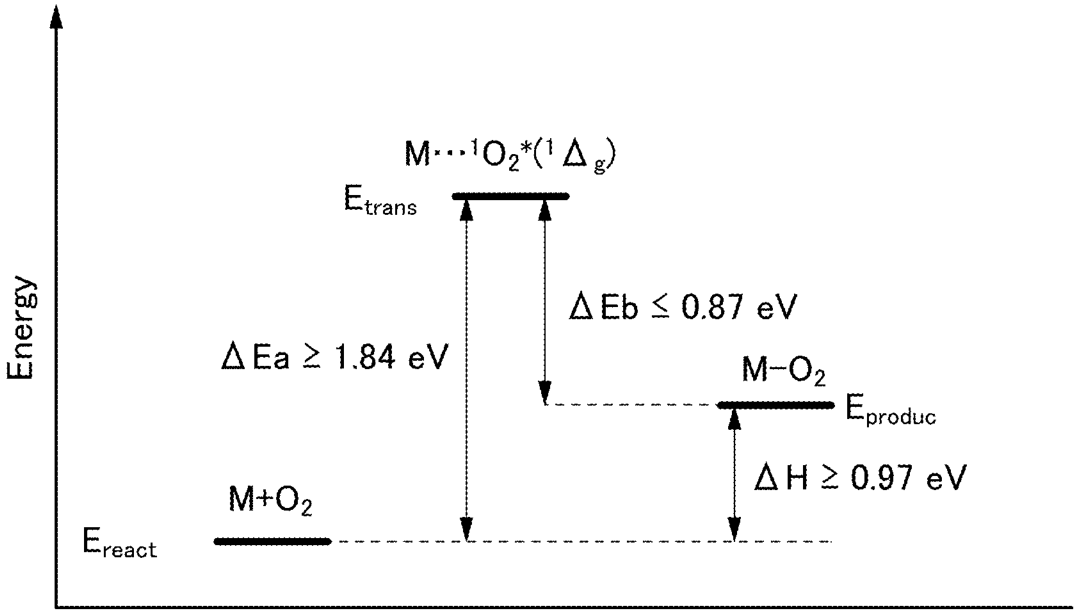
FIG. 1 is an energy diagram for describing a structure of a light-emitting device of an embodiment.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the terms “film” and “layer” can be used interchangeably depending on the case or the circumstances. For example, the term “conductive layer” can be replaced with the term “conductive film”. As another example, the term “insulating film” can be replaced with the term “insulating layer”.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

In this specification and the like, a hole or an electron is sometimes referred to as a carrier. Specifically, a hole-injection layer or an electron-injection layer may be referred to as a carrier-injection layer, a hole-transport layer or an electron-transport layer may be referred to as a carrier-transport layer, and a hole-blocking layer or an electron-blocking layer may be referred to as a carrier-blocking layer. Note that the above-described carrier-injection layer, carrier-transport layer, and carrier-blocking layer cannot be distinguished from each other depending on the cross-sectional shape or properties in some cases. One layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. In this specification and the like, a light-receiving device (also referred to as a light-receiving element) includes at least an active layer functioning as a photoelectric conversion layer between a pair of electrodes. In this specification and the like, one of the pair of electrodes may be referred to as a pixel electrode and the other may be referred to as a common electrode.

In this specification and the like, a tapered shape indicates a shape in which at least part of a side surface of a component is inclined to a substrate surface. For example, a tapered shape preferably includes a region where the angle between the inclined side surface and the substrate surface (such an angle is also referred to as a taper angle) is less than 90°. Note that the side surface of the component and the substrate surface is not necessarily completely flat, and may have a substantially planar shape with a small curvature or slight unevenness.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

Embodiment 1

In this embodiment, a light-emitting device of one embodiment of the present invention will be described. With a device structure described in this embodiment, a light-emitting device with high emission efficiency can be provided. Furthermore, a highly reliable light-emitting device can be provided.

Figure 2A:
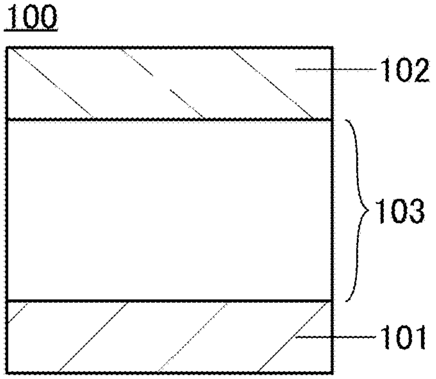
FIGS. 2A to 2E each illustrate a structure of a light-emitting device of an embodiment.

FIG. 2A is a schematic cross-sectional view of a light-emitting device 100 including, between a pair of electrodes, an EL layer including a light-emitting layer. Specifically, the light-emitting device 100 has a structure in which an EL layer 103 is provided between a first electrode 101 and a second electrode 102. The EL layer 103 includes at least a light-emitting layer.

The light-emitting layer is a layer containing at least a light-emitting substance and a first organic compound. As the first organic compound, an organic compound capable of functioning as a host material, from which an oxygen adduct is less likely to be formed is preferably used. In that case, the emission efficiency of the light-emitting device 100 can be increased. Hereinafter, the structure of the first organic compound from which an oxygen adduct is less likely to be formed will be described.

As shown in the following reaction formula, an oxygen adduct is formed from an organic compound as a result of a reaction between the organic compound (anthracene is shown as an example in the following reaction formula) and an oxygen molecule ($O_2$). Note that in general, an oxygen molecule in a ground state (triplet state) is less likely to react with an organic compound. Thus, the following reaction route is assumed in the present invention: first, an oxygen molecule is excited to a singlet state ($^1O_2{}^*(^1\Delta_g)$ in the reaction formula) so as to react with an organic compound easily, and then the oxygen molecule reacts with the organic compound through a transition state, whereby an oxygen adduct is formed.

[Chemical Formula 1]

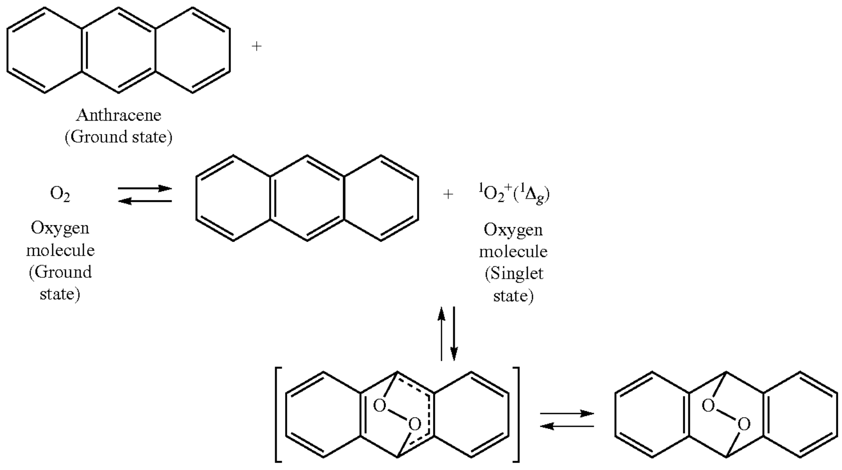

Anthracene (Ground state)

Oxygen molecule (Ground state)

Oxygen molecule (Singlet state)

Oxygen adduct (Ground state)

As described above, in the reaction route assumed in the present invention, the oxygen molecule needs to be in a singlet state first so as to react with the organic compound. This means that at least energy for exciting an oxygen molecule in a ground state to an oxygen molecule in a singlet state (also referred to as singlet oxygen) is necessary for forming an oxygen adduct.

Note that there are two singlet oxygen states, a $^1\Sigma_g{}^+$ state and a $^1\Delta_g$ state. In the $^1\Sigma_g{}^+$ state, each of two $\pi^*$ orbitals is occupied by one electron with a different spin. In the $^1\Delta_g$ state, only one of the two $\pi^*$ orbitals is occupied by two electrons. Since the energy of the $^1\Sigma_g{}^+$ state is higher than that of the $^1\Delta_g$ state, the $^1\Sigma_g{}^+$ state rapidly converts to the $^1\Delta_g$ state. Thus, singlet oxygen in this specification and the like refers to an oxygen molecule in the $^1\Delta_g$ state.

Accordingly, at least the energy of the $^1\Delta_g$ state is necessary for forming an oxygen adduct. Note that the energy of the $^1\Delta_g$ state is an energy difference between the ground state and the $^1\Delta_g$ state, which is 0.97 eV. Furthermore, the energy of the $^1\Sigma_g^+$ state is an energy difference between the ground state and the $^1\Sigma_g^+$ state, which is 1.62 eV.

Although it is known that singlet oxygen is less likely to be generated by direct photoexcitation, in the presence of another triplet excited molecule, for example, singlet oxygen is generated in some cases to cause an oxygen addition reaction. A compound that can become the triplet excited molecule is referred to as a photosensitizer. The ground state of an ordinary organic compound is a singlet state; thus, photoexcitation to a triplet excited state is forbidden transition and generation of a triplet excited molecule is difficult. Accordingly, such a photosensitizer can be a compound that can easily cause intersystem crossing from a singlet excited state to a triplet excited state (or a compound that allows the forbidden transition of photoexcitation directly to the triplet excited state), for example. An organic compound that can be used as a host material, for example, may function as a photosensitizer in some cases.

It is also known that when the activation energy of a certain reaction is lower than a certain level, the reaction proceeds at room temperature. Thus, formation of an oxygen adduct by a reaction between an organic compound and oxygen in a ground state requires the energy of the $^1\Delta_g$ state and requires the activation energy of a reaction between the organic compound and singlet oxygen for the formation of an oxygen adduct to be lower than a certain level. In the case where the activation energy is 20 kcal/mol at room temperature (T=298 K), the half-life period of the reaction is calculated to be approximately 50 seconds using the Eyring equation. This reveals that when the activation energy of a reaction is lower than 20 kcal/mol, the reaction easily proceeds at room temperature. Thus, it is assumed in the present invention that an organic compound and singlet oxygen reacts with each other at room temperature when the activation energy of a reaction between the organic compound and the singlet oxygen for the formation of an oxygen adduct is lower than 20 kcal/mol (0.87 eV).

Thus, as shown in FIG. 1, a difference ($\Delta$Ea) between the sum ($E_{react}$) of the energy of the first organic compound in a ground state and the energy of the oxygen molecule in a ground state and the energy in a transition state ($E_{trans}$) formed by the first organic compound and the oxygen molecule is preferably greater than or equal to the sum of the level of the energy of the $^1\Delta_g$ state and the level of the activation energy at which the reaction proceeds at room temperature. Specifically, the difference ($\Delta$Ea) between the sum of the energy of the first organic compound in a ground state and the energy of the oxygen molecule in a ground state and the energy of the transition state formed by the first organic compound and the oxygen molecule is preferably greater than or equal to 1.84 eV, further preferably greater than or equal to 1.94 eV. In that case, the formation of an oxygen adduct of the first organic compound at room temperature can be inhibited. Accordingly, the emission efficiency of the light-emitting device 100 can be increased. Furthermore, the reliability of the light-emitting device 100 can be increased.

In addition, as shown in FIG. 1, a difference ($\Delta$Eb) between the energy of the transition state ($E_{trans}$) formed by the first organic compound and the oxygen molecule and the energy of the oxygen adduct of the first organic compound in a ground state ($E_{produc}$) is preferably less than or equal to the level of the activation energy at which the reaction proceeds at room temperature. Specifically, the difference ($\Delta$Eb) between the energy of the transition state formed by the first organic compound and the oxygen molecule and the energy of the oxygen adduct of the first organic compound in a ground state is preferably less than or equal to 0.87 eV, further preferably less than or equal to 0.77 eV, still further preferably less than or equal to 0.67 eV, yet still further preferably less than or equal to 0.57 eV. In that case, even when an oxygen adduct is formed, the oxygen adduct easily returns to the first organic compound and the oxygen molecule at room temperature. Accordingly, the emission efficiency of the light-emitting device 100 can be increased. Furthermore, the reliability of the light-emitting device 100 can be increased.

It is further preferable that, as shown in FIG. 1, the energy of the oxygen adduct of the first organic compound in a ground state ($E_{produc}$) be higher than the sum ($E_{react}$) of the energy of the first organic compound in a ground state and the energy of the oxygen molecule in a ground state, and a difference ($\Delta$H) between the energy of the oxygen adduct of the first organic compound in a ground state ($E_{produc}$) and the sum ($E_{react}$) of the energy of the first organic compound in a ground state and the energy of the oxygen molecule in a ground state be greater than the level of the energy of the $^1\Delta_g$ state. Specifically, the energy of the oxygen adduct of the first organic compound in a ground state is preferably higher than the sum of the energy of the first organic compound in a ground state and the energy of the oxygen molecule in a ground state, and the difference ($\Delta$H) between the energy of the oxygen adduct of the first organic compound in a ground state and the sum of the energy of the first organic compound in a ground state and the energy of the oxygen molecule in a ground state is preferably greater than or equal to 0.97 eV, further preferably greater than or equal to 1.07 eV, still further preferably greater than or equal to 1.17 eV, yet still further preferably greater than or equal to 1.27 eV, yet still further preferably greater than or equal to 1.38 eV. In that case, even when an oxygen adduct is formed, the oxygen adduct more easily returns to the first organic compound and the oxygen molecule. Accordingly, the emission efficiency of the light-emitting device 100 can be further increased. Furthermore, the reliability of the light-emitting device 100 can be further increased.

In FIG. 1, "$M+O_2$" represents the ground state of the first organic compound and the ground state of the oxygen molecule, "$M^1O_2^*(^1\Delta_g)$" represents the transition state formed by the first organic compound and the oxygen molecule, and "$M\text{-}O_2$" represents the ground state of the oxygen adduct.

In an organic compound from which an oxygen adduct is likely to be formed, an oxygen molecule is added to the position where highest occupied molecular orbital (HOMO) distribution is located, whereby the oxygen adduct is formed. For example, in 9-(1-naphthyl)-10-[4-(2-naphthyl)phenyl]anthracene (abbreviation: αN-βNPAnth), which is an anthracene derivative, HOMO distribution is located on an anthracene skeleton. When an oxygen molecule is added to the anthracene skeleton, an oxygen adduct is formed.

In one embodiment of the present invention, it is further preferable to use the first organic compound molecularly designed to include a partial structure on which HOMO distribution is located and a partial structure to which the oxygen molecule might be added. In other words, it is further preferable that the first organic compound include a first partial structure and a second partial structure different from the first partial structure, HOMO distribution of the first organic compound be located on the first partial structure, and the oxygen adduct be formed when the oxygen molecule is added to the second partial structure. The use of such a first organic compound tends to inhibit the formation of an oxygen adduct. Note that the partial structure on which HOMO distribution is located and the partial structure to which the oxygen molecule might be added are not necessarily provided separately.

In this specification and the like, the partial structure on which HOMO distribution is located refers to a partial structure on which molecular orbital distribution is located when the absolute value of the display threshold of the molecular orbital is 0.04 $(e \cdot bohr^{-3})^{1/2}$ in the most stable structure in the singlet ground state of an organic compound determined by calculation.

Next, specific examples of the first organic compound are described. Without limitation to the examples, the first organic compound can be any of specific examples of a host material described later in Embodiment 2.

As the first organic compound, for example, a bipolar substance having both a hole-transport skeleton and an electron-transport skeleton can be used. Specifically, a bipolar substance having a benzothienopyrimidine ring or a benzofuropyrimidine skeleton as an electron-transport skeleton can be used as the first organic compound.

As the first organic compound, for example, an organic compound represented by General Formula (G1-1), General Formula (G1-2), or General Formula (G1-3) can be used. Such an organic compound can be preferably used as the first organic compound particularly when a phosphorescence light-emitting substance is used as a light-emitting substance.

[Chemical Formula 2]

(G1-1)

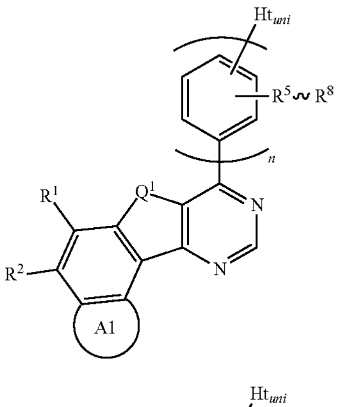

(G1-2)

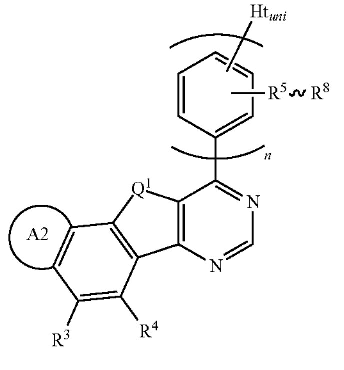

-continued (G1-3)

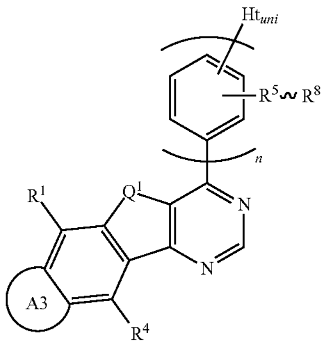

Note that $Q^1$ represents oxygen or sulfur; each of $R^1$ to $R^8$ independently represents hydrogen (including deuterium), a substituted or unsubstituted alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, or substituted or unsubstituted polycyclic saturated hydrocarbon having 7 to 10 carbon atoms; n represents an integer of 0 to 4; and $Ht_{uni}$ represents a hole-transport skeleton. Furthermore, each of A1, A2, and A3 is represented by any one of General Formulae (Ax-1) to (Ax-5) below.

[Chemical Formula 3]

(Ax-1)

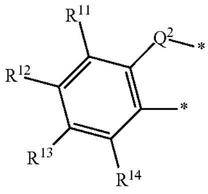

(Ax-2)

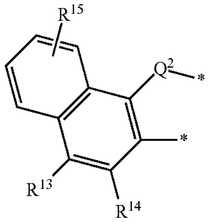

(Ax-3)

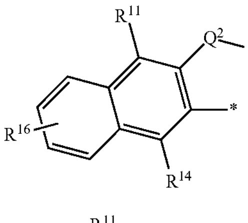

(Ax-4)

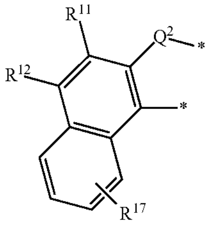

-continued (Ax-5)

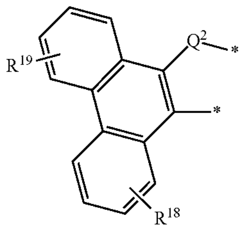

Note that $Q^2$ represents oxygen or sulfur; each of $R^{11}$ to $R^{14}$ independently represents hydrogen (including deuterium), an alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, or substituted or unsubstituted polycyclic saturated hydrocarbon having 7 to 10 carbon atoms. Furthermore, each of $R^{15}$ to $R^{19}$ represents 1 to 4 substituents and independently represents hydrogen (including deuterium), a substituted or unsubstituted alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, or substituted or unsubstituted polycyclic saturated hydrocarbon having 7 to 10 carbon atoms. In addition, * represents a bonding portion with any one of benzofuropyrimidine rings and benzothienopyrimidine rings in General Formula (G1-1), General Formula (G1-2), and General Formula (G1-3).

In General Formula (G1-1), General Formula (G1-2), or General Formula (G1-3), it is further preferable that $Ht_{uni}$ be a skeleton represented by any one of General Formulae (Ht-1) to (Ht-26) below.

[Chemical Formula 4]

(Ht-1)

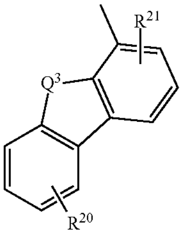

(Ht-2)

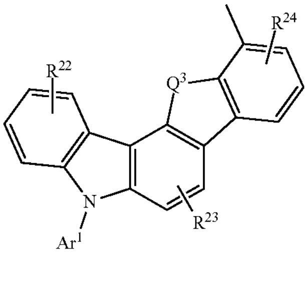

-continued (Ht-3)

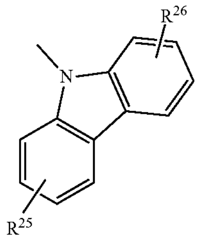

(Ht-4)

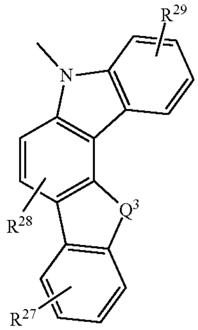

(Ht-5)

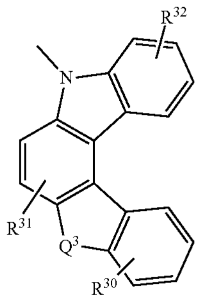

(Ht-6)

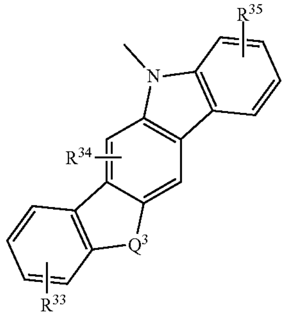

(Ht-7)

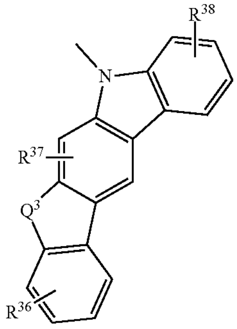

-continued
(Ht-8)
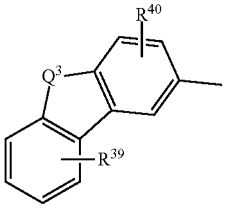
(Ht-9)
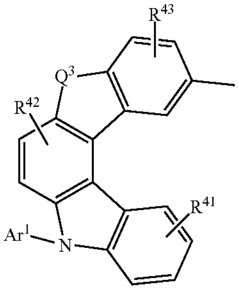
(Ht-10)
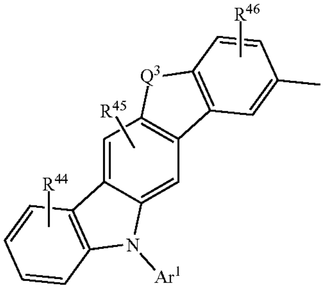
(Ht-11)
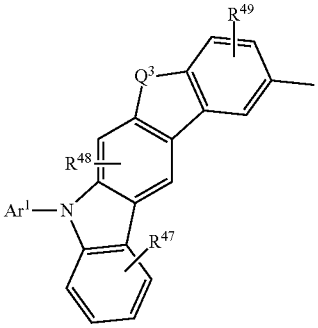
(Ht-12)
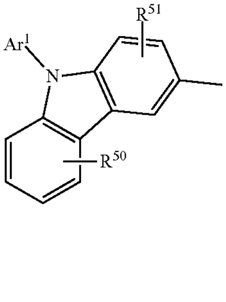
-continued
(Ht-13)
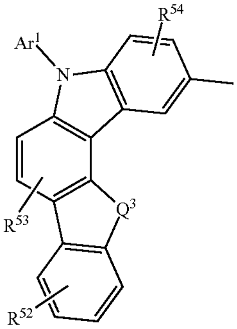
(Ht-14)
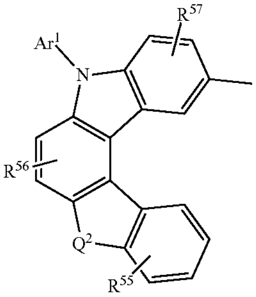
(Ht-15)
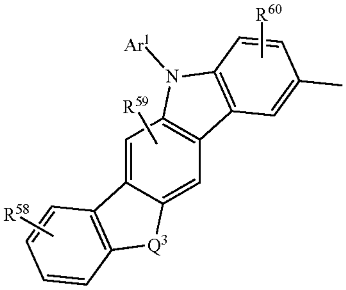
(Ht-16)
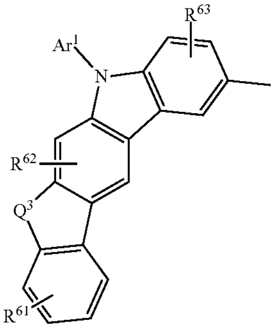
(Ht-17)
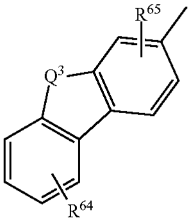

-continued (Ht-18)

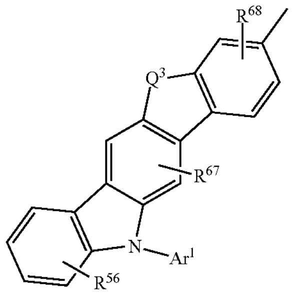

(Ht-19)

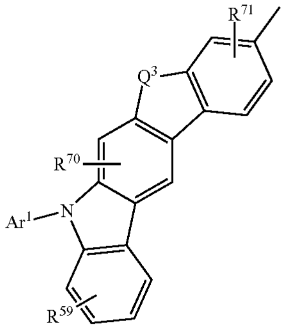

(Ht-20)

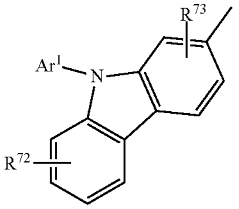

(Ht-21)

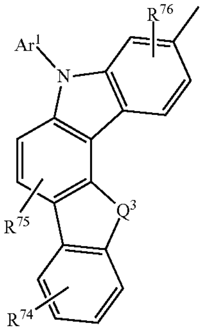

(Ht-22)

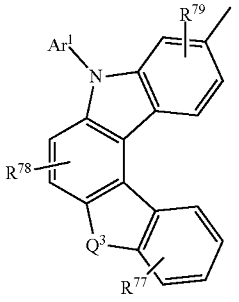

-continued (Ht-23)

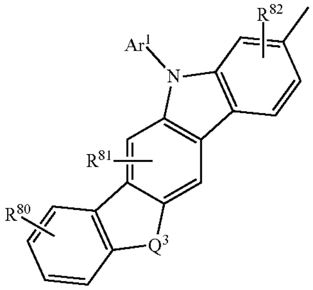

(Ht-24)

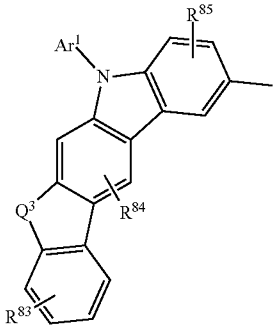

(Ht-25)

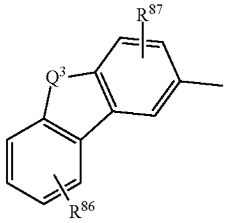

(Ht-26)

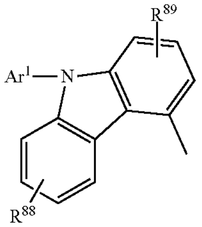

Note that $Q^3$ represents oxygen or sulfur. Each of $R^{20}$ to $R^{89}$ represents 1 to 4 substituents and independently represents any one of hydrogen (including deuterium), an alkyl group having 1 to 6 carbon atoms, and a substituted or unsubstituted aryl group. Furthermore, $Ar^1$ represents any of a substituted or unsubstituted alkyl group having 1 to 6 carbon atoms and a substituted or unsubstituted aryl group.

Examples of the alkyl group that can be used as $Ar^1$ and $R^1$ to $R^8$ and $R^{11}$ to $R^{89}$ in General Formula (G1-1), General Formula (G1-2), and General Formula (G1-3) above include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a 3-methylpentyl group, a 2-methylpentyl group, a 2-ethylbutyl group, a 1,2-dimethylbutyl group, and a 2,3-dimethylbutyl group.

Examples of the monocyclic saturated hydrocarbon or the polycyclic saturated hydrocarbon that can be used as $R^1$ to $R^8$ and $R^{11}$ to $R^{89}$ in General Formula (G1-1), General Formula (G1-2), and General Formula (G1-3) above include a cyclopropyl group, a cyclobutyl group, a cyclopentyl group, a cyclohexyl group, a 1-methylcyclohexyl group, a cycloheptyl group, and an adamantyl group.

Examples of the aryl group that can be used as $Ar^1$, $R^1$ to $R^8$, and $R^{11}$ to $R^{89}$ in General Formula (G1-1), General Formula (G1-2), and General Formula (G1-3) above include a phenyl group, an o-tolyl group, an m-tolyl group, a p-tolyl group, a mesityl group, an o-biphenyl group, an m-biphenyl group, a p-biphenyl group, a 1-naphthyl group, a 2-naphthyl group, a fluorenyl group, an acenaphthylenyl group, an anthryl group, a phenanthryl group, a biphenyl group, a terphenyl group, and a triphenylenyl group.

In the organic compound represented by any of General Formula (G1-1), General Formula (G1-2), and General Formula (G1-3) above, a partial structure on which HOMO distribution is located and a partial structure to which an oxygen molecule might be added are provided separately. Specifically, HOMO distribution is likely to be located on the hole-transport skeleton of the organic compound represented by any of General Formula (G1-1), General Formula (G1-2), and General Formula (G1-3) above, and the oxygen adduct of the organic compound is likely to be added to the benzofuropyrimidine ring or the benzothienopyrimidine ring. Thus, the organic compound represented by any of General Formula (G1-1), General Formula (G1-2), and General Formula (G1-3) above is an organic compound inhibiting formation of an oxygen adduct.

SPECIFIC EXAMPLES

Shown below are specific examples of the organic compound of one embodiment of the present invention having any of the structures represented by General Formula (G1-1), General Formula (G1-2), and General Formula (G1-3) above.

[Chemical Formula 5]

(100)

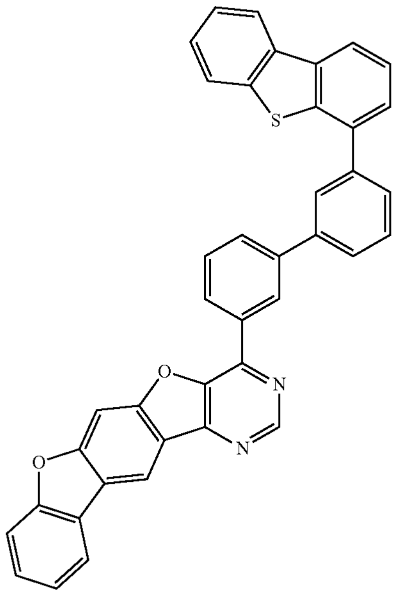

-continued (101)

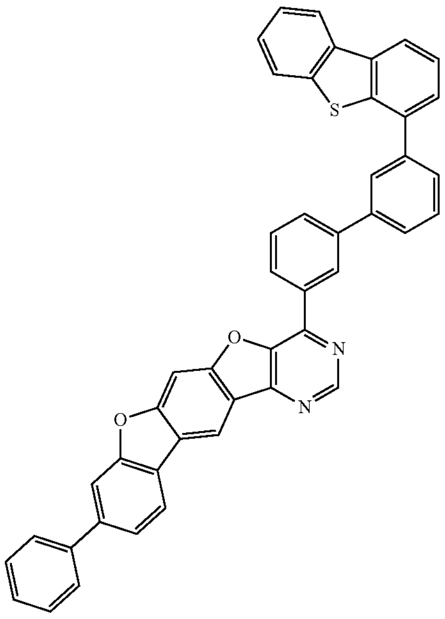

(102)

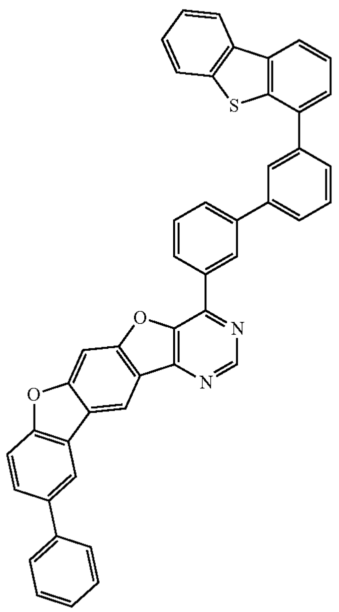

-continued
(103)
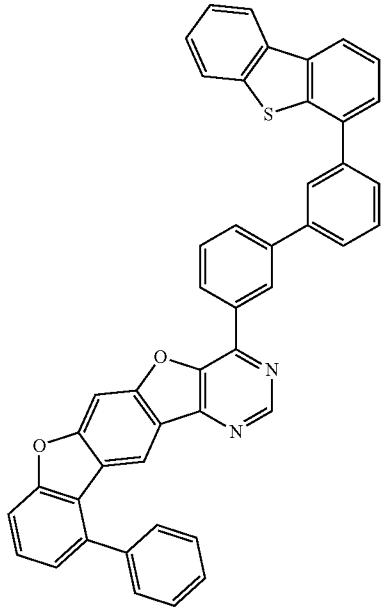
(104)
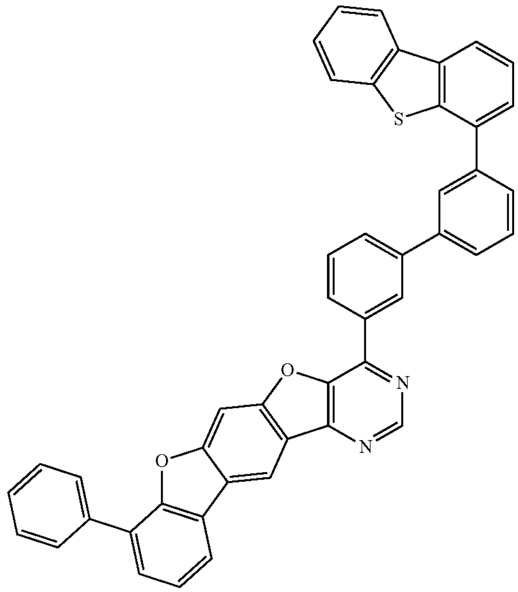
-continued
(105)
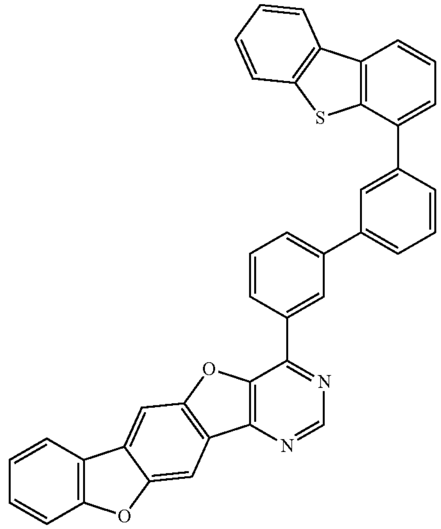
(106)
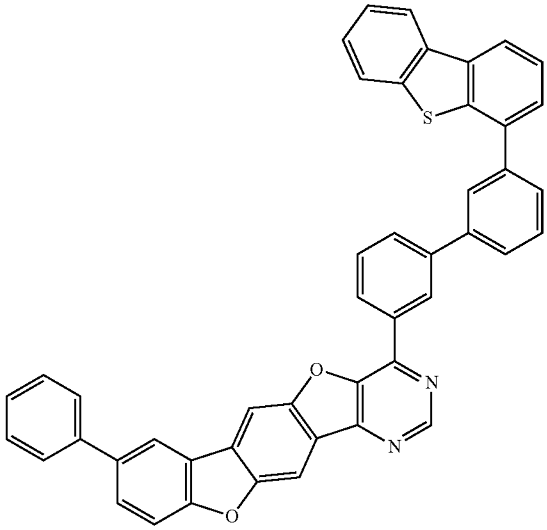
(107)
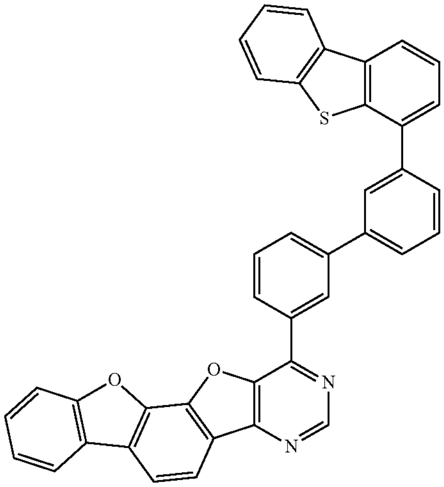

-continued
(108)
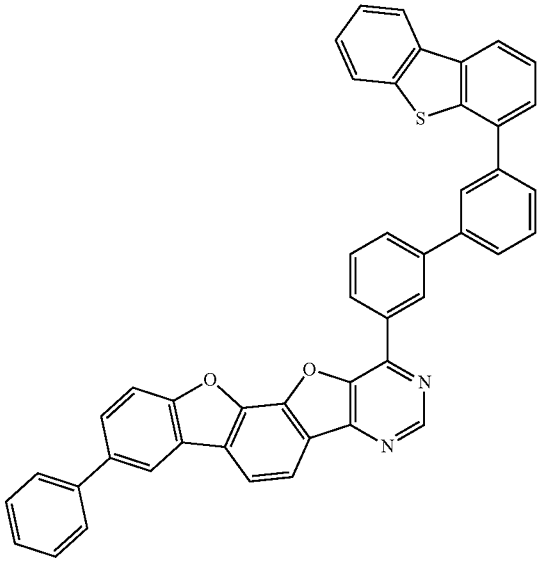
(109)
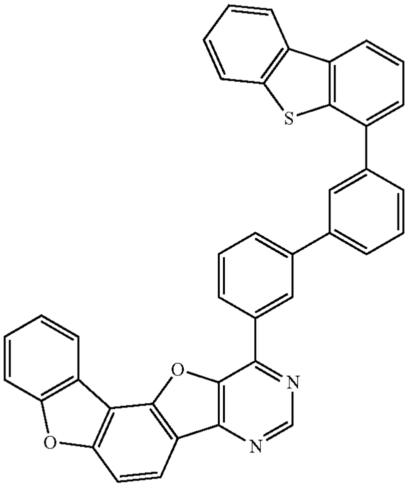
(110)
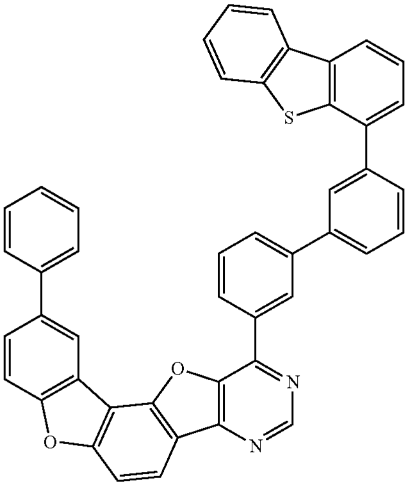
[Chemical Formula 6]
(111)
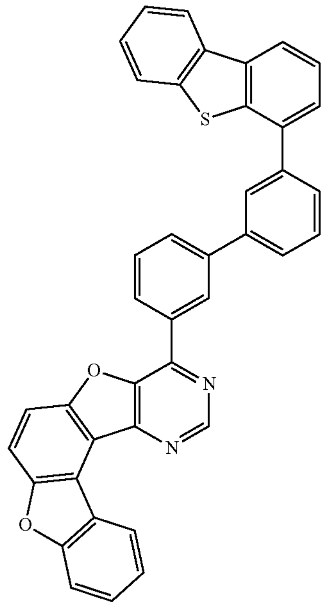
(112)
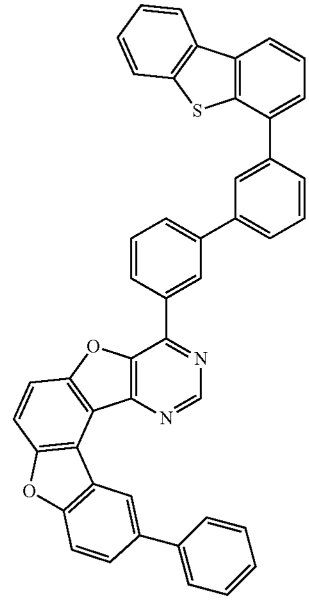

-continued
(113)
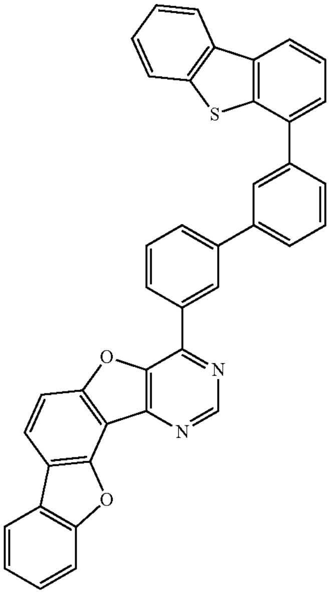
(114)
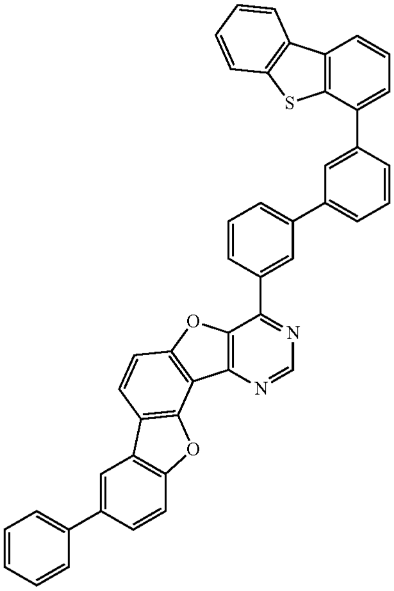
-continued
(115)
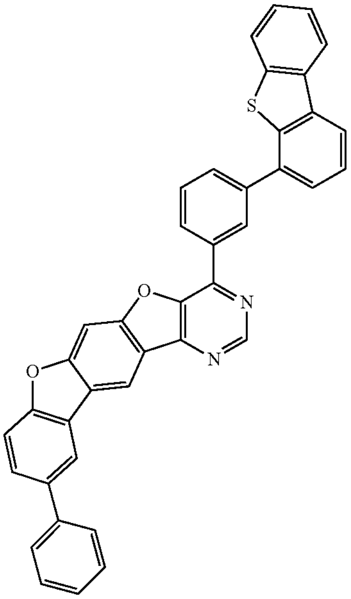
(116)
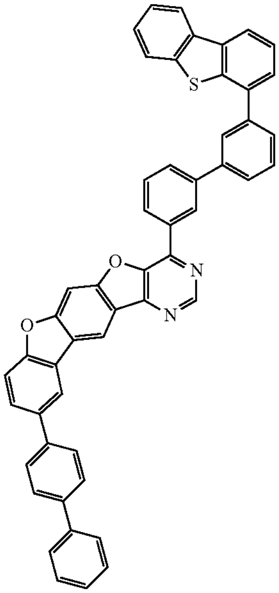

-continued
(117)
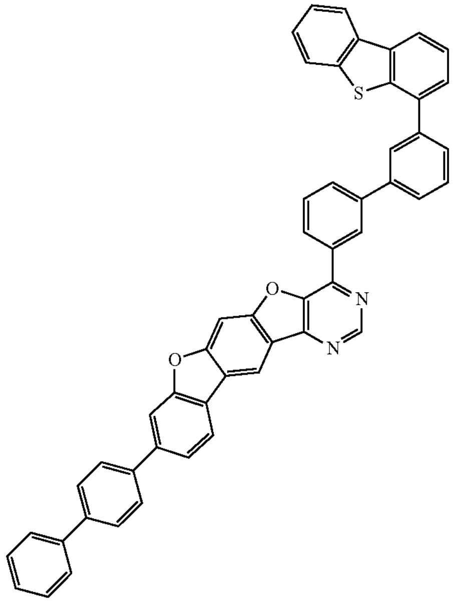
(118)
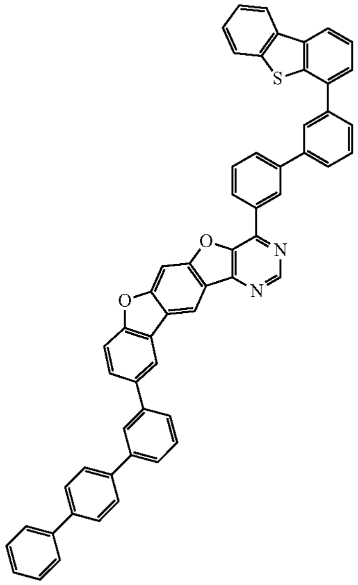
-continued
(119)
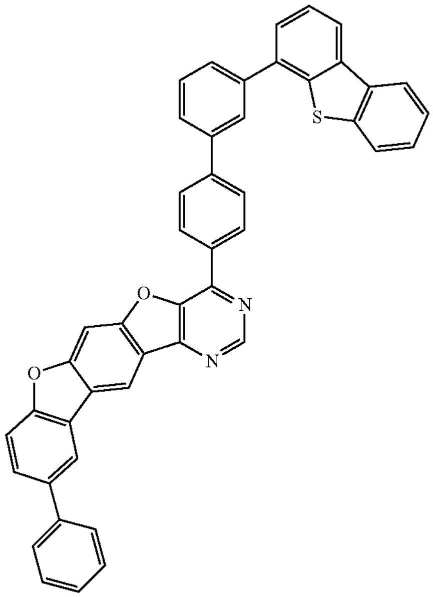
(120)
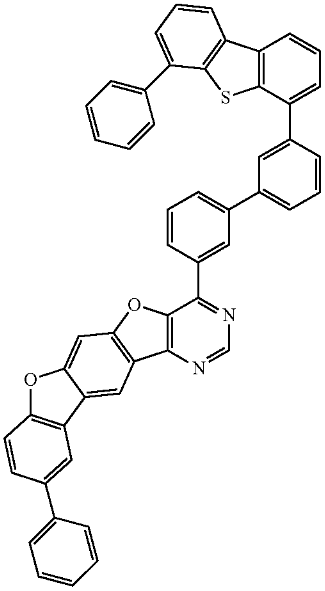

-continued
[Chemical Formula 7]
(121)
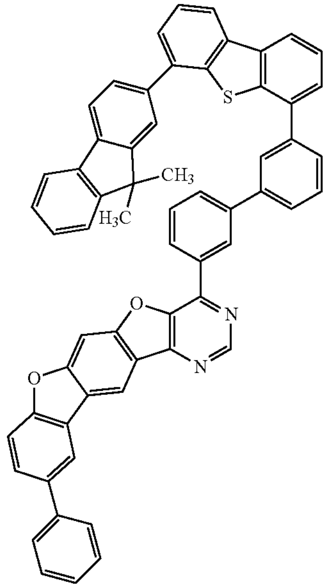
(122)
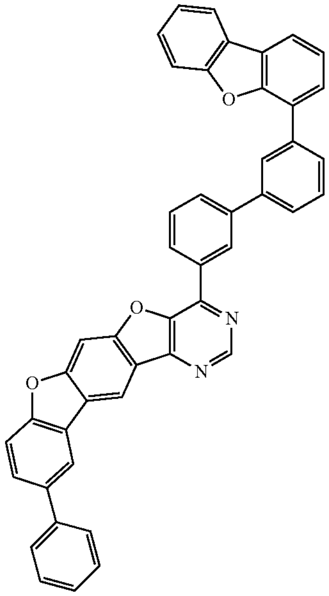
-continued
(123)
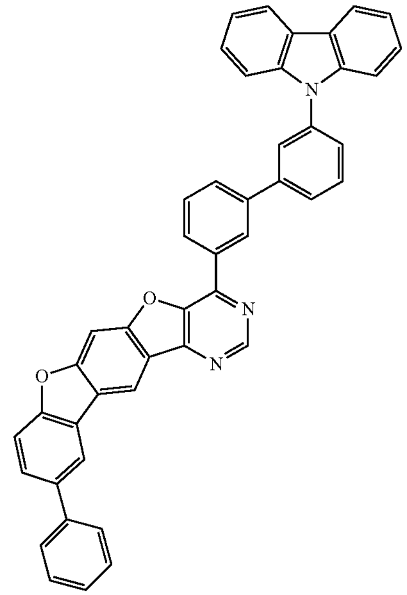
(124)
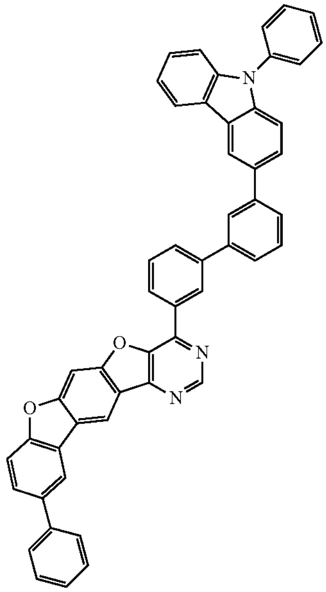

-continued
(125)
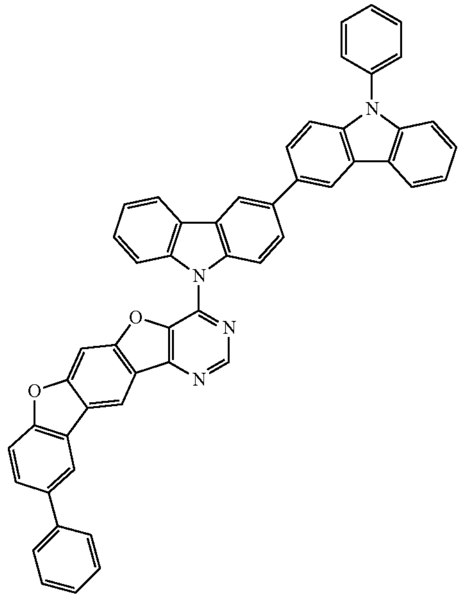
(126)
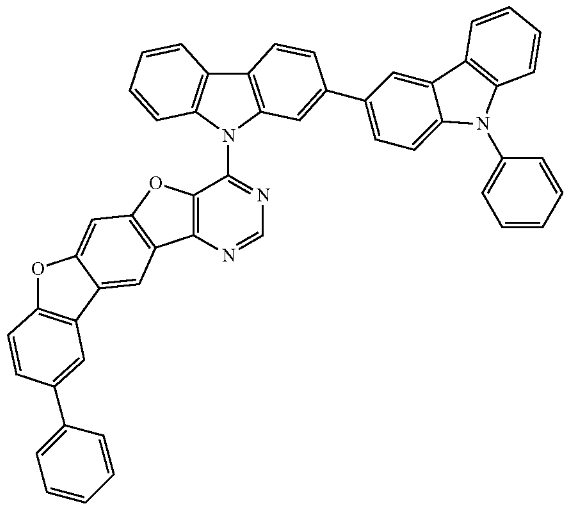
-continued
(127)
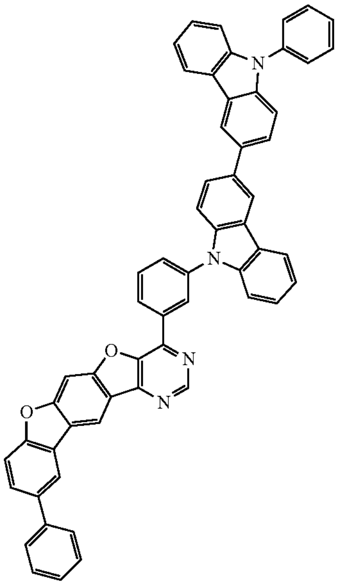
(128)
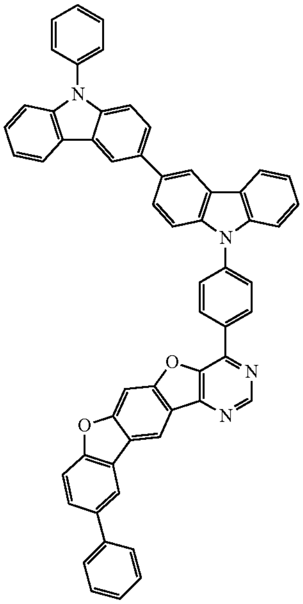

-continued
(129)
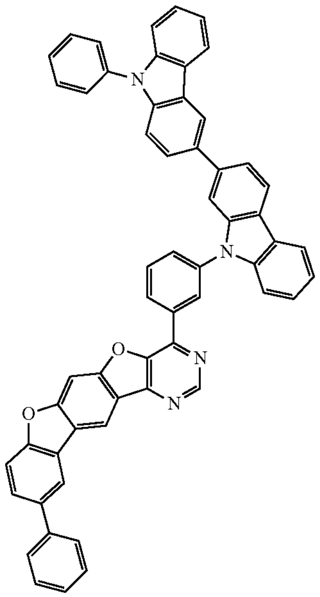
[Chemical Formula 8]
(130)
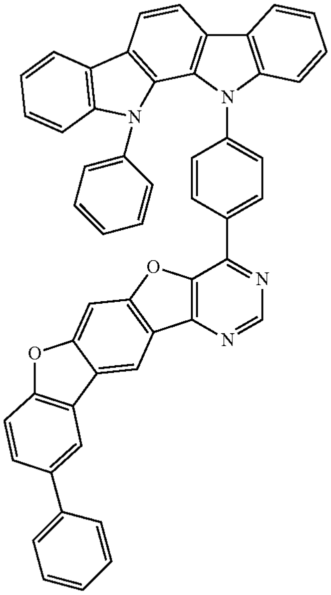
-continued
(131)
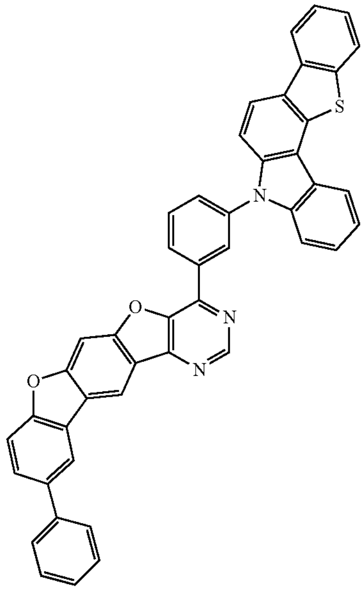
(132)
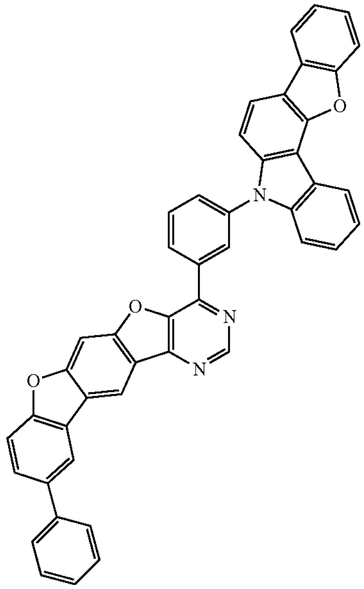

-continued
(133)
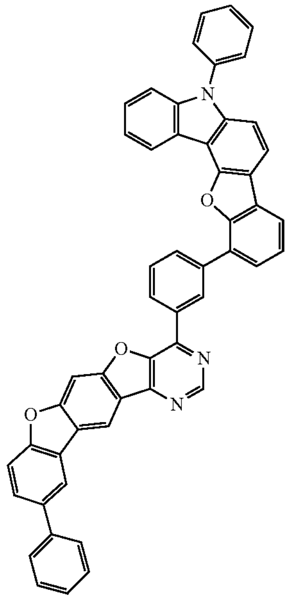
(134)
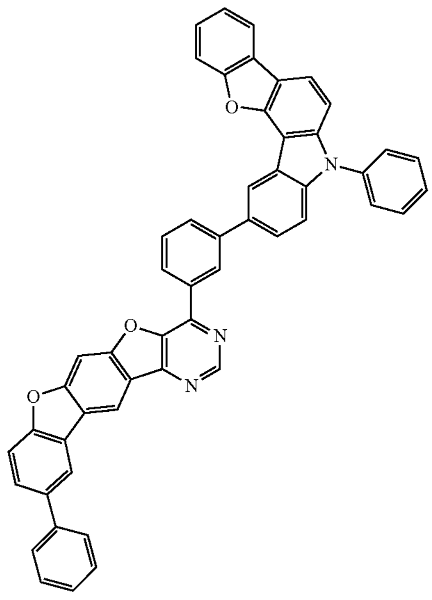
-continued
(135)
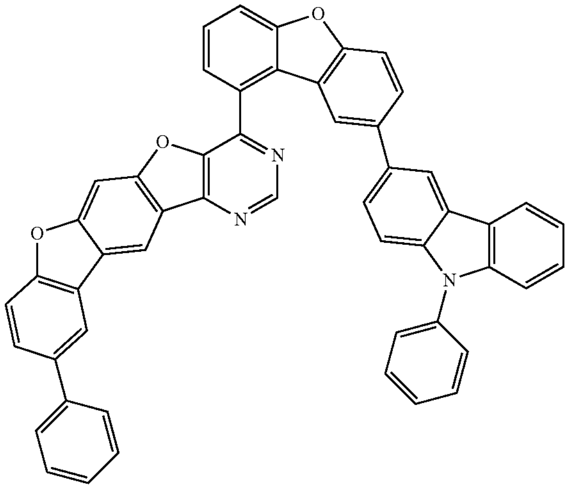
(136)
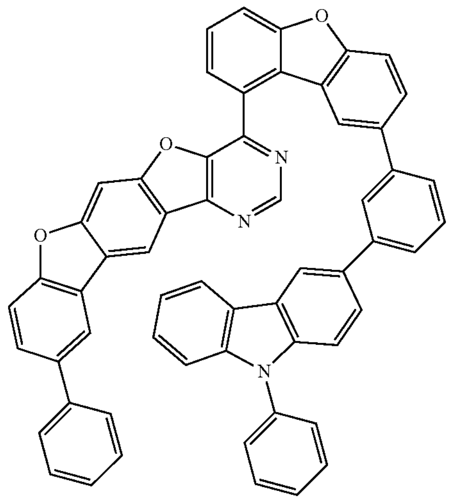
(137)
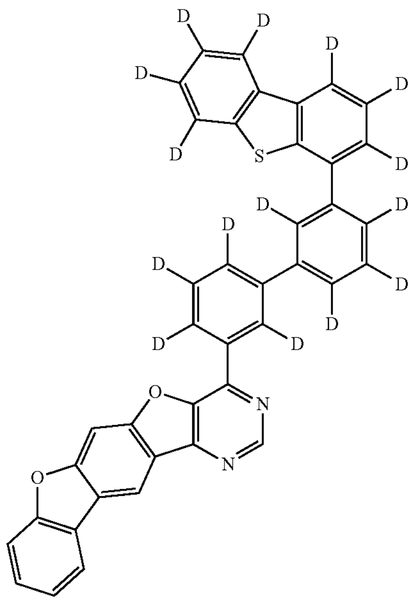

-continued
(138)
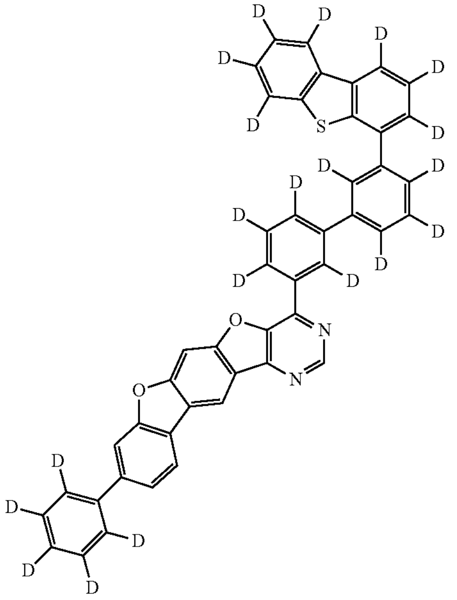
[Chemical Formula 9]
(139)
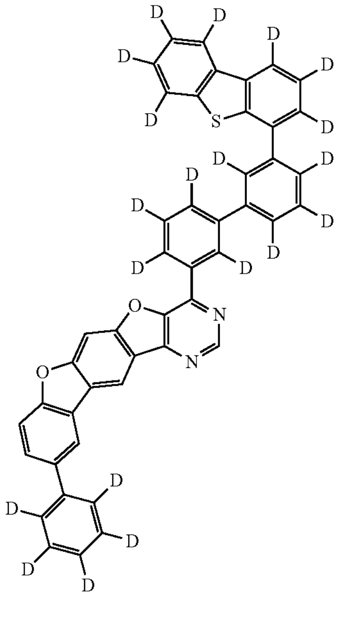
-continued
(140)
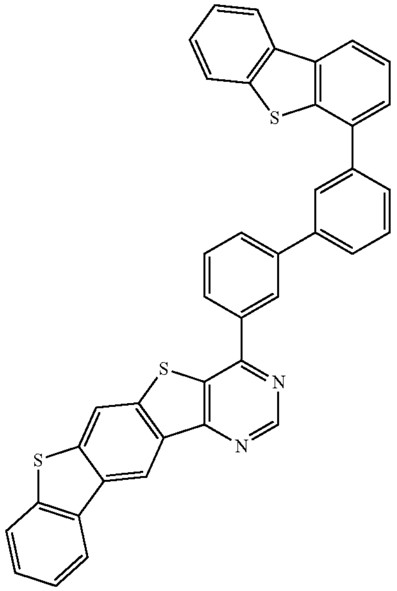
(141)
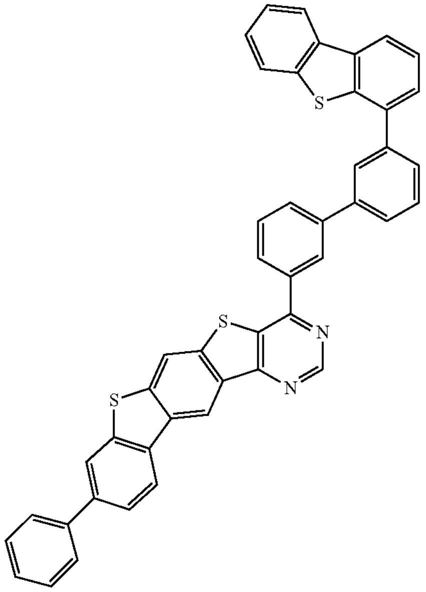

-continued
(142)
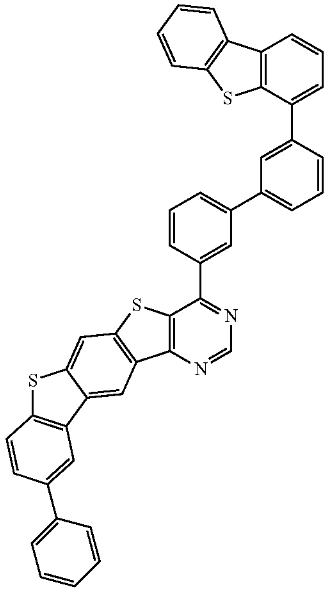
(144)
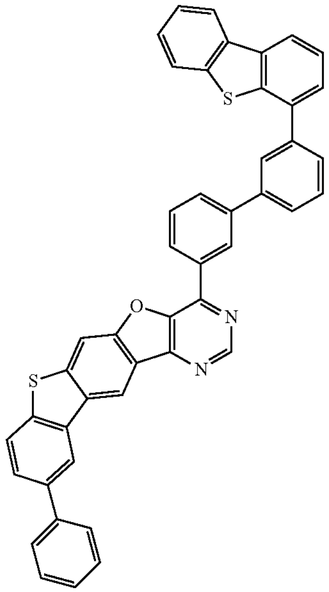
-continued
(144)
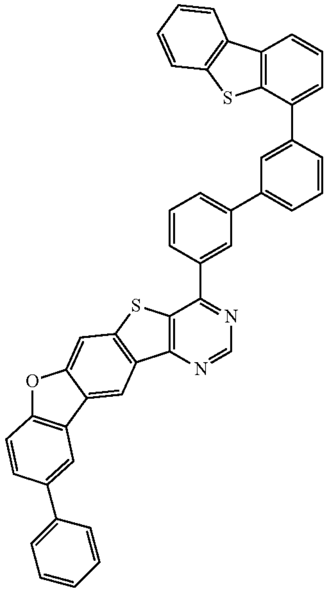
(145)
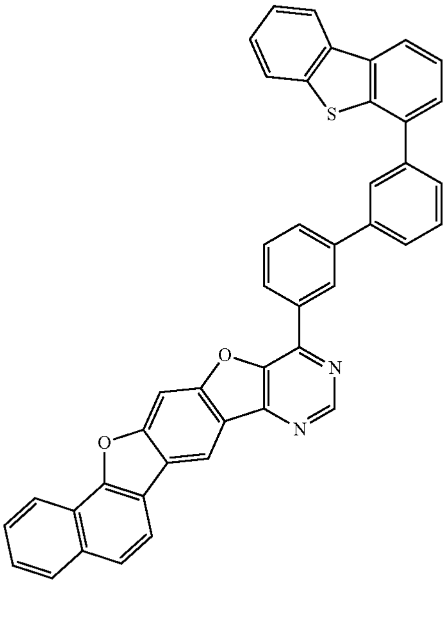

-continued (146)

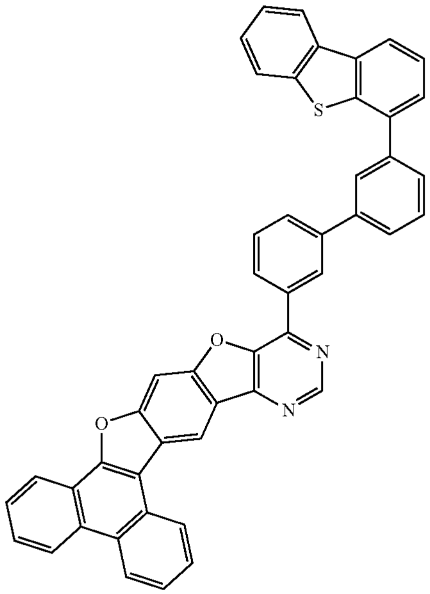

The organic compounds represented by Structural Formulae (100) to (146) above are examples of the organic compounds represented by General Formulae (G1-1) to (G1-3). The organic compound of one embodiment of the present invention is not limited thereto.

As the first organic compound, an organic compound having a structure in which a spirofluorene skeleton and an aromatic ring are single-bonded to each other or an organic compound having a structure in which a fluoranthene skeleton and an aromatic ring are single-bonded to each other can be used. The aromatic ring is preferably an aromatic ring other than anthracene. The spirofluorene skeleton and the fluoranthene skeleton are preferably used in the first organic compound particularly when a fluorescent light-emitting substance is used as a light-emitting substance because an oxygen is less likely to be added owing to their low HOMO levels and their lowest singlet excitation energies are high.

Examples of the organic compound having a structure in which a spirofluorene skeleton and an aromatic ring are single-bonded to each other include 2,2''-bi(9,9'-spirobi[9H-fluorene]) (Structural Formula (200)) and 2,7-bis(pyren-1-yl)-9,9'-spirobi[fluorene] (Structural Formula (201)). Examples of the organic compound having a structure in which a fluoranthene skeleton and an aromatic ring are single-bonded to each other include 9-[4-(3-fluoranthenyl) phenyl]-9H-carbazole (abbreviation: CzPFlt) (Structural Formula (202)). Structural Formulae of these organic compounds are shown below.

[Chemical Formula 10]

(200)

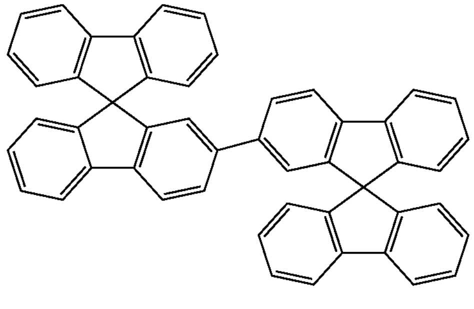

(201)

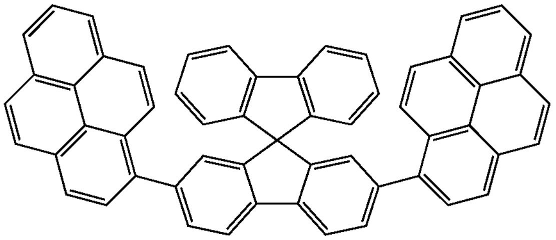

(202)

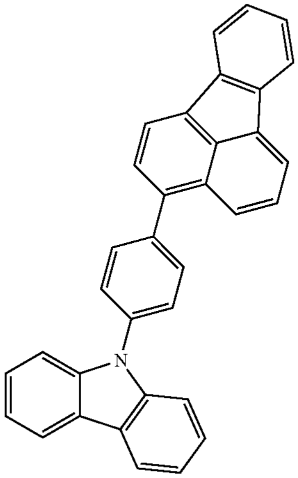

The above is the description of the host material from which an oxygen adduct is less likely to be formed. The host material is preferably used in the light-emitting device of one embodiment of the present invention. The use of the host material from which an oxygen adduct is less likely to be formed can improve the emission efficiency of the light-emitting device 100 and increase the reliability of the light-emitting device 100.

The light-emitting layer may contain a second organic compound in addition to the light-emitting substance and the first organic compound. As the second organic compound, an organic compound capable of functioning as a second host material (assist material) is preferably used. It is further preferable that the second organic compound have a structure with which an oxygen adduct is less likely to be formed, like the first organic compound. Such a structure can inhibit a reduction in the emission efficiency of the light-emitting device 100 caused when an oxygen molecule is added to the second organic compound and an oxygen adduct is formed. Accordingly, the emission efficiency of the light-emitting device 100 can be further increased. Furthermore, the reliability of the light-emitting device 100 can be further increased.

The structures described in this embodiment can be used in combination with any of the structures described in the other embodiments as appropriate.

Embodiment 2

In this embodiment, other structures of the light-emitting device described in Embodiment 1 will be described with reference to FIGS. 2A to 2E.

<<Basic Structure of Light-Emitting Device>>

Basic structures of the light-emitting device are described. As described in Embodiment 1, FIG. 2A illustrates a light-emitting device including, between a pair of electrodes, an EL layer including a light-emitting layer.

Figure 2B:
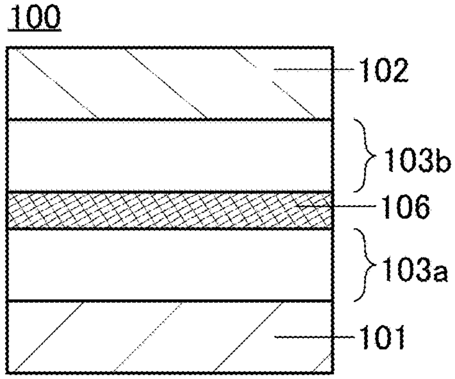

FIG. 2B illustrates a light-emitting device having a structure where a plurality of EL layers (two EL layers of 103*a* and 103*b* in FIG. 2B) are provided between a pair of electrodes and a charge generation layer 106 is provided between the EL layers (such a structure is also referred to as a tandem structure). A light-emitting device having a tandem structure enables fabrication of a light-emitting apparatus that has high efficiency without changing the amount of current.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when a voltage is applied in FIG. 2B such that the potential of the first electrode 101 can be higher than that of the second electrode 102, electrons are injected into the EL layer 103*a* from the charge-generation layer 106 and holes are injected into the EL layer 103*b* from the charge-generation layer 106.

Note that in terms of light extraction efficiency, the charge-generation layer 106 preferably has a property of transmitting visible light (specifically, the charge-generation layer 106 preferably has a visible light transmittance higher than or equal to 40%). The charge-generation layer 106 functions even if it has lower conductivity than the first electrode 101 and the second electrode 102.

Figure 2C:
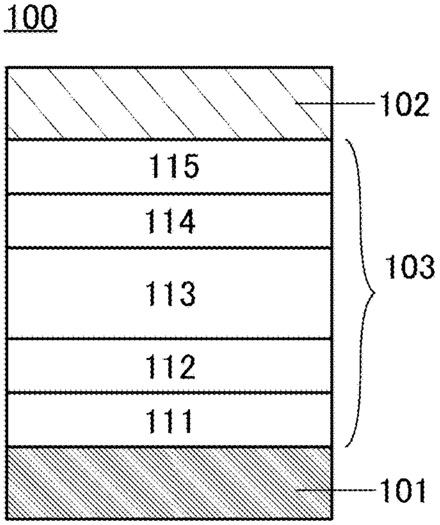

FIG. 2C illustrates a stacked-layer structure of the EL layer 103 in the light-emitting device. In this case, the first electrode 101 is regarded as functioning as an anode and the second electrode 102 is regarded as functioning as a cathode. The EL layer 103 has a structure where a hole-injection layer 111, a hole-transport layer 112, a light-emitting layer 113, an electron-transport layer 114, and an electron-injection layer 115 are sequentially stacked over the first electrode 101. Note that, the first electrode 101 may serve as a cathode, and the second electrode 102 may serve as an anode. In that case, the stacking order of the layers in the EL layer 103 is preferably reversed; specifically, it is preferable that the layer 111 over the first electrode 101 serving as the cathode be an electron-injection layer, the layer 112 be an electron-transport layer, the layer 113 be a light-emitting layer, the layer 114 be a hole-transport layer, and the layer 115 be a hole-injection layer.

The light-emitting layer 113 contains an appropriate combination of a light-emitting substance and a plurality of substances, so that fluorescent light of a desired color or phosphorescent light of a desired color can be obtained. The light-emitting layer of the light-emitting device of one embodiment of the present invention preferably employs the structure of the light-emitting layer described in Embodiment 1.

Note that the light-emitting layer 113 may have a stacked-layer structure of a plurality of light-emitting layers that emit light of different colors. When a plurality of light-emitting layers are provided, the use of different light-emitting substances for the light-emitting layers enables a structure that exhibits different emission colors (for example, complementary emission colors are combined to obtain white light emission). For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. In this case, the combination of the light-emitting substance and other substances are different between the stacked light-emitting layers. Alternatively, the plurality of EL layers (103*a* and 103*b*) in FIG. 2B may exhibit their respective emission colors. Also in this case, the combination of the light-emitting substance and other substances are different between the stacked light-emitting layers.

Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. Alternatively, the plurality of EL layers (103*a* and 103*b*) in FIG. 2B may exhibit the same emission color. The structure where a plurality of light-emitting layers that emit light of the same color are stacked can sometimes achieve higher reliability than a single-layer structure.

In the case where the light-emitting layer 113 has a structure where a plurality of light-emitting layers are stacked, at least one of the plurality of light-emitting layers preferably employs the structure of the light-emitting layer described in Embodiment 1.

The light-emitting device can have a micro optical resonator (microcavity) structure when, for example, the first electrode 101 is a reflective electrode and the second electrode 102 is a transflective electrode in FIG. 2C. Thus, light from the light-emitting layer 113 in the EL layer 103 can be resonated between the electrodes and light emitted through the second electrode 102 can be intensified.

Note that when the first electrode 101 of the light-emitting device is a reflective electrode having a stacked-layer structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is $\lambda$, the optical path length between the first electrode 101 and the second electrode 102 (the product of the thickness and the refractive index) is preferably adjusted to be $m\lambda/2$ (m is an integer of 1 or more) or close to $m\lambda/2$.

To amplify desired light (wavelength: k) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be $(2m'+1)\lambda/4$ (m' is an integer of 1 or more) or close to (2m'+1)λ/4. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 2D:
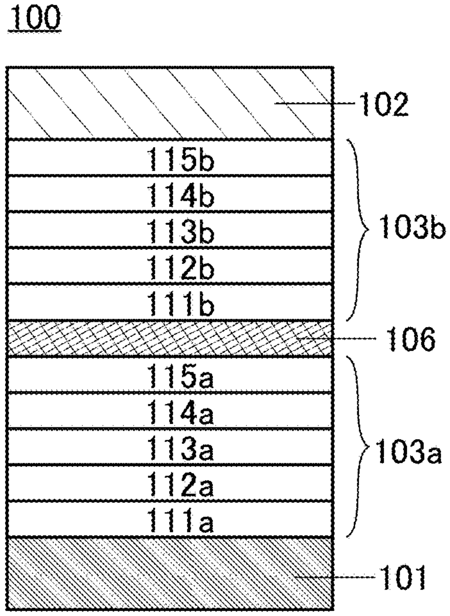

FIG. 2D illustrates a stacked-layer structures of the EL layers (103*a* and 103*b*) of the light-emitting device having a tandem structure. In this case, the first electrode 101 is regarded as functioning as an anode and the second electrode 102 is regarded as functioning as a cathode. The EL layer 103*a* has a structure where a hole-injection layer 111*a*, a hole-transport layer 112*a*, a light-emitting layer 113*a*, an electron-transport layer 114*a*, and an electron-injection layer 115*a* are sequentially stacked over the first electrode 101. The EL layer 103*b* has a structure where a hole-injection layer **1*l*1***b*, a hole-transport layer 112*b*, a light-emitting layer 113*b*, an electron-transport layer 114*b*, and an electron-injection layer 115*b* are sequentially stacked over the electron-generation layer 106. Note that the first electrode 101 may serve as a cathode and the second electrode 102 may serve as an anode; in this case, the stacking order of the layers in the EL layer 103 is preferably reversed.

For example, when the light-emitting device in FIG. 2D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the EL layer 103*b*, with the use of a material selected as appropriate.

In the case where the light-emitting device illustrated in FIG. 2D has a microcavity structure and light-emitting layers that emit light of different colors are used in the EL layers (103*a* and 103*b*), light (monochromatic light) with a desired wavelength derived from any of the light-emitting layers can be extracted owing to the microcavity structure. Thus, when such a light-emitting device is used for the light-emitting apparatus and the microcavity structure is adjusted in order to extract light with wavelengths which differ among pixels, separate formation of EL layers for obtaining different emission colors (e.g., R, G, and B) for each pixel is unnecessary. Therefore, higher resolution can be easily achieved. A combination with coloring layers (color filters) is also possible. Furthermore, the emission intensity of light with a specific wavelength in the front direction can be increased, whereby power consumption can be reduced.

Figure 2E:
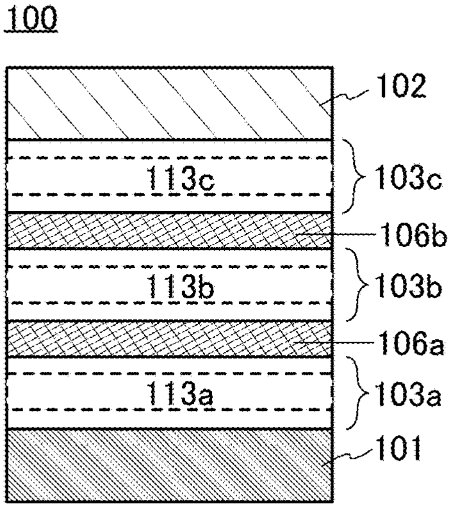

The light-emitting device illustrated in FIG. 2E is an example of the light-emitting device having the tandem structure illustrated in FIG. 2B, and includes three EL layers (103*a*, 103*b*, and 103*c*) stacked with charge-generation layers (106*a* and 106*b*) therebetween, as illustrated in FIG. 2E. The three EL layers (103*a*, 103*b*, and 103*c*) include respective light-emitting layers (113*a*, 113*b*, and 113*c*), and the emission colors of the light-emitting layers can be selected freely. For example, the light-emitting layer 113*a* can emit blue light, the light-emitting layer 113*b* can emit red light, green light, or yellow light, and the light-emitting layer 113*c* can emit blue light. For another example, the light-emitting layer 113*a* can emit red light, the light-emitting layer 113*b* can emit blue light, green light, or yellow light, and the light-emitting layer 113*c* can emit red light.

In the light-emitting device of one embodiment of the present invention, at least one of the first electrode 101 and the second electrode 102 is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%. These electrodes preferably have a resistivity less than or equal to $1\times10^{-2}$ Ωcm.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity less than or equal to $1\times10^{-2}$ Ωcm.

<<Specific Structure of Light-Emitting Device>>

Next, specific structures of layers in the light-emitting device of one embodiment of the present invention will be described. Note that for simplicity, reference numerals are sometimes omitted in the description of the layers.

<First Electrode and Second Electrode>

As materials for the first electrode and the second electrode, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device illustrated in FIG. 2D, when the first electrode 101 is the anode, the hole-injection layer 111*a* and the hole-transport layer 112*a* of the EL layer 103*a* are sequentially stacked over the first electrode 101 by a vacuum evaporation method. After the EL layer 103*a* and the charge-generation layer 106 are formed, the hole-injection layer 111*b* and the hole-transport layer 112*b* of the EL layer 103*b* are sequentially stacked over the charge-generation layer 106 in a similar manner.

<Hole-Injection Layer>

The hole-injection layer injects holes from the first electrode that is an anode and the charge-generation layer to the EL layer, and contains an organic acceptor material and a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. For example, any of the following materials can be used: 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to condensed aromatic rings each having a plurality of heteroatoms, such as HAT-CN, is particularly preferred because it has a high acceptor property and stable film quality against heat. Besides, a [3]radialene derivative having an electron-withdrawing group (particularly a cyano group or a halogen group such as a fluoro group), which has a very high electron-accepting property, is preferred; specific examples are α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 of the periodic table (e.g., a transition metal oxide such as molybdenum oxide, vanadium oxide, ruthenium oxide, tungsten oxide, or manganese oxide) can be used. Specific examples are molybdenum oxide, vanadium oxide, niobium oxide, tantalum oxide, chromium oxide, tungsten oxide, manganese oxide, and rhenium oxide. Among the above oxides, molybdenum oxide is preferable because it is stable in the air, has a low hygroscopic property, and is easily handled. Other examples are phthalocyanine (abbreviation: $H_2Pc$) and a phthalocyanine-based compound such as copper phthalocyanine (abbreviation: CuPc).

Other examples are aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis[4-bis(3-methylphenyl)aminophenyl]-N,N-diphenyl-4,4'-diaminobiphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples are high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N-bis(4-butylphenyl)-N,N-bis(phenyl)benzidine] (abbreviation: Poly-TPD). Other examples are a high-molecular compound to which acid is added, such as poly(3,4-ethylenedioxythiophene)/poly(styrenesulfonic acid) (abbreviation: PEDOT/PSS) and polyaniline/poly(styrenesulfonic acid) (abbreviation: PAni/PSS).

As the material having a high hole-injection property, a mixed material containing a hole-transport material and the above-described organic acceptor material (electron-accepting material) can be used. In this case, the organic acceptor material extracts electrons from the hole-transport material, so that holes are generated in the hole-injection layer 111 and injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that any other substance can also be used as long as the substance has a hole-transport property higher than an electron-transport property.

As the hole-transport material, a material having a high hole-transport property, such as a compound having a π-electron rich heteroaromatic ring (e.g., a carbazole derivative, a furan derivative, or a thiophene derivative) or an aromatic amine (an organic compound having an aromatic amine skeleton), is preferable.

Examples of the carbazole derivative (an organic compound having a carbazole ring) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) are 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(biphenyl-3-yl)-3,3'-bi-9H-carbazole (abbreviation: BismBPCz), 9-(biphenyl-3-yl)-9'-(biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: PNCCP).

Specific examples of the aromatic amine having a carbazolyl group are 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(biphenyl-4-yl)-N-[4-(9-phenyl-9H-carbazol-3-yl)phenyl]-9,9-dimethyl-9H-fluoren-2-amine (abbreviation: PCBBiF), N-[4-(9-phenyl-9H- carbazol-3-yl)phenyl]bis(9,9-dimethyl-9H-fluoren-2-yl) amine (abbreviation: PCBFF), N-(1,1'-biphenyl-4-yl)-N-[4-(9-phenyl-9H-carbazol-3-yl)phenyl]-9,9-dimethyl-9H-fluoren-4-amine, N-[4-(9-phenyl-9H-carbazol-3-yl)phenyl]-(9,9-dimethyl-9H-fluoren-2-yl)-9,9-dimethyl-9H-fluoren-4-amine, N-(1,1'-biphenyl-4-yl)-N-[4-(9-phenyl-9H-carbazol-3-yl)phenyl]-9,9-diphenyl-9H-fluoren-2-amine, N-(1,1'-biphenyl-4-yl)-N-[4-(9-phenyl-9H-carbazol-3-yl)phenyl]-9,9-diphenyl-9H-fluoren-4-amine, N-(1,1'-biphenyl-4-yl)-N-[4-(9-phenyl-9H-carbazol-3-yl)phenyl]-9,9'-spirobi(9H-fluoren)-2-amine, N-(1,1'-biphenyl-4-yl)-N-[4-(9-phenyl-9H-carbazol-3-yl)phenyl]-9,9'-spirobi(9H-fluoren)-4-amine, N-[4-(9-phenyl-9H-carbazol-3-yl)phenyl]-N-[1,1': 3,1"-terphenyl-4-yl]-9,9-dimethyl-9H-fluoren-2-amine, N-[4-(9-phenyl-9H-carbazol-3-yl)phenyl]-N-(1,1': 4',1"-terphenyl-4-yl)-9,9-dimethyl-9H-fluoren-2-amine, N-[4-(9-phenyl-9H-carbazol-3-yl)phenyl]-N-(1,1': 3',1"-terphenyl-4-yl)-9,9-dimethyl-9H-fluoren-4-amine, N-[4-(9-phenyl-9H-carbazol-3-yl)phenyl]-N-(1,1': 4',1"-terphenyl-4-yl)-9,9-dimethyl-9H-fluoren-4-amine, 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]-9,9'-spirobi[9H-fluoren]-2-amine (abbreviation: PCBASF), PCzPCA1, PCzPCA2, PCzPCN1, 3-[N-(4-diphenylamino-phenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9-dimethylfluorene-2,7-diamine (abbreviation: YGA2F), and 4,4', 4"-tris(carbazol-9-yl)triphenylamine (abbreviation: TCTA).

Other examples of the carbazole derivative include 9-[4-(9-phenyl-9H-carbazol-3-yl)-phenyl]phenanthrene (abbreviation: PCPPn), 3-[4-(1-naphthyl)-phenyl]-9-phenyl-9H-carbazole (abbreviation: PCPN), 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl) phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl] phenyl}dibenzofuran (abbreviation: mmDBFFLBi-II).

Specific examples of the thiophene derivative (an organic compound having a thiophene ring) include an organic compound having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl) phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV).

Specific examples of the aromatic amine include 4,4'-bis [N-(1-naphthyl)-N-phenylamino]biphenyl (abbreviation: NPB or α-NPD), N,N-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl) amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]-spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), TDATA, 4,4',4"-tris [N-(3-methylphenyl)-N-phenylamino]triphenylamine (abbreviation: m-MTDATA), N,N-di(p-tolyl)-N,N-diphenyl-p-phenylenediamine (abbreviation: DTDPPA), DPAB, DNTPD, DPA3B, N-(4-biphenyl)-6,N-diphenylbenzo[b] naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b] naphtho[1,2-d]furan-8-yl)-4"-phenyltriphenylamine (abbreviation: BnfBB1BP), NN-bis(4-biphenyl)benzo[b] naphtho[1,2-d]furan-6-amine (abbreviation: BBABnf(6)), NN-bis(4-biphenyl)benzo[b]naphtho[1,2-d]furan-8-amine (abbreviation: BBABnf(8)), N,N-bis(4-biphenyl)benzo[b] naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl) triphenylamine (abbreviation: BBAαNββ NB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-$O_2$), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis (biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Other than the above, PVK, PVTPA, PTPDMA, Poly-TPD, or the like that is a high molecular compound (e.g., an oligomer, a dendrimer, or a polymer) can be used as the hole-transport material. Alternatively, a high molecular compound to which acid is added, such as PEDOT/PSS or PAni/PSS can be used, for example.

Note that the hole-transport material is not limited to the above examples, and any of a variety of known materials may be used alone or in combination as the hole-transport material.

The hole-injection layer can be formed by any of known deposition methods such as a vacuum evaporation method.

<Hole-Transport Layer>

The hole-transport layer transports holes, which are injected from the first electrode by the hole-injection layer, to the light-emitting layer. The hole-transport layer contains a hole-transport material. Thus, the hole-transport layer can be formed using a hole-transport material that can be used for the hole-injection layer. Furthermore, the hole-transport layer can function even with a single-layer structure, but may have a stacked structure of two or more layers. For example, one of two hole-transport layers which is in contact with the light-emitting layer may also function as an electron-blocking layer.

Note that in the light-emitting device of one embodiment of the present invention, the same organic compound can be used for the hole-transport layer and the light-emitting layer. Using the same organic compound for the hole-transport layer and the light-emitting layer is preferable because holes can be efficiently transported from the hole-transport layer to the light-emitting layer.

<Light-Emitting Layer>

The light-emitting layer contains a light-emitting substance. Note that as a light-emitting substance that can be used for the light-emitting layer, a substance whose emission color is blue, violet, bluish violet, green, yellowish green, yellow, orange, red, or the like can be used as appropriate. One light-emitting layer may have a stacked-layer structure of layers containing different light-emitting substances.

The light-emitting layer may contain one or more kinds of organic compounds (e.g., a host material) in addition to the light-emitting substance (a guest material), and preferably employs the structure of the light-emitting layer described in Embodiment 1.

In the case where a plurality of host materials are used for the light-emitting layer, a second host material that is additionally used is preferably a substance having a larger energy gap than those of a known guest material and the first host material. Preferably, the lowest singlet excitation energy level (Si level) of the second host material is higher than that of the first host material, and the lowest triplet excitation energy level (Ti level) of the second host material is higher than that of the guest material. Preferably, the lowest triplet excitation energy level (Ti level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, a low voltage, and a long lifetime can be achieved at the same time.

As an organic compound used as the host material (including the first host material and the second host material), organic compounds such as the hole-transport materials usable for the hole-transport layers described above and electron-transport materials usable for electron-transport layers described later can be used as long as they satisfy requirements for the host material used for the light-emitting layer. Another example is an exciplex formed by two or more kinds of organic compounds (the first host material and the second host material). An exciplex whose excited state is formed by two or more kinds of organic compounds has an extremely small difference between the Si level and the Ti level and functions as a TADF material capable of converting triplet excitation energy into singlet excitation energy. In an example of a preferable combination of two or more kinds of organic compounds forming an exciplex, one of the two or more kinds of organic compounds has a Ti-electron deficient heteroaromatic ring and the other has a Tc-electron rich heteroaromatic ring. A phosphorescent substance such as an iridium-, rhodium-, or platinum-based organometallic complex or a metal complex may be used as one component of the combination for forming an exciplex.

There is no particular limitation on the light-emitting substances that can be used for the light-emitting layer, and a light-emitting substance that converts singlet excitation energy into light emission in the visible light range or a light-emitting substance that converts triplet excitation energy into light emission in the visible light range can be used.

<<Light-Emitting Substance that Converts Singlet Excitation Energy into Light>>

The following substances that emit fluorescent light (fluorescent substances) can be given as examples of the light-emitting substance that converts singlet excitation energy into light and can be used in the light-emitting layer: a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine](abbreviation: 1,6BnfAPrn-$O_2$), and N,N-(pyrene-1,6-diyl)bis[(6,N-diphenylbenzo[b]naphtho[1,2-d]furan)-8-amine] (abbreviation: 1,6BnfAPrn-03).

As a light-emitting substance that converts singlet excitation energy into light, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra-tert-butylperylene (abbreviation: TBP), N,N'-(2-tert-butylanthracene-9,10-diyldi-4,1-phenylene)bis(N,N,N-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N,N-triphenyl-1,4-phenylenediamine (abbreviation: 2DPAPPA).

As the light-emitting substance that converts singlet excitation energy into light, it is also possible to use, for example, N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(biphenyl-2-yl)-2-anthryl]-N,N,N-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, N,N-diphenyl-N,N-bis(9-phenyl-9H-carbazol-2-yl)naphtho[2,3-b;6,7-b']bisbenzofuran-3,10-diamine (abbreviation: 3,10PCA2Nbf(IV)-02), N,N-bis(dibenzofuran-3-yl)-N,N'-diphenylnaphtho[2,3-b;6,7-b']bisbenzofuran-3,10-diamine (abbreviation: 3,10FrA2Nbf(IV)-$O_2$). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light>>

Examples of the light-emitting substance that converts triplet excitation energy into light and can be used for the light-emitting layer 113 include substances that emit phosphorescent light (phosphorescent substances) and thermally activated delayed fluorescent (TADF) materials that exhibit thermally activated delayed fluorescence.

A phosphorescent substance is a compound that emits phosphorescent light but does not emit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is particularly preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr$^5$btz)$_3$]); organometallic complexes having a 1H-triazole ring, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole ring, such as fac-tris[1-(2,6-diisopropylphenyl)-2-phenyl-1H-imidazole]iridium(III) (abbreviation: [Ir(iPrpim)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^2$}iridium(III) picolinate (abbreviation: [Ir($CF_3$ppy)$_2$(pic)]), and bis[2-(4',6'-difluorophenyl)pyridinato-N,$C^{2'}$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength of greater than or equal to 495 nm and less than or equal to 590 nm, the following substances can be given.

Examples include organometallic iridium complexes having a pyrimidine ring, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato) bis{4,6-dimethyl-2-[6-(2,6-dimethylphenyl)-4-pyrimidinyl-κ$N^3$]phenyl-κC}iridium(III) (abbreviation: $[Ir(dmppm\text{-}dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine ring, such as (acetylacetonato)bis(3,5-dimethyl-2-phenylpyrazinato)iridium(III) (abbreviation: $[Ir(mppr\text{-}Me)_2(acac)]$) and (acetylacetonato)bis(5-isopropyl-3-methyl-2-phenylpyrazinato)iridium(III) (abbreviation: $[Ir(mppr\text{-}iPr)_2(acac)]$); organometallic iridium complexes having a pyridine ring, such as tris(2-phenylpyridinato-N,$C^{2'}$)iridium (III) (abbreviation: $[Ir(ppy)_3]$), bis(2-phenylpyridinato-N, $C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo [h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), bis[2-(2-pyridinyl-κN)phenyl-κC][2-(4-phenyl-2-pyridinyl-κN)phenyl-κC]iridium(III) (abbreviation: $[Ir(ppy)_2(4dppy)]$), bis[2-(2-pyridinyl-κN)phenyl-κC][2-(4-methyl-5-phenyl-2-pyridinyl-κN)phenyl-κC], [2-$d_3$-methyl-8-(2-pyridinyl-κN) benzofuro[2,3-b]pyridine-κC]bis[2-(5-$d_3$-methyl-2-pyridinyl-κ$N^2$)phenyl-κC]iridium(III) (abbreviation: $Ir(5mppy\text{-}d_3)_2(mbfpypy\text{-}d_3)$), {2-(methyl-$d_3$)-8-[4-(1-methylethyl-1-d)-2-pyridinyl-κN]benzofuro[2,3-b]pyridin-7-yl-κC}bis{5-(methyl-$d_3$)-2-[5-(methyl-$d_3$)-2-pyridinyl-κN]phenyl-κC}iridium(III) (abbreviation: $Ir(5mtpy\text{-}d_6)_2(mbfpypy\text{-}iPr\text{-}d_4)$), [2-$d_3$-methyl-(2-pyridinyl-κN) benzofuro[2,3-b]pyridine-κC]bis[2-(2-pyridinyl-κN) phenyl-κC]iridium(III) (abbreviation: $Ir(ppy)_2(mbfpypy\text{-}d_3)$), and [2-(4-methyl-5-phenyl-2-pyridinyl-κN)phenyl-κC]bis[2-(2-pyridinyl-κN)phenyl-κC]iridium(III) (abbreviation: $Ir(ppy)_2(mdppy)$); organometallic complexes such as bis(2,4-diphenyl-1,3-oxazolato-N,$C^2$)iridium(III) acetylacetonate (abbreviation: $[Ir(dpo)_2(acac)]$), bis{2-[4'-(perfluorophenyl)phenyl]pyridinato-N,$C^{2'}$}iridium(III) acetylacetonate (abbreviation: $[Ir(p\text{-}PF\text{-}ph)_2(acac)]$), and bis (2-phenylbenzothiazolato-N,$C^{2'}$)iridium(III) acetylacetonate (abbreviation: $[Ir(bt)_2(acac)]$); and a rare earth metal complex such as tris(acetylacetonato) (monophenanthroline)terbium(III) (abbreviation: $[Tb(acac)_3(Phen)]$).

<<Phosphorescent Substance (from 570 nm to 750 nm, Yellow or Red)>>

As examples of a phosphorescent substance which emits yellow or red light and whose emission spectrum has a peak wavelength of greater than or equal to 570 nm and less than or equal to 750 nm, the following substances can be given.

Examples include organometallic complexes having a pyrimidine ring, such as (diisobutyrylmethanato)bis[4,6-bis (3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and (dipivaloylmethanato)bis[4,6-di (naphthalen-1-yl)pyrimidinato]iridium(III) (abbreviation: $[Ir(d1npm)_2(dpm)]$); organometallic complexes having a pyrazine ring, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium (III) (abbreviation: $[Ir(tppr)_2(dpm)]$), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: $[Ir(dmdppr\text{-}P)_2(dibm)]$), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: $[Ir(dmdppr\text{-}dmCP)_2(dpm)]$), bis[2-(5-(2,6-dimethylphenyl)-3-(3,5-dimethylphenyl)-2-pyrazinyl-κN)-4,6-dimethylphenyl-κC] (2,2',6,6'-tetramethyl-3,5-heptanedionato-κ$^2$O,O')iridium (III) (abbreviation: $[Ir(dmdppr\text{-}dmp)_2(dpm)]$), (acetylacetonato)bis(2-methyl-3-phenylquinoxalinato-N,$C^{2'}$]iridium (III) (abbreviation: $Ir(mpq)_2(acac)$), (acetylacetonato)bis(2, 3-diphenylquinoxalinato-N,$C^{2'}$)iridium(III) (abbreviation: $[Ir(dpq)_2(acac)]$), and (acetylacetonato)bis[2,3-bis(4-fluorophenyl)quinoxalinato]iridium(III) (abbreviation: $[Ir(Fdpq)_2(acac)]$); organometallic complexes having a pyridine ring, such as tris(1-phenylisoquinolinato-N,$C^{2'}$)iridium(III) (abbreviation: $[Ir(piq)_3]$), bis(1-phenylisoquinolinato-N,$C^{2'}$) iridium(III) acetylacetonate (abbreviation: $[Ir(piq)_2(acac)]$), and bis[4,6-dimethyl-2-(2-quinolinyl-κN)phenyl-κC] (2,4-pentanedionato-κ$^2$O,O')iridium(III) (abbreviation: $[Ir(dmpqn)_2(acac)]$); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato] (monophenanthroline)europium(III) (abbreviation: $[Eu(TTA)_3(Phen)]$).

<<TADF Material>>

Any of materials described below can be used as the TADF material. The TADF material is a material that has a small difference between its Si and Ti levels (preferably less than or equal to 0.2 eV), enables up-conversion of a triplet excited state into a singlet excited state (i.e., reverse intersystem crossing) using a little thermal energy, and efficiently emits light (fluorescent light) from the singlet excited state. Thermally activated delayed fluorescence is efficiently obtained under the condition where the energy difference between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescent light and an extremely long lifetime. The lifetime is longer than or equal to $1\times10^{-6}$ seconds or longer than or equal to $1\times10^{-3}$ seconds.

Note that the TADF material can be also used as an electron-transport material, a hole-transport material, or a host material.

Examples of the TADF material include fullerene, a derivative thereof, an acridine derivative such as proflavine, and eosin. The examples further include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2(Proto\ IX)$), a mesoporphyrin-tin fluoride complex (abbreviation: $SnF_2(Meso\ IX)$), a hematoporphyrin-tin fluoride complex (abbreviation: $SnF_2(Hemato\ IX)$), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).
[Chemical Formula 11]
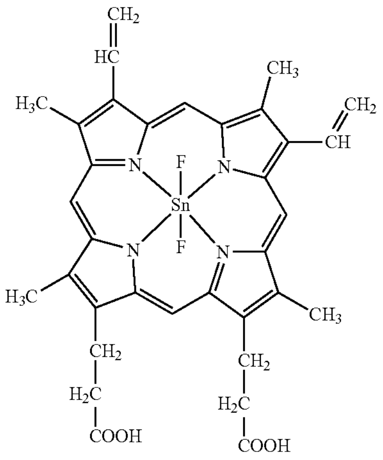
$SnF_2$(Proto IX)
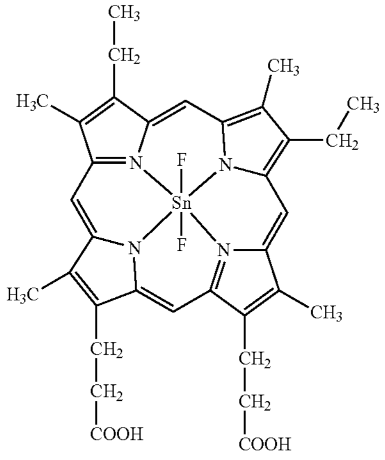
$SnF_2$(Meso IX)
-continued
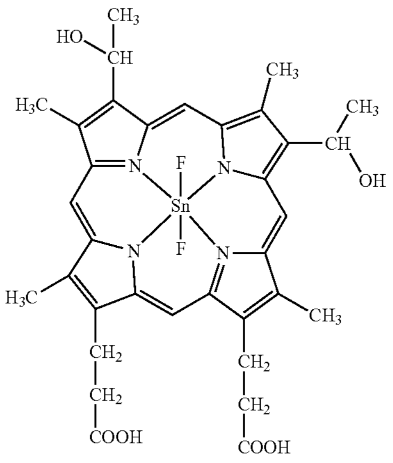
$SnF_2$(Hemato IX)
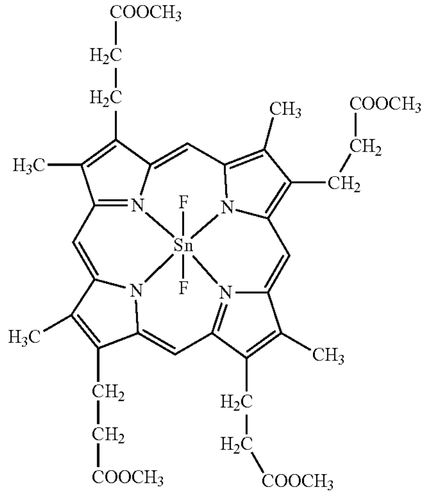
$SnF_2$(Copro III-4Me)
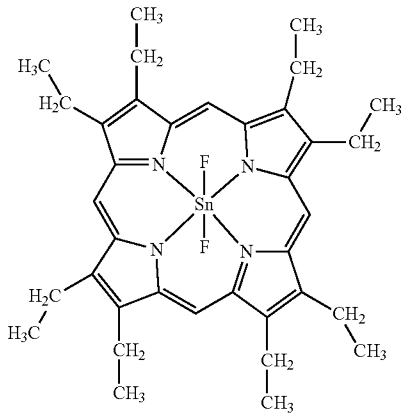
$SnF_2$(OEP)

-continued

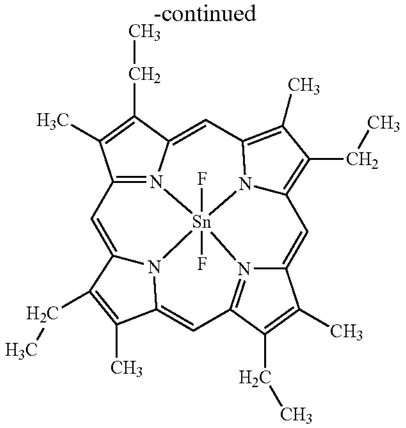

SnF$_2$(Etio I)

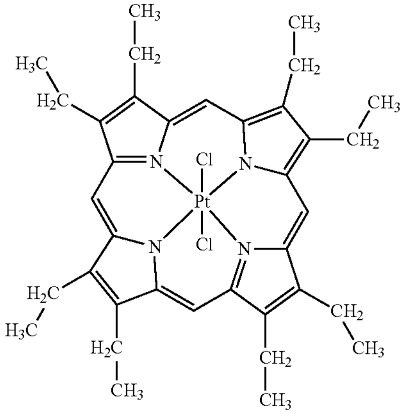

PtCl$_2$OEP

Alternatively, a heteroaromatic compound including a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-O$_2$) may be used.

Note that a substance in which a π-electron rich heteroaromatic compound is directly bonded to a Tc-electron deficient heteroaromatic compound is particularly preferable because both the donor property of the Tc-electron rich heteroaromatic compound and the acceptor property of the T-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), an efficiency decrease of a light-emitting element in a high-luminance region can be inhibited.

[Chemical Formula 12]

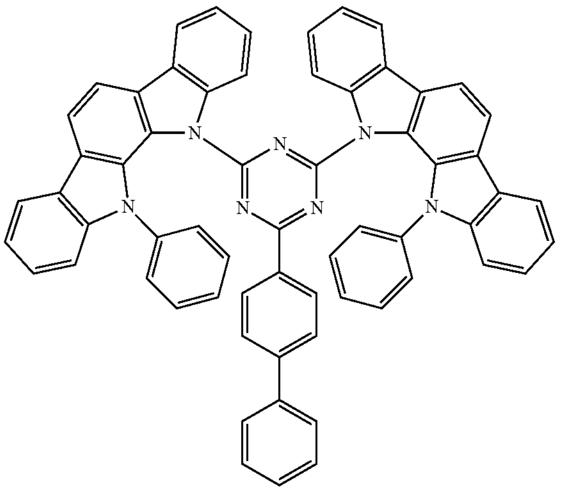

PIC-TRZ

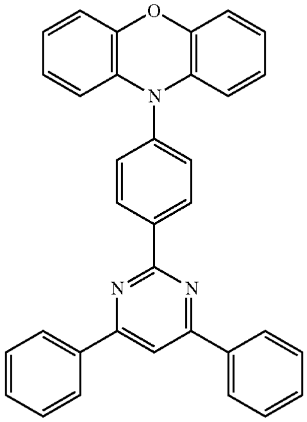

PXZ-TRZ

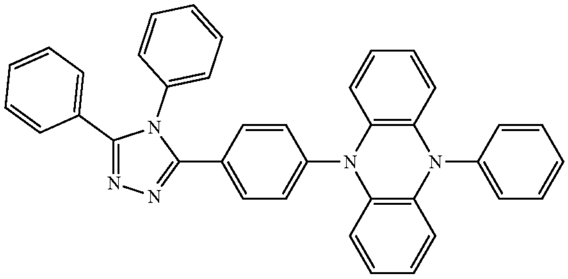

PPZ-3TPT

-continued

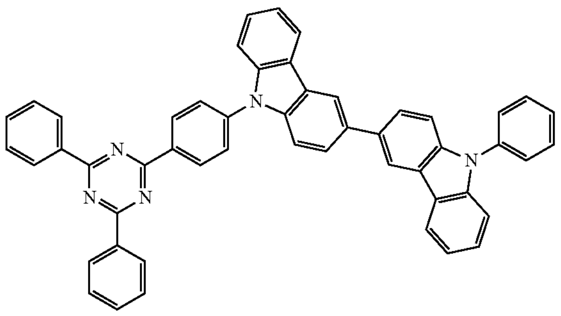

PCCzPTzn

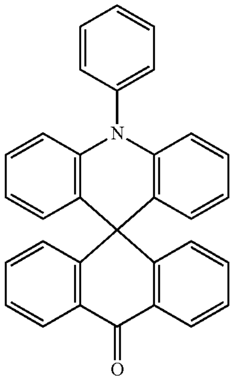

ACRSA

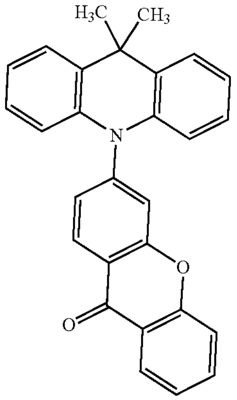

ACRXTN

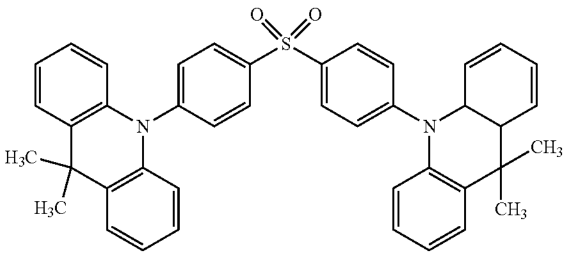

DMAC-DPS

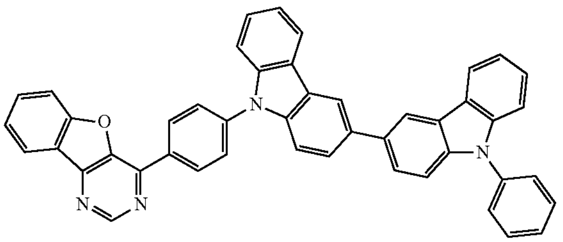

4PCCzPBfpm

-continued

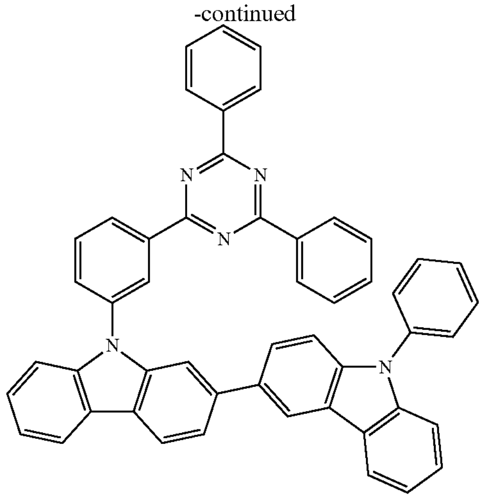

mPCCzPTzn-02

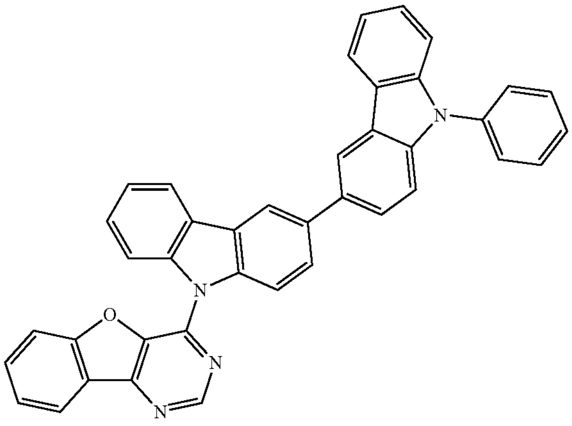

4PCCzBfpm

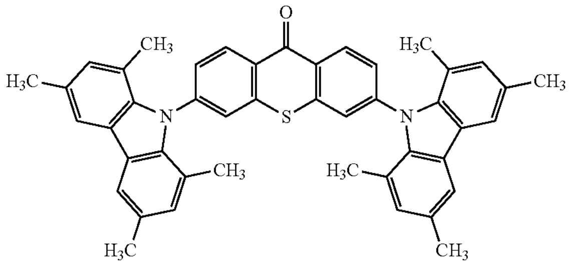

TADF100

In addition to the above, a nano-structure of a transition metal compound having a perovskite structure can be given as another example of a material having a function of converting triplet excitation energy into light. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layer), one or more kinds selected from substances having a larger energy gap than the light-emitting substance (guest material) are used.

Next, materials that can be used as host materials are described. For the first organic compound described in Embodiment 1, a material having a property of not easily forming an oxygen adduct selected from materials shown below, as well as the materials described in Embodiment 1, can be used.

<<Host Material for Fluorescent Light>>

In the case where the light-emitting substance used for the light-emitting layer is a fluorescent substance, an organic compound (a host material) used in combination with the fluorescent substance is preferably an organic compound that has a high energy level in a singlet excited state and has a low energy level in a triplet excited state or an organic compound that has a high fluorescence quantum yield. Therefore, the hole-transport material (described above) and the electron-transport material (described below) shown in this embodiment, for example, can be used as long as they are organic compounds that satisfy such a condition.

In terms of a preferable combination with the light-emitting substance (fluorescent substance), examples of the organic compound (host material), some of which overlap the above specific examples, include condensed polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3).

<<Host Material for Phosphorescent Light>>

In the case where the light-emitting substance used for the light-emitting layer is a phosphorescent substance, an organic compound having triplet excitation energy (an energy difference between a ground state and a triplet excited state) which is higher than that of the light-emitting substance is selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In terms of a preferable combination with the light-emitting substance (phosphorescent substance), examples of the organic compounds (the host material and the assist material), some of which overlap the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having a triazole ring), a benzimidazole derivative (an organic compound having a benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, are mmDBFFLBi-II, DBF3P-II, DBT3P-II, DBTFLP-III, DBTFLP-IV, and 4-[3-(triphenylen-2-yl)phenyl]dibenzothiophene (abbreviation: mDBTPTp-II), and these materials are each preferable as a host material.

Other examples of preferable host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include an organic compound containing a heteroaromatic ring having a polyazole ring such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOS); an organic compound containing a heteroaromatic ring having a pyridine ring such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), or 2,2'-(1,3-phenylene)bis[9-phenyl-1,10-phenanthroline](abbreviation: mPPhen2P); 2-[3-(dibenzothiophen-4-yl)phenyl]dibenzo[f,h]quinoxaline (abbreviation: 2mDBTPDBq-II); 2-[3'-(dibenzothiophen-4-yl)biphenyl-3-yl]dibenzo[f,h]quinoxaline (abbreviation: 2mDBTBPDBq-II); 2-[3'-(9H-carbazol-9-yl)biphenyl-3-yl]dibenzo[f;h]quinoxaline (abbreviation: 2mCzBPDBq); 2-[4-(3,6-diphenyl-9H-carbazol-9-yl)phenyl]dibenzo[f;h]quinoxaline (abbreviation: 2CzPDBq-III); 7-[3-(dibenzothiophen-4-yl)phenyl]dibenzo[f;h]quinoxaline (abbreviation: 7mDBTPDBq-II); 6-[3-(dibenzothiophen-4-yl)phenyl]dibenzo[f;h]quinoxaline (abbreviation: 6mDBTPDBq-II); 2-{4-[9,10-di(2-naphthyl)-2-anthryl]phenyl}-1-phenyl-1H-benzimidazole (abbreviation: ZADN); and 2-[4'-(9-phenyl-9H-carbazol-3-yl)-3,1'-biphenyl-1-yl]dibenzo[f,h]quinoxaline (abbreviation: 2mpPCBPDBq). Such organic compounds are preferable as the host material.

Among the above organic compounds, specific examples of the pyridine derivative, the diazine derivative (e.g., the pyrimidine derivative, the pyrazine derivative, and the pyridazine derivative), the triazine derivative, the furodiazine derivative, which are organic compounds having a high electron-transport property, include organic compounds including a heteroaromatic ring having a diazine ring such as 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), 4,6-bis[3-(9H-carbazol-9-yl)phenyl]pyrimidine (abbreviation: 4,6mCzP2Pm), PCCzPTzn, mPCCzPTzn-02,3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)] bis(9H-carbazole) (abbreviation: 4,6mCzBP2Pm), 2-[3'-(9,9-dimethyl-9H-fluoren-2-yl)biphenyl-3-yl]-4,6-diphenyl-1,3,5-triazine (abbreviation: mFBPTzn), 8-(biphenyl-4-yl)-4-[3-(dibenzothiophen-4-yl)phenyl]-[1]benzofuro[3,2-d] pyrimidine (abbreviation: 8BP-4mDBtPBfpm), 9-[3'-(dibenzothiophen-4-yl)biphenyl-3-yl]naphtho[1',2': 4,5]furo [2,3-b]pyrazine (abbreviation: 9mDBtBPNfpr), 9-[3'-(dibenzothiophen-4-yl)biphenyl-4-yl]naphtho[1',2': 4,5]furo [2,3-b]pyrazine (abbreviation: 9pmDBtBPNfpr), 11-[(3'-dibenzothiophen-4-yl)bipheny-3-yl]phenanthro[9',10': 4,5] furo[2,3-b]pyrazine (abbreviation: 11mDBtBPPnfpr), 11-[3'-(dibenzothiophen-4-yl)biphenyl-4-yl]phenanthro[9',10': 4,5]furo[2,3-b]pyrazine, 11-[3'-(9H-carbazol-9-yl)biphenyl-3-yl]phenanthro[9',10': 4,5]furo[2,3-b]pyrazine, 12-(9'-phenyl-3,3'-bi-9H-carbazol-9-yl)phenanthro[9',10': 4,5]furo[2,3-b]pyrazine (abbreviation: 12PCCzPnfpr), 9-[(3'-9-phenyl-9H-carbazol-3-yl)biphenyl-4-yl]naphtho[1',2': 4,5]furo[2,3-b]pyrazine (abbreviation: 9pmPCBPNfpr), 9-(9'-phenyl-3,3'-bi-9H-carbazol-9-yl)naphtho[1',2': 4,5]furo[2,3-b] pyrazine (abbreviation: 9PCCzNfpr), 10-(9'-phenyl-3,3'-bi-9H-carbazol-9-yl)naphtho[1',2': 4,5]furo[2,3-b]pyrazine (abbreviation: 1OPCCzNfpr), 9-[3'-(6-phenylbenzo[b]naphtho[1,2-d]furan-8-yl)biphenyl-3-yl]naphtho[1',2': 4,5]furo [2,3-b]pyrazine (abbreviation: 9mBnfBPNfpr), 9-{3-[6-(9,9-dimethylfluoren-2-yl)dibenzothiophen-4-yl] phenyl}naphtho[1',2': 4,5]furo[2,3-b]pyrazine (abbreviation: 9mFDBtPNfpr), 9-[3'-(6-phenyldibenzothiophen-4-yl)biphenyl-3-yl]naphtho[1',2': 4,5]furo[2,3-b] pyrazine (abbreviation: 9mDBtBPNfpr-02), 9-[3-(9'-phenyl-3,3'-bi-9H-carbazol-9-yl)phenyl]naphtho[1',2': 4,5]furo[2,3-b]pyrazine (abbreviation: 9mPCCzPNfpr), 9-{(3'-[2,8-diphenyldibenzothiophen-4-yl)biphenyl-3-yl}naphtho[1',2': 4,5]furo[2,3-b]pyrazine, 11-{(3'-[2,8-diphenyldibenzothiophen-4-yl)biphenyl-3-yl}phenanthro[9',10': 4,5]furo[2,3-b]pyrazine, 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)biphenyl-3-yl]-4,6-diphenyl-1,3,5-triazine (abbreviation: mTpBPTzn), 2-(biphenyl-4-yl)-4-phenyl-6-(9,9'-spirobi[9H-fluoren]-2-yl)-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 3-[9-(4,6-diphenyl-1,3,5-triazin-2-yl)-2-dibenzofuranyl]-9-phenyl-9H-carbazole (abbreviation: PCDBfTzn), 2-(biphenyl-3-yl)-4-phenyl-6-{8-[(1,1': 4',1"-terphenyl)-4-yl]-1-dibenzofuranyl}-1,3,5-triazine (abbreviation: mBP-TPDBfTzn), 6-(biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(biphenyl-4-yl)pyrimidine (abbreviation: 6BP-4Cz2PPm), and those materials are preferable as the host material.

Among the above organic compounds, specific examples of metal complexes that are organic compounds having a high electron-transport property include zinc- or aluminum-based metal complexes, such as tris(8-quinolinolato)aluminum(III) (abbreviation: Alq), tris(4-methyl-8-quinolinolato) aluminum(III) (abbreviation: $Almq_3$), bis(10-hydroxybenzo [h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Furthermore, the following organic compounds having a diazine ring, which have bipolar properties, a high hole-transport property, and a high electron-transport property, can be used as the host material: 9-phenyl-9'-(4-phenyl-2-quinazolinyl)-3,3'-bi-9H-carbazole (abbreviation: PCCzQz), 2mpPCBPDBq, mINc(II)PTzn, 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), and 7-[4-(9-phenyl-9H-carbazol-2-yl)quinazolin-2-yl]-7H-dibenzo[c,g]carbazole (abbreviation: PC-cgDBCzQz).

<Electron-Transport Layer>

The electron-transport layer transports electrons, which are injected from the second electrode and the charge-generation layer by the electron-injection layer to be described later, to the light-emitting layer. The material used for the electron-transport layer is preferably a substance having an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. Furthermore, the electron-transport layer can function even with a single-layer structure, but may have a stacked structure of two or more layers. For example, one of two electron-transport layers which is in contact with the light-emitting layer may also function as a hole-blocking layer. Moreover, when the electron-transport layer has a stacked-layer structure, heat resistance can be increased in some cases. A photolithography process performed over the electron-transport layer including the above-described mixed material, which has heat resistance, can inhibit an adverse effect of thermal process on the device characteristics.

<<Electron-Transport Material>>

As the electron-transport material that can be used for the electron-transport layer, an organic compound having a high electron-transport property can be used, and for example, a heteroaromatic compound can be used. The heteroaromatic compound refers to a cyclic compound containing at least two different kinds of elements in a ring. Examples of cyclic structures include a three-membered ring, a four-membered ring, a five-membered ring, and a six-membered ring, among which a five-membered ring and a six-membered ring are particularly preferable. The elements contained in the heteroaromatic compound are preferably one or more of nitrogen, oxygen, and sulfur, in addition to carbon. In particular, a heteroaromatic compound containing nitrogen (a nitrogen-containing heteroaromatic compound) is preferable, and any of materials having a high electron-transport property (electron-transport materials), such as a nitrogen-containing heteroaromatic compound and a iT-electron deficient heteroaromatic compound including the nitrogen-containing heteroaromatic compound, is preferably used.

Note that the electron-transport material can be different from the materials used for the light-emitting layer. Not all excitons formed by recombination of carriers in the light-emitting layer can contribute to light emission and some excitons might be diffused into a layer in contact with the light-emitting layer or a layer in the vicinity of the light-emitting layer. In order to avoid this phenomenon, the energy level (the lowest singlet excitation energy level or the lowest triplet excitation energy level) of a material used for the layer in contact with the light-emitting layer or the layer in the vicinity of the light-emitting layer is preferably higher than that of a material used for the light-emitting layer. Therefore, when a material different from the material of the light-emitting layer is used as the electron-transport material, an element with high efficiency can be obtained.

The heteroaromatic compound is an organic compound having at least one heteroaromatic ring.

The heteroaromatic ring has any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a condensed heteroaromatic ring having a fused ring structure. Examples of the condensed heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound containing carbon and one or more of nitrogen, oxygen, sulfur, and the like, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, and a heteroaromatic compound having a benzimidazole ring.

Examples of the heteroaromatic compound having a six-membered ring structure, which is a heteroaromatic compound containing carbon and one or more of nitrogen, oxygen, sulfur, and the like, include a heteroaromatic compound having a heteroaromatic ring, such as a pyridine ring, a diazine ring (including a pyrimidine ring, a pyrazine ring, a pyridazine ring, or the like), or a triazine ring. Other examples include a heteroaromatic compound having a bipyridine structure and a heteroaromatic compound having a terpyridine structure, although they are included in examples of a heteroaromatic compound in which pyridine rings are bonded.

Examples of the heteroaromatic compound having a fused ring structure including the above six-membered ring structure as a part include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a structure where an aromatic ring is condensed to a furan ring of a furodiazine ring), or a benzimidazole ring.

Specific examples of the heteroaromatic compound having a 5-membered ring structure (e.g., a polyazole ring (including an imidazole ring, a triazole ring, and an oxadiazole ring), an oxazole ring, a thiazole ring, or a benzimidazole ring) are PBD, OXD-7, CO11, TAZ, 3-(4-tert-butylphenyl)-4-(4-ethylphenyl)-5-(4-biphenylyl)-1,2,4-triazole (abbreviation: p-EtTAZ), TPBI, mDBTBIm-II, and BzOS.

Specific examples of the heteroaromatic compound having a 6-membered ring structure (including a heteroaromatic ring having a pyridine ring, a diazine ring, a triazine ring, or the like) are a heteroaromatic compound including a heteroaromatic ring having a pyridine ring, such as 35DCzPPy or TmPyPB; a heteroaromatic compound including a heteroaromatic ring having a triazine ring, such as PCCzPTzn, mPCCzPTzn-$O_2$, mINc(II)PTzn, mTpBPTzn, BP-SFTzn, 2,4NP-6PyPPm, PCDBfTzn, mBP-TPDBfTzn, 2-{3-[3-(dibenzothiophen-4-yl)phenyl]phenyl}-4,6-diphenyl-1,3,5-triazine (abbreviation: mDBtBPTzn), or mFBPTzn; and a heteroaromatic compound including a heteroaromatic ring having a diazine (pyrimidine) ring, such as 4,6mPnP2Pm, 4,6mDBTP2Pm-II, 4,6mCzP2Pm, 4,6mCzBP2Pm, 6mBP-4Cz2PPm, 6BP-4Cz2PPm, 8-(naphthalen-2-yl)-4-[3-(dibenzothiophen-4-yl)phenyl]-[1]benzofuro[3,2-d]pyrimidine (abbreviation: 8PN-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)biphenyl-3-yl]naphtho[1',2': 4,5]furo[3,2-d]pyrimidine (abbreviation: 8mDBtBPNfpm), and 8-[(2,2'-binaphthalen)-6-yl]-4-[3-(dibenzothiophen-4-yl)phenyl]-[1]benzofuro[3,2-d]pyrimidine (abbreviation: 8(PN2)-4mDBtPBfpm). Note that the above aromatic compounds including a heteroaromatic ring include a heteroaromatic compound having a condensed heteroaromatic ring.

Other examples include a heteroaromatic compound including a heteroaromatic ring having a diazine (pyrimidine) ring, such as 2,2'-(pyridine-2,6-diyl)bis(4-phenylbenzo[h]quinazoline) (abbreviation: 2,6(P-Bqn)2Py), 2,2'-(2,2'-bipyridine-6,6'-diyl)bis(4-phenylbenzo[h]quinazoline) (abbreviation: 6,6'(P-Bqn)2BPy), 2,2'-(pyridine-2,6-diyl)bis{4-[4-(2-naphthyl)phenyl]-6-phenylpyrimidine} (abbreviation: 2,6(NP-PPm)2Py), or 6mBP-4Cz2PPm, and a heteroaromatic compound including a heteroaromatic ring having a triazine ring, such as 2,4,6-tris[3'-(pyridin-3-yl)biphenyl-3-yl]-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridyl)-5-(9-phenanthryl)phenyl]-4,6-diphenyl-1,3,5-triazine (abbreviation: mPn-mDMePyPTzn).

Specific examples of the heteroaromatic compound with a fused structure that partly has a 6-membered ring structure are heteroaromatic compounds each having a quinoxaline ring, such as BPhen, bathocuproine (abbreviation: BCP), NBPhen, mPPhen2P, 2,6(P-Bqn)2Py, 2mDBTPDBq-II, 2mDBTBPDBq-II, 2mCzBPDBq, 2CzPDBq-III, 7mDBTPDBq-II, 6mDBTPDBq-II, and 2mpPCBPDBq.

For the electron-transport layer, any of the metal complexes given below as well as the heteroaromatic compounds given above can be used. Examples include metal complexes each including a quinoline ring or a benzoquinoline ring, such as tris(8-quinolinolato)aluminum (III) (abbreviation: Alq3), $Almq_3$, 8-quinolinolato-lithium (abbreviation: Liq), $BeBq_2$, BAlq, and Znq; and metal complexes each including an oxazole ring or a thiazole ring, such as ZnPBO and ZnBTZ.

It is also possible to use high-molecular compounds such as PPy, PF-Py, and PF-BPy as the electron-transport material.

<Electron-Injection Layer>

The electron-injection layer is a layer containing a substance having a high electron-injection property. The electron-injection layer is a layer for increasing the efficiency of electron injection from the second electrode and is preferably formed using a material whose value of the LUMO level has a small difference (0.5 eV or less) from the work function of a material used for the second electrode. Thus, the electron-injection layer can be formed using an alkali metal, an alkaline earth metal, or a compound thereof, such as lithium, cesium, lithium fluoride (LiF), cesium fluoride (CsF), calcium fluoride (CaF2), Liq, 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium (LiOx), or cesium carbonate. A rare earth metal such as Yb or a rare earth metal compound such as erbium fluoride (ErF3) can also be used. To form the electron-injection layer, a plurality of kinds of materials given above may be mixed or stacked. For example, the electron-injection layer may be a stack of layers with different electric resistances. Electride may also be used for the electron-injection layer. Examples of the electride include a substance in which electrons are added at high concentration to calcium oxide-aluminum oxide. Any of the above-described substances used for the electron-transport layer can also be used.

A mixed material in which an organic compound and an electron donor (donor) are mixed may also be used for the electron-injection layer. Such a mixed material is excellent in an electron-injection property and an electron-transport property because electrons are generated in the organic compound by the electron donor. The organic compound here is preferably a material excellent in transporting the generated electrons; specifically, for example, electron-transport materials used for an electron-transport layer described above (e.g., a metal complex and a heteroaromatic compound) can be used. As the electron donor, a substance showing an electron-donating property with respect to an organic compound is used. Specifically, an alkali metal, an alkaline earth metal, and a rare earth metal are preferable, and Li, Cs, Mg, Ca, erbium (Er), Yb, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used. Alternatively, a stack of two or more of these materials may be used.

Alternatively, the electron-injection layer may be formed using a mixed material in which an organic compound and a metal are mixed. The organic compound used here preferably has a lowest unoccupied molecular orbital (LUMO) level higher than or equal to −3.6 eV and lower than or equal to −2.3 eV. Moreover, a material having an unshared electron pair is preferable.

Thus, as the organic compound used in the above mixed material, a mixed material obtained by mixing a metal and the heteroaromatic compound given above as the material that can be used for the electron-transport layer may be used. Preferable examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure including a six-membered ring structure as a part (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal that belongs to Group 5, Group 7, Group 9, or Group 11 or a material that belongs to Group 13 in the periodic table is preferably used, and examples include Ag, Cu, A1, and In. Here, the organic compound forms a singly occupied molecular orbital (SOMO) with the transition metal.

For example, in the case where light emitted from the light-emitting layer **113*b* is amplified in the light-emitting device illustrated in FIG. 2D, the optical path length between the second electrode 102 and the light-emitting layer 113*b* is preferably less than one fourth of the wavelength λ of light emitted from the light-emitting layer 113*b*. In this case, the optical path length can be adjusted by changing the thickness of the electron-transport layer 114*b* or the electron-injection layer 115*b***.

<Charge-Generation Layer>

The charge-generation layer has a function of injecting electrons into one of the EL layers and injecting holes into the other of the EL layers when a voltage is applied between the first electrode and the second electrode of the light-emitting device having a tandem structure. The charge-generation layer may be either a p-type layer in which an electron acceptor (acceptor) is added to a hole-transport material or an electron-injection buffer layer in which an electron donor (donor) is added to an electron-transport material. Alternatively, both of these layers may be stacked. Furthermore, an electron-relay layer may be provided between the p-type layer and the electron-injection buffer layer. Note that forming the charge-generation layer with the use of any of the above materials can inhibit an increase in driving voltage caused by the stack of the EL layers.

In the case where the charge-generation layer is a p-type layer in which an electron acceptor is added to a hole-transport material, which is an organic compound, any of the materials described in this embodiment can be used as the hole-transport material. Further, F4-TCNQ, chloranil, and the like can be given as examples of the electron acceptor. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide. Any of the above-described acceptor materials may be used. Furthermore, a mixed film obtained by mixing materials of a p-type layer or a stack of films containing the respective materials may be used.

In the case where the charge-generation layer is an electron-injection buffer layer in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, Li, Cs, Mg, calcium (Ca), Yb, indium (In), lithium oxide ($Li_2O$), cesium carbonate, or the like is preferably used. An organic compound such as tetrathianaphthacene may be used as the electron donor.

When an electron-relay layer is provided between a p-type layer and an electron-injection buffer layer in the charge-generation layer, the electron-relay layer contains at least a substance having an electron-transport property and has a function of preventing an interaction between the electron-injection buffer layer and the p-type layer and transferring electrons smoothly. The LUMO level of the substance having an electron-transport property in the electron-relay layer is preferably between the LUMO level of the acceptor substance in the p-type layer and the LUMO level of the substance having an electron-transport property in the electron-transport layer in contact with the charge-generation layer. Specifically, the LUMO level of the substance having an electron-transport property in the electron-relay layer is preferably higher than or equal to −5.0 eV, further preferably higher than or equal to −5.0 eV and lower than or equal to −3.0 eV. Note that as the substance having an electron-transport property in the electron-relay layer, a phthalocyanine-based material or a metal complex having a metal-oxygen bond and an aromatic ligand is preferably used.

<Cap Layer>

Although not illustrated in FIGS. 2A to 2E, a cap layer may be provided over the second electrode 102 of the light-emitting device. For example, a material with a high refractive index can be used for the cap layer. When the cap layer is provided over the second electrode 102, extraction efficiency of light emitted from the second electrode 102 can be improved.

Specific examples of a material that can be used for the cap layer are 5,5'-diphenyl-2,2'-di-5H-[1]benzothieno[3,2-c]carbazole (abbreviation: BisBTc) and DBT3P-II.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic resin, polypropylene, polyester, polyvinyl fluoride, polyvinyl chloride, polyamide, polyimide, aramid, an epoxy resin, an inorganic vapor deposition film, and paper.

For fabrication of the light-emitting device of this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

Note that in this specification and the like, the terms "layer" and "film" can be interchanged with each other as appropriate.

The structures described in this embodiment can be used in combination with any of the structures described in the other embodiments as appropriate.

Embodiment 3

This embodiment will describe a light-emitting and light-receiving apparatus 700 as a specific example of a light-emitting apparatus of one embodiment of the present invention and an example of the fabrication method. Note that the light-emitting and light-receiving apparatus 700 includes both a light-emitting device and a light-receiving device, and can also be referred to as a light-emitting apparatus including a light-receiving device or a light-receiving apparatus including a light-emitting device. In addition, the light-emitting and light-receiving apparatus 700 can be used for a display portion of an electronic device or the like, and thus can also be referred to as a display panel or a display apparatus.

<Structure Example of Light-Emitting and Light-Receiving Apparatus 700>

Figure 3A:
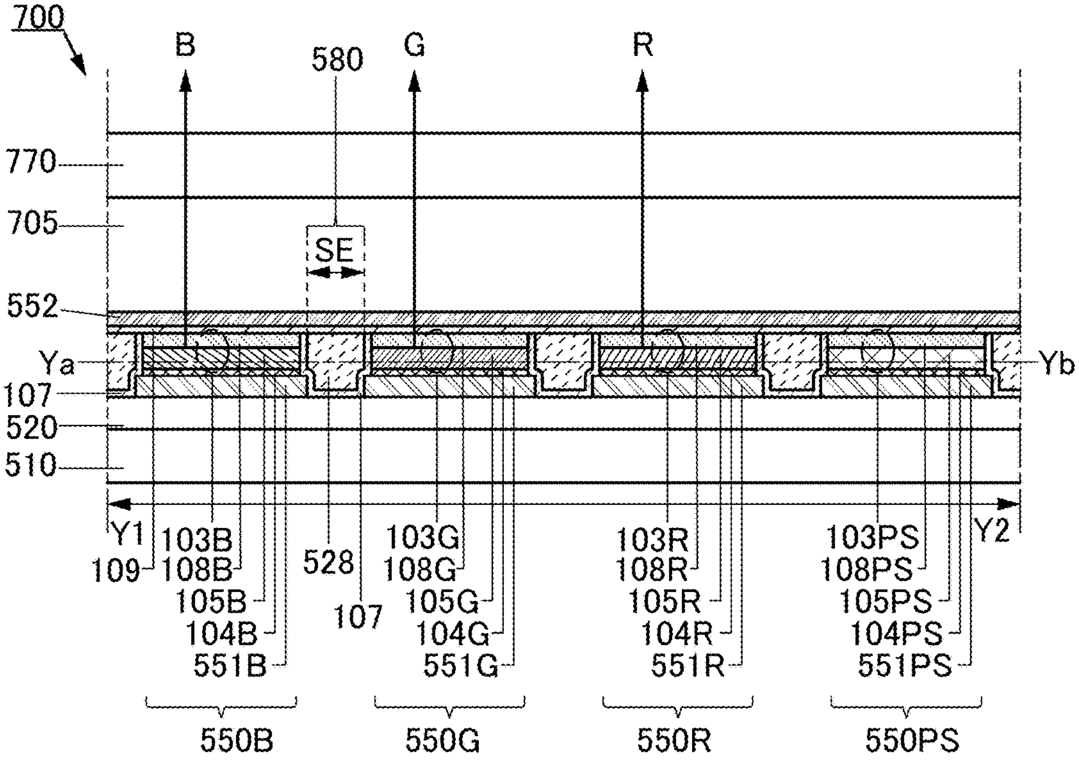
FIGS. 3A to 3D each illustrate a light-emitting apparatus of an embodiment.

The light-emitting and light-receiving apparatus 700 illustrated in FIG. 3A includes a light-emitting device 550B, a light-emitting device 550G, a light-emitting device 550R, and a light-receiving device 550PS that are formed over a functional layer 520 over a first substrate 510. The functional layer 520 includes, for example, driver circuits such as a gate driver and a source driver that are composed of a plurality of transistors, and wirings that electrically connect these circuits. Note that these driver circuits are electrically connected to the light-emitting device 550B, the light-emitting device 550G, the light-emitting device 550R, and the light-receiving device 550PS, for example, to drive them. The light-emitting and light-receiving apparatus 700 includes an insulating layer 705 over the functional layer 520 and the devices (the light-emitting devices and the light-receiving device), and the insulating layer 705 has a function of attaching a second substrate 770 and the functional layer 520.

The light-emitting devices 550B, 550G, and 550R each have the device structure described in Embodiment 2. In addition, the structure of the EL layer 103 (see FIG. 2A) differs between the light-emitting devices; for example, a light-emitting layer 105B of an EL layer 103B can emit blue light, a light-emitting layer 105G of an EL layer 103G can emit green light, and a light-emitting layer 105R of an EL layer 103R can emit red light.

Note that although in this embodiment, the case where the devices (a plurality of light-emitting devices and a light-receiving device) are formed separately is described, part of an EL layer of a light-emitting device (a hole-injection layer, a hole-transport layer, or an electron-transport layer) and part of an active layer of a light-receiving device (the hole-injection layer, the hole-transport layer, and the electron-transport layer) may be formed using the same material at the same time in the fabrication process.

In this specification and the like, a structure where light-emitting layers in light-emitting devices of different colors (for example, blue (B), green (G), and red (R)) and a light-receiving layer in a light-receiving device are separately formed or separately patterned is sometimes referred to as a side-by-side (SBS) structure. Although the light-emitting device 550B, the light-emitting device 550G, the light-emitting device 550R, and the light-receiving device 550PS are arranged in this order in the light-emitting and light-receiving apparatus 700 illustrated in FIG. 3A, one embodiment of the present invention is not limited to this structure.

In FIG. 3A, the light-emitting device 550B includes an electrode 551*i*, an electrode 552, and the EL layer 103B interposed between the electrode 551B and the electrode 552. The light-emitting device 550G includes an electrode 551G, the electrode 552, and the EL layer 103G interposed between the electrode 551G and the electrode 552. The light-emitting device 550R includes an electrode 551R, the electrode 552, and the EL layer 103R interposed between the electrode 551R and the electrode 552. The EL layers (103B, 103G, and 103R) each have a stacked-layer structure of layers having different functions including their respective light-emitting layers (105B, 105G, and 105R). Note that a specific structure of each layer of the light-emitting device is as described in Embodiment 2.

In FIG. 3A, the light-receiving device 550PS includes an electrode 551PS, the electrode 552, and a light-receiving layer 103PS provided between the electrode 551PS and the electrode 552. The light-receiving layer 103PS has a stacked-layer structure of layers having different functions including an active layer 105PS. The active layer 105PS contains a semiconductor. Examples of the semiconductor are inorganic semiconductors such as silicon and organic semiconductors such as organic compounds. Specific structures of other layers in the light-receiving device can be similar to the structures of the corresponding layers in the light-emitting device.

FIG. 3A illustrates a case where the EL layer 103B includes a hole-injection/transport layer 104B, the light-emitting layer 105B, an electron-transport layer 108B, and an electron-injection layer 109; the EL layer 103G includes a hole-injection/transport layer 104G, the light-emitting layer 105G, an electron-transport layer 108G, and the electron-injection layer 109; the EL layer 103R includes a hole-injection/transport layer 104R, the light-emitting layer 105R, an electron-transport layer 108R, and the electron-injection layer 109; and the light-receiving layer 103PS includes a hole-injection/transport layer 104PS, the active layer 105PS, an electron-transport layer 108PS, and the electron-injection layer 109. However, the present invention is not limited thereto.

In FIG. 3A, the electron-injection layer 109 and the electrode 552 are layers (common layers) shared by the devices (the light-emitting device 550B, the light-emitting device 550G, the light-emitting device 550R, and the light-receiving device 550PS).

Hereinafter, for simplicity, the light-emitting device 550B, the light-emitting device 550G, and the light-emitting device 550R are collectively referred to as a light-emitting device 550; the electrode 551B, the electrode 551G, and the electrode 551R are collectively referred to as an electrode 551; the EL layer 103B, the EL layer 103G, and the EL layer 103R are collectively referred to as an EL layer 103; the hole-injection/transport layer 104B, the hole-injection/transport layer 104G, and the hole-injection/transport layer 104R are collectively referred to as a hole-injection/transport layer 104; the light-emitting layer 105B, the light-emitting layer 105G, and the light-emitting layer 105R are collectively referred to as a light-emitting layer 105; and the electron-transport layer 108B, the electron-transport layer 108G, and the electron-transport layer 108R are collectively referred to as an electron-transport layer 108, in some cases.

As illustrated in FIG. 3A, an insulating layer 107 may be formed on side surfaces (or end portions) of the hole-injection/transport layer 104, the light-emitting layer 105, and the electron-transport layer 108 included in the EL layer 103, and side surfaces (or end portions) of the hole-injection/transport layer 104PS, the active layer 105PS, and the electron-transport layer 108PS included in the light-receiving layer 103PS. The insulating layer 107 is formed in contact with the side surfaces (or the end portions) of the EL layer 103 and the light-receiving layer 103PS. This can inhibit entry of oxygen, moisture, or constituent elements thereof into the inside through the side surfaces of the EL layer 103 and the light-receiving layer 103PS. Note that the insulating layer 107 continuously covers the side surfaces (or the end portions) of part of the EL layer 103 and part of the light-receiving layer 103PS of adjacent devices. For example, in FIG. 3A, the side surfaces of parts of the EL layer 103B of the light-emitting device 550B and the EL layer 103G of the light-emitting device 550G are covered with the continuous insulating layer 107.

As illustrated in FIG. 3A, a partition 528 is provided between the devices. Note that the electron-injection layer 109 and the electrode 552 that are common layers shared by the devices are provided continuously without being divided by the partition 528. Thus, it can be said that the partition 528 is provided in a region surrounded by the electron-injection layer 109 and the insulating layer 107. In addition, the partitions 528 are positioned along side surfaces (or end portions) of the electrode 551, part of the EL layer 103 (the hole-injection/transport layer 104, the light-emitting layer 105, and the electron-transport layer 108), and part of the light-receiving layer 103PS (the hole-injection/transport layer 104, the active layer 105PS, and the electron-transport layer 108) with the insulating layer 107 therebetween.

In each of the EL layer 103 and the light-receiving layer 103PS, particularly the hole-injection layer, which is included in the hole-transport region between the anode and the light-emitting layer and between the anode and the active layer, often has high conductivity; thus, a hole-injection layer formed as a layer shared by adjacent devices might cause crosstalk. Thus, as described in this structure example, part of the EL layer 103 (the hole-injection/transport layer 104, the light-emitting layer 105, and the electron-transport layer 108) and part of the light-receiving layer 103PS (the hole-injection/transport layer 104, the active layer 105PS, and the electron-transport layer 108) are separated, and the insulating layer 107 and the partition 528 are provided therebetween, so that crosstalk between adjacent devices can be inhibited.

Providing the partition 528 can flatten the surface by reducing a depressed portion formed between adjacent devices. When the depressed portion is reduced, disconnection of the electron-injection layer 109 and the electrode 552 formed over the EL layer 103 and the light-receiving layer 103PS can be inhibited.

For the insulating layer 107, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107. The insulating layer 107 can be formed by a sputtering method, a CVD method, an MBE method, a PLD method, an ALD method, or the like and is formed preferably by an ALD method, which achieves favorable coverage.

Examples of an insulating material used to form the partition 528 include organic materials such as an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Other examples include organic materials such as polyvinyl alcohol (PVA), polyvinyl butyral, polyvinyl pyrrolidone, polyethylene glycol, polyglycerin, pullulan, water-soluble cellulose, and alcohol-soluble polyamide resin. A photosensitive resin such as a photoresist can also be used. Examples of the photosensitive resin include positive-type materials and negative-type materials.

With the use of the photosensitive resin, the partition 528 can be fabricated by only light exposure and developing steps. The partition 528 may be fabricated using a negative photosensitive resin (e.g., a resist material). In the case where an insulating layer containing an organic material is used as the partition 528, a material absorbing visible light is suitably used. When such a material absorbing visible light is used for the partition 528, light emission from the EL layer can be absorbed by the partition 528, leading to a reduction in light leakage (stray light) to an adjacent EL layer or light-receiving layer. Thus, a light-emitting and light-receiving apparatus having high display quality can be provided.

For example, the difference between the top-surface level of the partition 528 and the top-surface level of the EL layer 103 or the light-receiving layer 103PS is preferably 0.5 times or less, further preferably 0.3 times or less the thickness of the partition 528. The partition 528 may be provided such that the top-surface level of the EL layer 103 or the light-receiving layer 103PS is higher than the top-surface level of the partition 528, for example. Alternatively, the partition 528 may be provided such that the top-surface level of the partition 528 is higher than the top-surface level of the light-emitting layer of the EL layer 103 or the active layer of the light-receiving layer 103PS, for example.

When crosstalk occurs between devices in a light-emitting and light-receiving apparatus with a high resolution exceeding 1000 ppi, a color gamut that the light-emitting and light-receiving apparatus can reproduce is narrowed. In a light-emitting and light-receiving apparatus with a high resolution of 1000 ppi or more, preferably 2000 ppi or more, further preferably 5000 ppi or more, the insulating layer 107 and the partition 528 are provided between part of the EL layer 103 (the hole-injection/transport layer 104, the light-emitting layer 105B, and the electron-transport layer 108) and part of the light-receiving layer 103PS (the hole-injection/transport layer 104, the active layer 105PS, and the electron-transport layer 108), whereby the light-emitting and light-receiving apparatus can display bright colors.

Figure 3B:
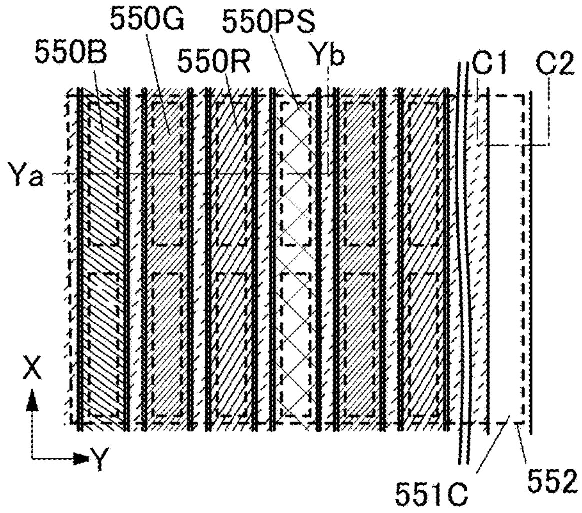
Figure 3C:
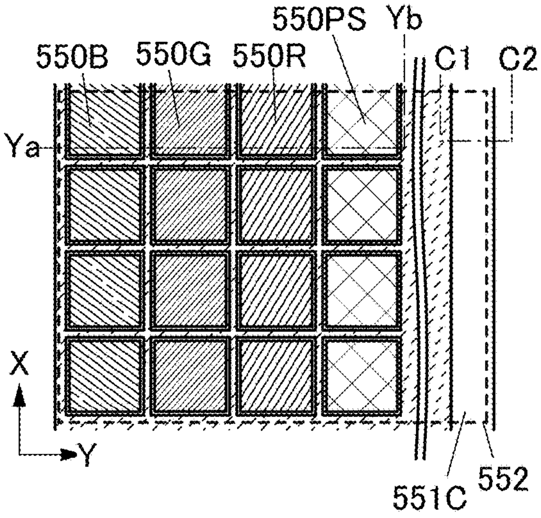

FIGS. 3B and 3C are each a schematic top view of the light-emitting and light-receiving apparatus 700 taken along the dashed-dotted line Ya-Yb in the cross-sectional view of FIG. 3A. That is, the devices are arranged in a matrix. Note that FIG. 3B illustrates what is called a stripe arrangement, in which the light-emitting devices of the same color or the light-receiving devices are arranged in the X-direction. FIG. 3C illustrates a structure where the light-emitting devices of the same color or the light-receiving devices are arranged in the X-direction and separated by patterning for each pixel. Note that the arrangement method of the light-emitting devices is not limited thereto; another method such as a delta, zigzag, PenTile, or diamond arrangement can also be used.

Note that part of the EL layer 103 (the hole-injection/transport layer 104, the light-emitting layer 105, and the electron-transport layer 108) and part of the light-receiving layer 103PS (the hole-injection/transport layer 104, the active layer 105PS, and the electron-transport layer 108) are processed by patterning using a lithography method for separation, so that a light-emitting and light-receiving apparatus (display panel) with a high resolution can be fabricated. End portions (side surfaces) of the layers of the EL layer 103 and the layers of the light-receiving layer 103PS processed by patterning using a photolithography method have substantially one surface (or are positioned on substantially the same plane). In this case, the widths (SE) of spaces 580 between the EL layers and between the EL layer and the light-receiving layer are each preferably 5 m or less, further preferably 1 μm or less.

Figure 3D:
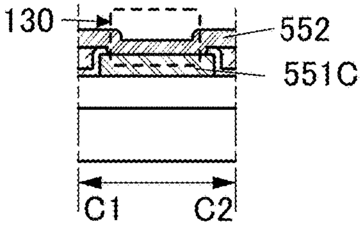

FIG. 3D is a schematic cross-sectional view taken along the dashed-dotted line C1-C2 in FIGS. 3B and 3C. FIG. 3D illustrates a connection portion 130 where a connection electrode 551C and the electrode 552 are electrically connected to each other. In the connection portion 130, the electrode 552 is provided over and in contact with the connection electrode 551C. The partition 528 is provided to cover an end portion of the connection electrode 551C.

<Fabrication Method Example of Light-Emitting and Light-Receiving Apparatus>

Figure 4A:
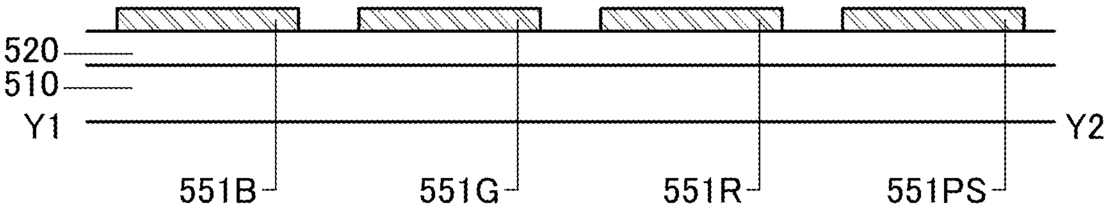
FIGS. 4A to 4C illustrate a fabrication method of a light-emitting apparatus of an embodiment.

The electrode 551B, the electrode 551G, the electrode 551R, and the electrode 551PS are formed as illustrated in FIG. 4A. For example, a conductive film is formed over the functional layer 520 over the first substrate 510 and processed into predetermined shapes by a photolithography method.

The conductive film can be formed by any of a sputtering method, a chemical vapor deposition (CVD) method, a molecular beam epitaxy (MBE) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a deposition method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for formation of an EL layer (a film made of an organic compound or a film partly including an organic compound).

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when light exposure is performed by scanning with a beam such as an electron beam.

For etching of a thin film using a resist mask, a dry etching method, a wet etching method, a sandblast method, or the like can be used.

Figure 4B:
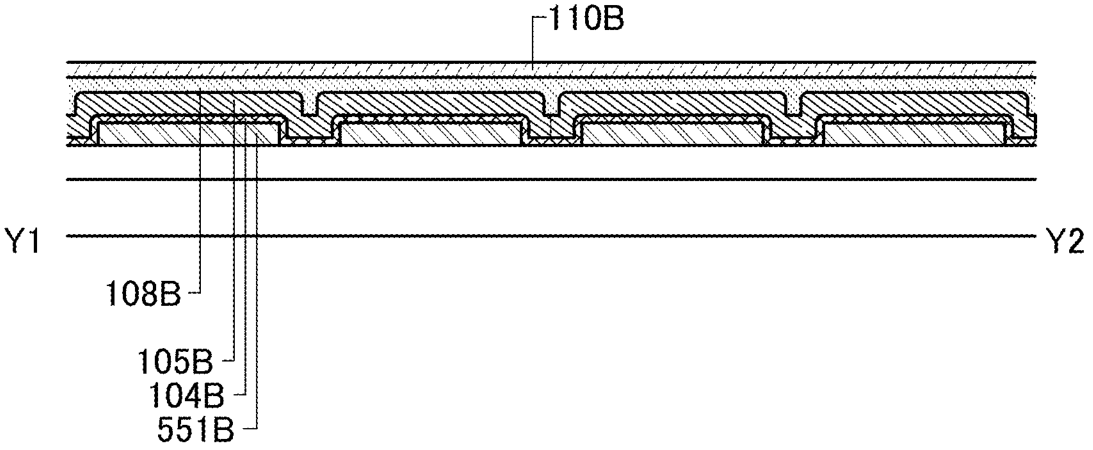

Subsequently, as illustrated in FIG. 4B, the hole-injection/transport layer 104B, the light-emitting layer 105B, and the electron-transport layer 108B are formed over the electrode 551*i*, the electrode 551G, the electrode 551R, and the electrode 551PS. Note that the hole-injection/transport layer 104B, the light-emitting layer 105B, and the electron-transport layer 108B can be formed using a vacuum evaporation method, for example. Furthermore, a sacrificial layer 110B is formed over the electron-transport layer 108B. For the formation of the hole-injection/transport layer 104B, the light-emitting layer 105B, and the electron-transport layer 108B, any of the materials described in Embodiments 1 and 2 can be used.

For the sacrificial layer 110B, it is preferable to use a film highly resistant to etching treatment performed on the hole-injection/transport layer 104B, the light-emitting layer 105B, and the electron-transport layer 108B, i.e., a film having high etching selectivity with respective to the hole-injection/transport layer 104B, the light-emitting layer 105B, and the electron-transport layer 108B. The sacrificial layer 110B preferably has a stacked-layer structure of a first sacrificial layer and a second sacrificial layer which have different etching selectivities. For the sacrificial layer 110B, it is possible to use a film that can be removed by a wet etching method, which causes less damage to the EL layer 103B. In wet etching, oxalic acid or the like can be used as an etching material. Note that in this specification and the like, a sacrificial layer may be called a mask layer.

For the sacrificial layer 110B, an inorganic film such as a metal film, an alloy film, a metal oxide film, a semiconductor film, or an inorganic insulating film can be used, for example. The sacrificial layer 110B can be formed by any of a variety of deposition methods such as a sputtering method, an evaporation method, a CVD method, and an ALD method.

For the sacrificial layer 110B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

A metal oxide such as indium gallium zinc oxide (also referred to as In—Ga—Zn oxide or IGZO) can be used for the sacrificial layer 110B. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

For the sacrificial layer 110B, an inorganic insulating material such as aluminum oxide, hafnium oxide, or silicon oxide can be used.

The sacrificial layer 110B is preferably formed using a material that can be dissolved in a solvent chemically stable with respect to at least the electron-transport layer 108B that is in the uppermost position. Specifically, a material that can be dissolved in water or alcohol can be suitably used for the sacrificial layer 110B. In formation of the sacrificial layer 110B, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the hole-injection/transport layer 104B, the light-emitting layer 105B, and the electron-transport layer 108B can be accordingly reduced.

In the case where the sacrificial layer 110B having a stacked-layer structure is formed, the stacked-layer structure can include the first sacrificial layer formed using any of the above-described materials and the second sacrificial layer thereover.

The second sacrificial layer in that case is a film used as a hard mask for etching of the first sacrificial layer. In processing the second sacrificial layer, the first sacrificial layer is exposed. Thus, the combination of films having high etching selectivity therebetween is selected for the first sacrificial layer and the second sacrificial layer. Thus, a film that can be used for the second sacrificial layer can be selected in accordance with the etching conditions of the first sacrificial layer and those of the second sacrificial layer.

For example, in the case where the second sacrificial layer is etched by dry etching involving a fluorine-containing gas (also referred to as a fluorine-based gas), the second sacrificial layer can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a film of a metal oxide such as IGZO or ITO can be given as an example of a film having a high etching selectivity to the second sacrificial layer (i.e., a film with a low etching rate) in the dry etching involving the fluorine-based gas, and can be used for the first sacrificial layer.

Note that the material for the second sacrificial layer is not limited to the above and can be selected from a variety of materials in accordance with the etching conditions of the first sacrificial layer and those of the second sacrificial layer. For example, any of the films that can be used for the first sacrificial layer can be used for the second sacrificial layer.

For the second sacrificial layer, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used for the second sacrificial layer. Typically, it is possible to use a film of an oxide or an oxynitride such as silicon oxide, silicon oxynitride, aluminum oxide, aluminum oxynitride, hafnium oxide, or hafnium oxynitride.

Figure 4C:
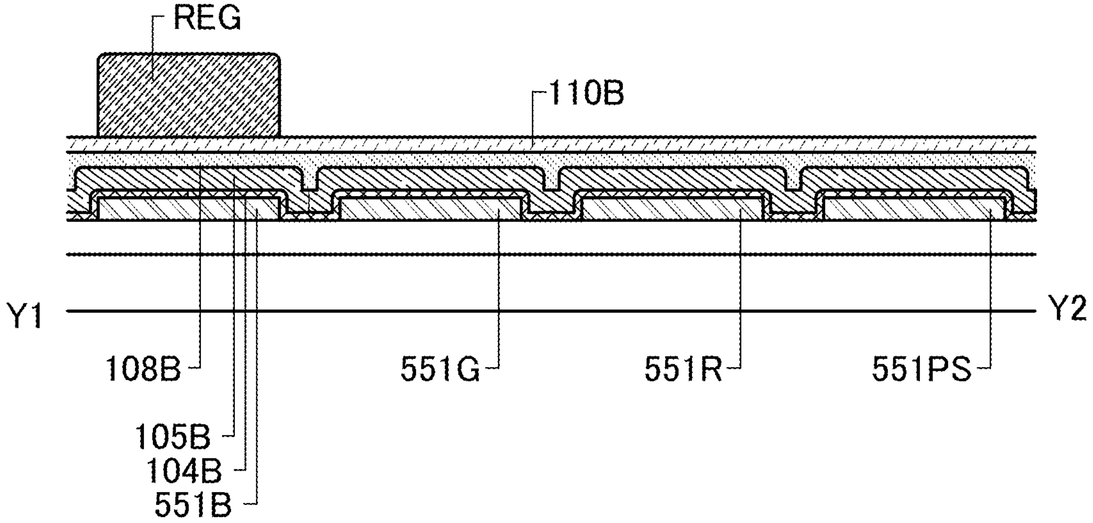

Next, as illustrated in FIG. 4C, a resist is applied onto the sacrificial layer 110*n*, and the resist having a desired shape (a resist mask REG) is formed by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures.

Figure 5A:
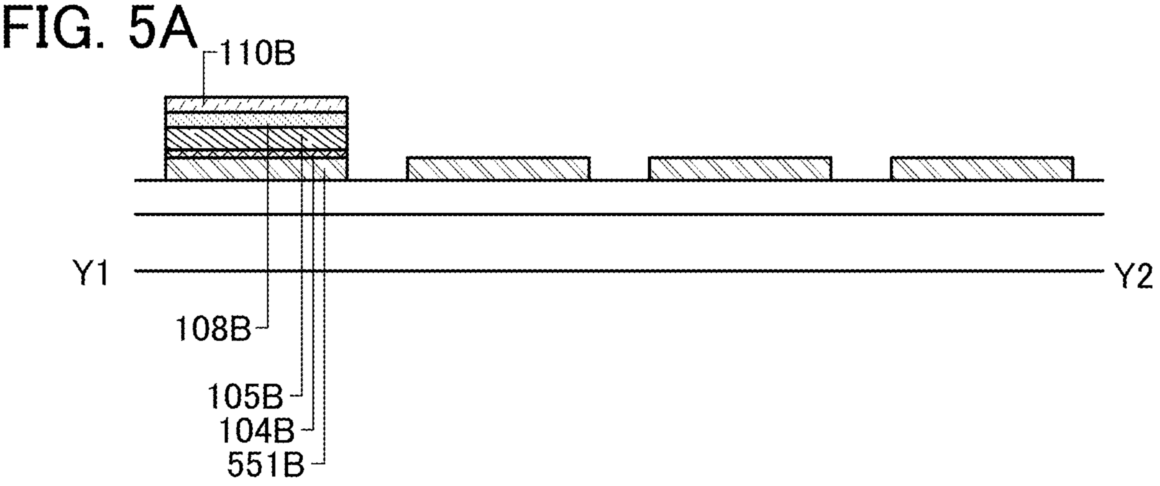
FIGS. 5A to 5C illustrate a fabrication method of a light-emitting apparatus of an embodiment.

Next, part of the sacrificial layer 110B that is not covered with the resist mask REG is removed by etching using the resist mask REG, the resist mask REG is removed, and then the hole-injection/transport layer 104B, the light-emitting layer 105B, and the electron-transport layer 108B that are not covered with the sacrificial layer 110B are removed by etching, so that the hole-injection/transport layer 104B, the light-emitting layer 105B, and the electron-transport layer 108B are processed to have side surfaces (or have their side surfaces exposed) over the electrode 551B or have belt-like shapes extending in the direction intersecting the sheet of the diagram. Note that dry etching is preferably employed for the etching. Note that in the case where the sacrificial layer 110B has the aforementioned stacked-layer structure of the first sacrificial layer and the second sacrificial layer, the hole-injection/transport layer 104B, the light-emitting layer 105B, and the electron-transport layer 108B may be processed into a predetermined shape in the following manner: part of the second sacrificial layer is etched using the resist mask REG, the resist mask REG is then removed, and part of the first sacrificial layer is etched using the second sacrificial layer as a mask. The structure illustrated in FIG. 5A is obtained through these etching steps.

Figure 5B:
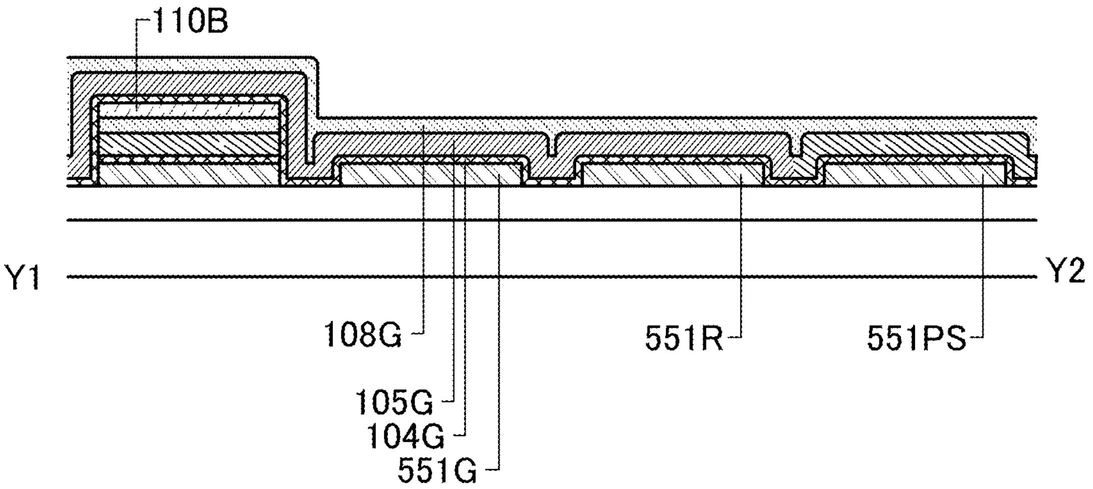

Subsequently, as illustrated in FIG. 5B, the hole-injection/transport layer 104G, the light-emitting layer 105G, and the electron-transport layer 108G are formed over the sacrificial layer 110B, the electrode 551G, the electrode 551R, and the electrode 551PS. The hole-injection/transport layer 104G, the light-emitting layer 105G, and the electron-transport layer 108G can be formed using any of the materials described in Embodiments 1 and 2. Note that the hole-injection/transport layer 104G, the light-emitting layer 105G, and the electron-transport layer 108G can be formed by a vacuum evaporation method, for example.

Figure 5C:
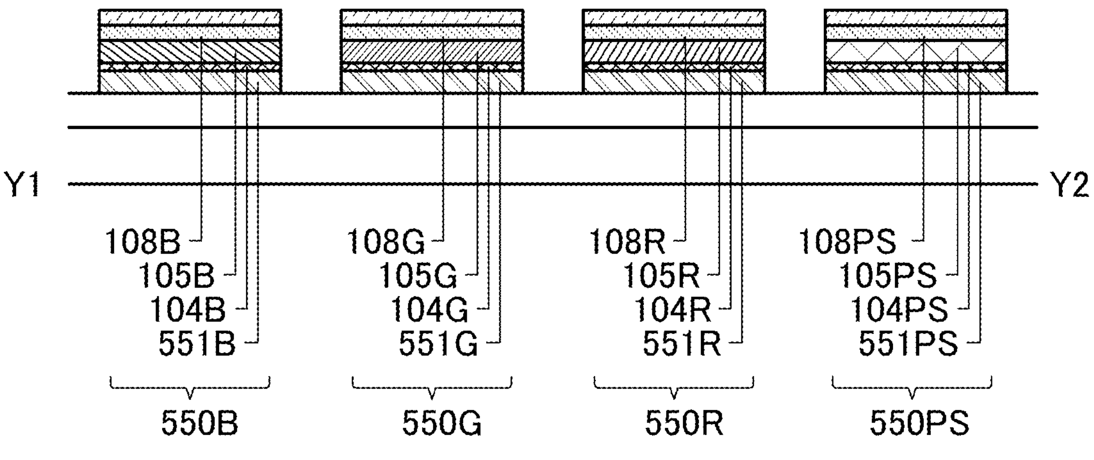

Hereinafter, in a manner similar to formation of the hole-injection/transport layer 104B, the light-emitting layer 105B, the electron-transport layer 108B, and the sacrificial layer 110B, the hole-injection/transport layer 104G, the light-emitting layer 105G, the electron-transport layer 108G, and a sacrificial layer 110G are formed over the electrode 551G, the hole-injection/transport layer 104R, the light-emitting layer 105R, the electron-transport layer 108R, and a sacrificial layer 110R are formed over the electrode 551R, and the hole-injection/transport layer 104PS, the active layer 105PS, the electron-transport layer 108PS, and a sacrificial layer 110PS are formed over the electrode 551PS, whereby the shape illustrated in FIG. 5C is obtained.

Figure 6A:
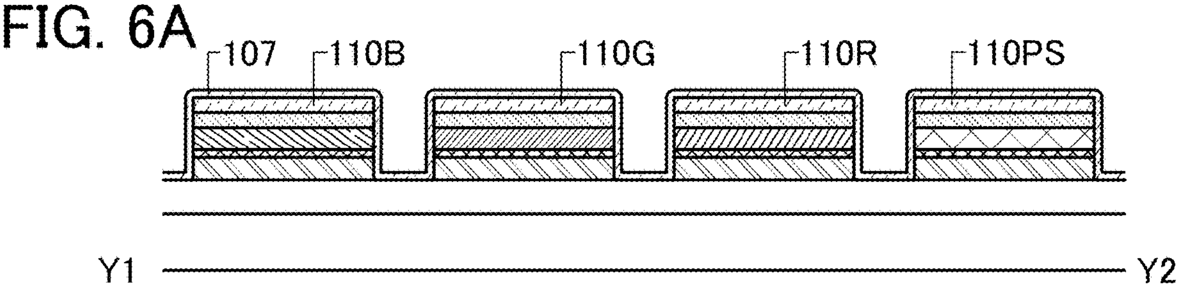
FIGS. 6A to 6D illustrate a fabrication method of a light-emitting apparatus of an embodiment.

Next, as illustrated in FIG. 6A, the insulating layer 107 is formed over the sacrificial layers 110B, 110G, 110R, and 110PS.

Note that the insulating layer 107 can be formed by an ALD method, for example. In this case, as illustrated in FIG. 6A, the insulating layer 107 is formed to be in contact with the side surfaces (end portions) of the hole-injection/transport layers (104B, 104G, 104R, and 104PS), the light-emitting layers (105B, 105G, and 105R), the active layer 105PS, and the electron-transport layers (108B, 108G, 108R, and 108PS) of the devices. This can inhibit entry of oxygen, moisture, or constituent elements thereof into the inside through the side surfaces of the layers.

Figure 6B:
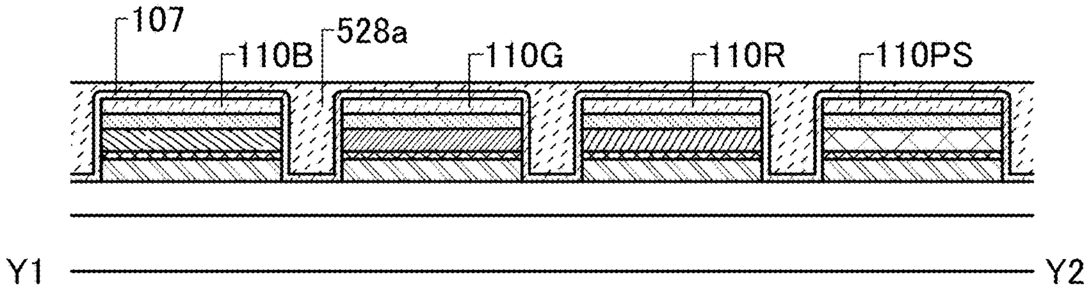

Next, as illustrated in FIG. 6B, a resin film 528*a* is formed over the insulating layer 107. As the resin film 528*a*, for example, a negative photosensitive resin or a positive photosensitive resin can be used.

Figure 6C:
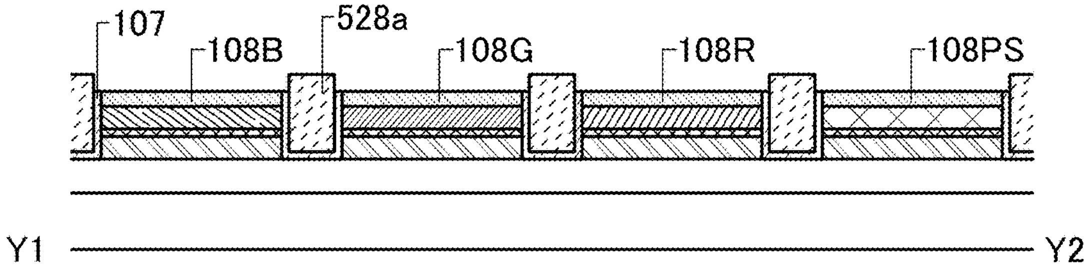

Then, as illustrated in FIG. 6C, part of the resin film 528*a*, part of the insulating layer 107, and the sacrificial layers (110B, 110G, 110R, and 110PS) are removed to expose the top surfaces of the electron-transport layers (108B, 108G, 108R, and 108PS).

Figure 6D:
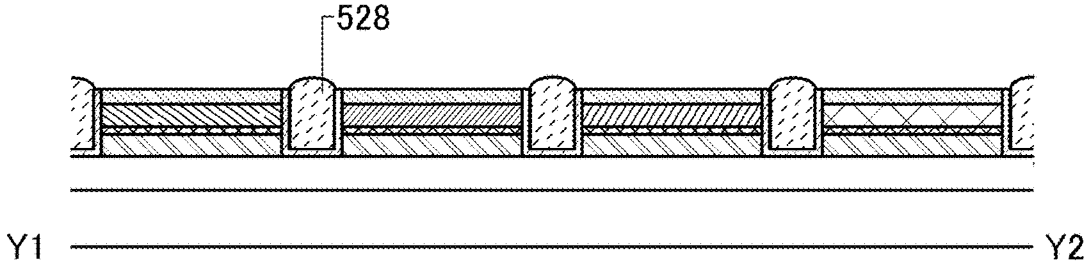

Next, heat treatment is performed to process an upper edge portion of the resin film 528*a* into a curved shape, so that the partition 528 is formed, as illustrated in FIG. 6D. When the upper edge portion of the partition 528 has a curved shape, the coverage with the electron-injection layer 109 to be formed later can be favorable. For example, in the case of using a positive photosensitive acrylic resin as a material for the resin film 528*a*, the partition 528 is preferably formed so as to have a curved surface with a curvature radius (0.2 μm to 3 μm) at the upper edge portion.

Next, the electron-injection layer 109 is formed over the insulating layer 107, the electron-transport layers (108B, 108G, 108R, and 108PS), and the partition 528. The electron-injection layer 109 can be formed using any of the materials described in Embodiment 2. The electron-injection layer 109 is formed by a vacuum evaporation method, for example.

Figure 7A:
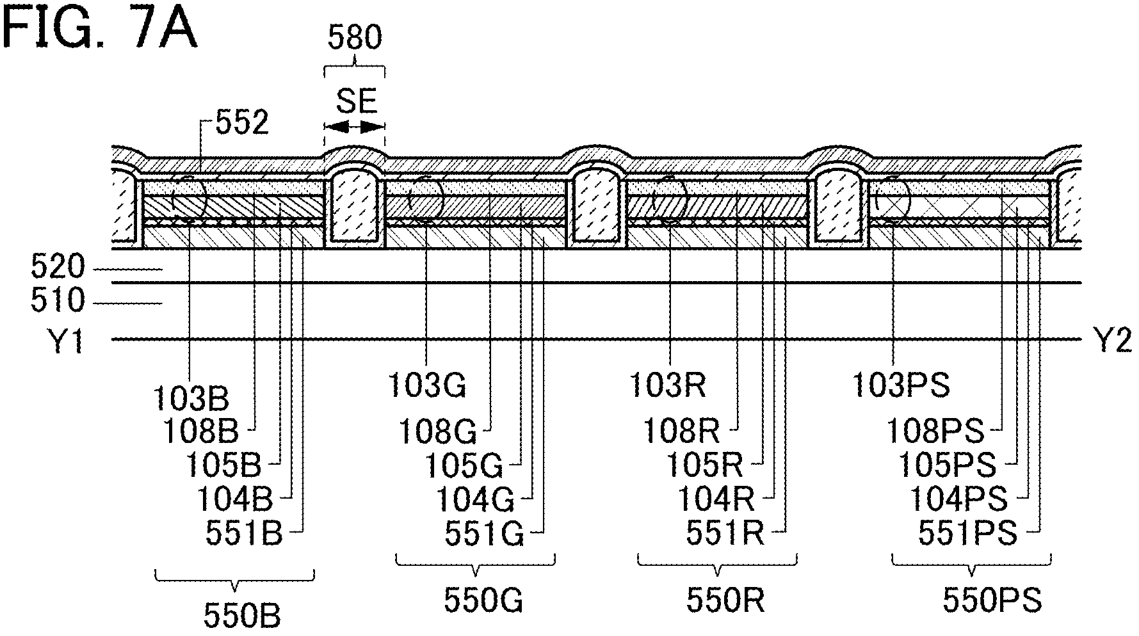
FIGS. 7A to 7C each illustrate a light-emitting apparatus of an embodiment.

Next, as illustrated in FIG. 7A, the electrode 552 is formed over the electron-injection layer 109. The electrode 552 is formed by a vacuum evaporation method, for example.

Through the above steps, the EL layer 103B, the EL layer 103G, the EL layer 103R, and the light-receiving layer 103PS in the light-emitting device 550B, the light-emitting device 550G, the light-emitting device 550R, and the light-receiving device 550PS can be processed to be separated from each other.

Figure 7B:
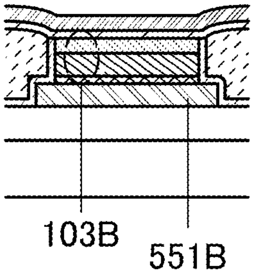
Figure 7C:
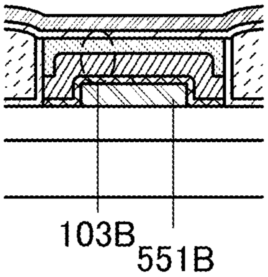

Note that pattern formation by a photolithography method is performed in separate processing of part of the EL layer 103 and the light-receiving layer 103PS, so that a light-emitting and light-receiving apparatus (display panel) with a high resolution can be fabricated. End portions (side surfaces) of the layers of the EL layer and the light-receiving layer processed by patterning using a photolithography method have substantially one surface (or are positioned on substantially the same plane). The pattern formation using a photolithography method can inhibit crosstalk between adjacent light-emitting devices and between the light-emitting device and the light-receiving device. In addition, the space 580 is provided between adjacent devices processed by patterning using a photolithography method. In FIG. 7C, when the space 580 is denoted by a distance SE between the EL layers of adjacent light-emitting devices, decreasing the distance SE can increase the aperture ratio and the resolution. By contrast, as the distance SE is increased, the effect of the difference in the fabrication process between the adjacent light-emitting devices becomes permissible, which leads to an increase in manufacturing yield. Since the light-emitting device fabricated according to this specification is suitable for a miniaturization process, the distance SE between the EL layers of adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure. Since a light-emitting and light-receiving apparatus having the MML structure is formed without using a metal mask, the pixel arrangement, the pixel shape, and the like can be designed more flexibly than in a light-emitting and light-receiving apparatus having the FMM structure or the MM structure.

Note that the island-shaped EL layers of the light-emitting and light-receiving apparatus having the MML structure are formed by not patterning using a metal mask but processing after formation of an EL layer. Thus, a light-emitting and light-receiving apparatus with a higher resolution or a higher aperture ratio than a conventional one can be achieved. Moreover, EL layers can be formed separately for each color, which enables extremely clear images; thus, a light-emitting and light-receiving apparatus with a high contrast and high display quality can be achieved. Furthermore, provision of a sacrifice layer over an EL layer can reduce damage on the EL layer during the fabrication process and increase the reliability of the light-emitting device.

In FIG. 3A and FIG. 7A, the width of the EL layer 103 is substantially equal to that of the electrode 551 in the light-emitting device 550, and the width of the light-receiving layer 103PS is substantially equal to that of the electrode 551PS in the light-receiving device 550PS; however, one embodiment of the present invention is not limited thereto.

In the light-emitting device 550, the width of the EL layer 103 may be smaller than that of the electrode 551. In the light-receiving device 550PS, the width of the light-receiving layer 103PS may be smaller than that of the electrode 551PS. FIG. 7B illustrates an example where the width of the EL layer 103B is smaller than that of the electrode 551B in the light-emitting device 550B.

In the light-emitting device 550, the width of the light-emitting layer 103 may be larger than that of the electrode 551. In the light-receiving device 550PS, the width of the light-receiving layer 103PS may be larger than that of the electrode 551PS. FIG. 7C illustrates an example where the width of the EL layer 103R is larger than that of the electrode 551R in the light-emitting device 550R.

The structures described in this embodiment can be used in combination with any of the structures described in the other embodiments as appropriate.

Embodiment 4

In this embodiment, an apparatus 720 is described with reference to FIGS. 8A to 8F and FIGS. 9A and 9B. The apparatus 720 illustrated in FIGS. 8A to 8F and FIGS. 9A and 9B includes any of the light-emitting devices described in Embodiments 1 and 2 and therefore is a light-emitting apparatus. Furthermore, the apparatus 720 can be used in a display portion of an electronic device or the like and therefore can also be referred to as a display panel or a display apparatus. Moreover, when the apparatus 720 includes the light-emitting device as a light source and a light-receiving device that can receive light from the light-emitting device, the apparatus 720 can be referred to as a light-emitting and light-receiving apparatus. Note that the light-emitting apparatus, the display panel, the display apparatus, and the light-emitting and light-receiving apparatus each include at least a light-emitting device.

Furthermore, the light-emitting apparatus, the display panel, the display apparatus, and the light-emitting and light-receiving apparatus of this embodiment can each have high definition or a large size. Therefore, the light-emitting apparatus, the display panel, the display apparatus, and the light-emitting and light-receiving apparatus of this embodiment can be used, for example, in display portions of electronic devices such as a digital camera, a digital video camera, a digital photo frame, a mobile phone, a portable game console, a smart phone, a wristwatch terminal, a tablet terminal, a portable information terminal, and an audio reproducing apparatus, in addition to display portions of electronic devices with a relatively large screen, such as a television device, a desktop or laptop personal computer, a monitor of a computer or the like, digital signage, and a large game machine such as a pachinko machine.

Figure 8A:
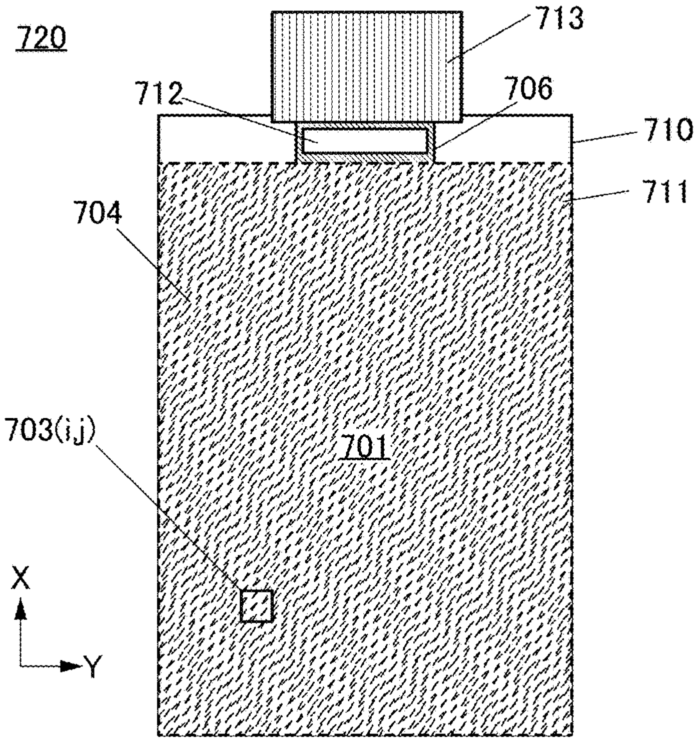
FIGS. 8A to 8F each illustrate a light-emitting apparatus of an embodiment.

FIG. 8A is a top view of the apparatus 720.

Figure 8B:
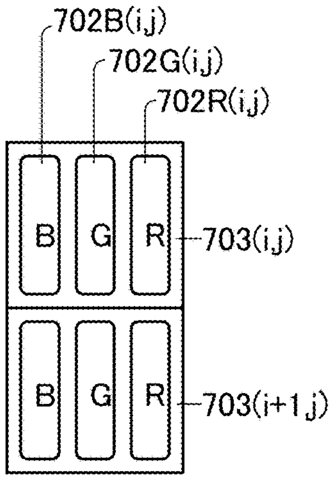

In FIG. 8A, the apparatus 720 has a structure in which a substrate 710 and a substrate 711 are attached to each other. In addition, the apparatus 720 includes a display region 701, a circuit 704, a wiring 706, and the like. Note that the display region 701 includes a plurality of pixels. As illustrated in FIG. 8B, a pixel 703(*i,j*) illustrated in FIG. 8A and a pixel 703(*i*+1, j) are adjacent to each other.

Furthermore, in the example of the apparatus 720 illustrated in FIG. 8A, the substrate 710 is provided with an integrated circuit (IC) 712 by a chip on glass (COG) method, a chip on film (COF) method, or the like. As the IC 712, an IC including a scan line driver circuit, a signal line driver circuit, or the like can be used, for example. In the example illustrated in FIG. 8A, an IC including a signal line driver circuit is used as the IC 712, and a scan line driver circuit is used as the circuit 704.

The wiring 706 has a function of supplying signals and power to the display region 701 and the circuit 704. The signals and power are input to the wiring 706 from the outside through a flexible printed circuit (FPC) 713 or to the wiring 706 from the IC 712. Note that the apparatus 720 is not necessarily provided with the IC. The IC may be mounted on the FPC by a COF method or the like.

FIG. 8B illustrates the pixel 703(*i,j*) and the pixel 703(*i*+1, j) of the display region 701. A plurality of kinds of subpixels including light-emitting devices that emit light of different colors can be included in the pixel 703(*i,j*). Alternatively, a plurality of subpixels including light-emitting devices that emit light of the same color may be included in addition to the above-described subpixels. For example, three kinds of subpixels can be included. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example. Specifically, the pixel 703(*i,j*) can consist of a subpixel 702B(i,j) for blue display, a subpixel 702G(i,j) for green display, and a subpixel 702R(i,j) for red display.

Other than the subpixels including the light-emitting devices, a subpixel including a light-receiving device may also be provided. In the case where the subpixel includes a light-receiving device, the apparatus 720 is also referred to as a light-emitting and light-receiving apparatus.

Figure 8C:
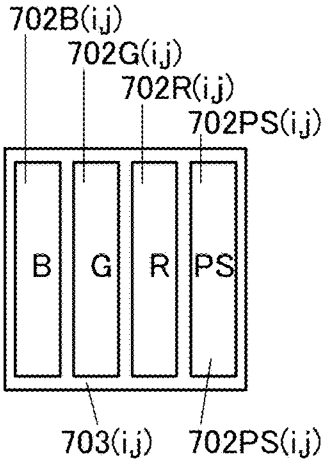
Figure 8D:
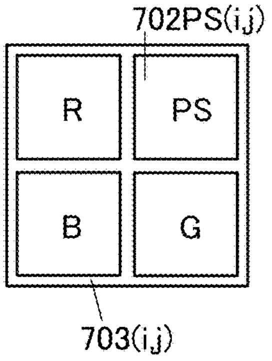
Figure 8E:
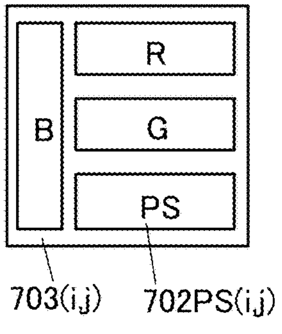

FIGS. 8C to 8F illustrate various layout examples of the pixel 703(*i,j*) including a subpixel 702PS(i,j) including a light-receiving device. The pixel arrangement in FIG. 8C is stripe arrangement, and the pixel arrangement in FIG. 8D is matrix arrangement. The pixel arrangement in FIG. 8E has a structure where three subpixels (the subpixels R, G, and PS) are vertically arranged next to one subpixel (the subpixel B).

Figure 8F:
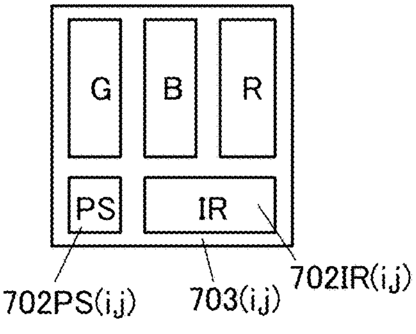

Furthermore, as illustrated in FIG. 8F, a subpixel 702IR (i,j) that emits infrared rays may be added to any of the above-described sets of subpixels in the pixel 703(*i,j*). In the pixel arrangement in FIG. 8F, the vertically oriented three subpixels G, B, and R are arranged laterally, and the subpixel PS and the horizontally oriented subpixel IR are arranged laterally below the three subpixels. Specifically, the subpixel 702IR(i,j) that emits light including light with a wavelength ranging from 650 nm to 1000 nm, inclusive, may be used in the pixel 703(*i,j*). Note that the wavelength of light detected by the subpixel 702PS(i,j) is not particularly limited; however, the light-receiving device included in the subpixel 702PS(i,j) preferably has sensitivity to light emitted by the light-emitting device included in the subpixel 702R(i,j), the subpixel 702G(i,j), the subpixel 702B(i,j), or the subpixel 702IR(i,j). For example, the light-receiving device preferably detects one or more kinds of light in blue, violet, bluish violet, green, yellowish green, yellow, orange, red, and infrared wavelength ranges, for example.

Note that the arrangement of subpixels is not limited to the structures illustrated in FIGS. 8B to 8F and a variety of arrangement methods can be employed. The arrangement of subpixels may be stripe arrangement, S stripe arrangement, matrix arrangement, delta arrangement, Bayer arrangement, or PenTile arrangement, for example.

Furthermore, top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. The top surface shape of a subpixel herein refers to a top surface shape of a light-emitting region of a light-emitting device.

In the case where not only a light-emitting device but also a light-receiving device is included in a pixel, the pixel has a light-receiving function and thus can detect a contact or approach of an object while displaying an image. For example, an image can be displayed by using all the subpixels included in a light-emitting apparatus; or light can be emitted by some of the subpixels as a light source and an image can be displayed by using the remaining subpixels.

Note that the light-receiving area of the subpixel 702PS (i,j) is preferably smaller than the light-emitting areas of the other subpixels. A smaller light-receiving area leads to a narrower image-capturing range, inhibits a blur in a captured image, and improves the definition. Thus, by using the subpixel 702PS(i,j), high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel 702PS(i,j).

Moreover, the subpixel 702PS(i,j) can be used in a touch sensor (also referred to as a direct touch sensor), a near touch sensor (also referred to as a hover sensor, a hover touch sensor, a contactless sensor, or a touchless sensor), or the like. For example, the subpixel 702PS(i,j) preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the light-emitting and light-receiving apparatus and the object come in direct contact with each other. Furthermore, the near touch sensor can detect the object even when the object is not in contact with the light-emitting and light-receiving apparatus. For example, the light-emitting and light-receiving apparatus can preferably detect the object when the distance between the light-emitting and light-receiving apparatus and the object is more than or equal to 0.1 mm and less than or equal to 300 mm, preferably more than or equal to 3 mm and less than or equal to 50 mm. With this structure, the light-emitting and light-receiving apparatus can be controlled without the object directly contacting with the light-emitting and light-receiving apparatus. In other words, the light-emitting and light-receiving apparatus can be controlled in a contactless (touchless) manner. With the above-described structure, the light-emitting and light-receiving apparatus can be controlled with a reduced risk of being dirty or damaged, or without direct contact between the object and a dirt (e.g., dust, bacteria, or a virus) attached to the light-emitting and light-receiving apparatus.

In the case where the subpixel 702PS(i,j) is used for high-resolution image capturing, the subpixel 702PS(i,j) is preferably provided in every pixel. Meanwhile, in the case where the subpixel 702PS(i,j) is used in a touch sensor, a near touch sensor, or the like, high accuracy is not required as compared to the case of capturing an image of a fingerprint or the like; accordingly, the subpixel 702PS(i,j) is provided in some subpixels. When the number of subpixels 702PS(i,j) is smaller than the number of subpixels 702R(i,j) or the like, higher detection speed can be achieved.

Figure 9A:
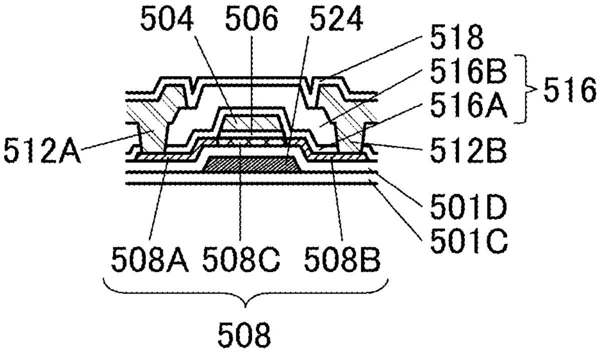
FIGS. 9A and 9B illustrate a light-emitting apparatus of an embodiment.

FIG. 9A illustrates an example of a specific structure of a transistor that can be used in the pixel circuit of the subpixel including the light-emitting device. As the transistor, a bottom-gate transistor, a top-gate transistor, or the like can be used as appropriate.

The transistor illustrated in FIG. 9A includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a gate electrode.

The insulating film 506 includes a region interposed between the semiconductor film 508 and the conductive film 504. The insulating film 506 has a function of a first gate insulating film.

The conductive film 512A has one of a function of a source electrode and a function of a drain electrode, and the conductive film 512B has the other thereof.

A conductive film 524 can be used in the transistor. The semiconductor film 508 is interposed between the conductive film 504 and a region included in the conductive film 524. The conductive film 524 has a function of a second gate electrode. An insulating film 501D is interposed between the semiconductor film 508 and the conductive film 524 and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516, for example.

For the insulating film 518, a material that has a function of inhibiting diffusion of oxygen, hydrogen, water, an alkali metal, an alkaline earth metal, and the like is preferably used. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that in a step of forming the semiconductor film used in the transistor of the pixel circuit, the semiconductor film used in the transistor of the driver circuit can be formed. A semiconductor film having the same composition as the semiconductor film used in the transistor of the pixel circuit can be used in the driver circuit, for example.

The semiconductor film 508 preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

In particular, an oxide containing In, Ga, and Zn (also referred to as IGZO) is preferably used as the semiconductor film 508. Alternatively, it is preferable to use an oxide containing In, Sn, and Zn. Further alternatively, it is preferable to use an oxide containing In, Ga, Sn, and Zn. Further alternatively, it is preferable to use an oxide containing In, Al, and Zn (also referred to as IAZO). Further alternatively, it is preferable to use an oxide containing In, Al, Ga, and Zn (also referred to as IAGZO).

When the semiconductor film is an In-M-Zn oxide, the atomic proportion of In is preferably greater than or equal to the atomic proportion of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of transistor characteristics can be inhibited.

In the case of using a metal oxide for the semiconductor film 508, the apparatus 720 includes a light-emitting device including a metal oxide in its semiconductor film and having a metal maskless (MML) structure. With this structure, the leakage current that might flow through the transistor and the leakage current that might flow between adjacent light-emitting devices (also referred to as a lateral leakage current, a side leakage current, or the like) can be extremely low. With the structure, a viewer can observe any one or more of the image crispness, the image sharpness, a high chroma, and a high contrast ratio in an image displayed on the display apparatus. When the leakage current that might flow through the transistor and the lateral leakage current that might flow between light-emitting devices are extremely low, display with little leakage of light at the time of black display (what is called black floating) (such display is also referred to as deep black display) can be achieved.

Alternatively, silicon may be used for the semiconductor film 508. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics.

With the use of transistors using silicon such as LTPS transistors, a circuit required to be driven at a high frequency (e.g., a source driver circuit) can be formed on the same substrate as the display portion. This allows simplification of an external circuit mounted on the light-emitting apparatus and a reduction in component costs and component-mounting costs.

The structure of the transistors used in the display panel may be selected as appropriate depending on the size of the screen of the display panel. For example, single crystal Si transistors can be used in the display panel with a screen diagonal greater than or equal to 0.1 inches and less than or equal to 3 inches. In addition, LTPS transistors can be used in the display panel with a screen diagonal greater than or equal to 0.1 inches and less than or equal to 30 inches, preferably greater than or equal to 1 inch and less than or equal to 30 inches. In addition, an LTPO structure (where an LTPS transistor and an OS transistor are used in combination) can be used in the display panel with a screen diagonal greater than or equal to 0.1 inches and less than or equal to 50 inches, preferably greater than or equal to 1 inch and less than or equal to 50 inches. In addition, OS transistors (transistors including a metal oxide in a semiconductor where a channel is formed) can be used in the display panel with a screen diagonal greater than or equal to 0.1 inches and less than or equal to 200 inches, preferably greater than or equal to 50 inches and less than or equal to 100 inches.

With the use of single crystal Si transistors, an increase in screen size is extremely difficult due to the size of a single crystal Si substrate. Furthermore, since a laser crystallization apparatus is used in the manufacturing process, LTPS transistors are unlikely to respond to an increase in screen size (typically to a screen diagonal greater than 30 inches). By contrast, since the manufacturing process does not necessarily require a laser crystallization apparatus or the like or can be performed at a relatively low temperature (typically, lower than or equal to 450° C.), OS transistors can be applied to a display panel with a relatively large area (typically, a screen diagonal greater than or equal to 50 inches and less than or equal to 100 inches). In addition, LTPO can be applied to a display panel with a size (typically, a screen diagonal greater than or equal to 1 inch and less than or equal to 50 inches) midway between the structure using LTPS transistors and the structure using OS transistors.

Figure 9B:
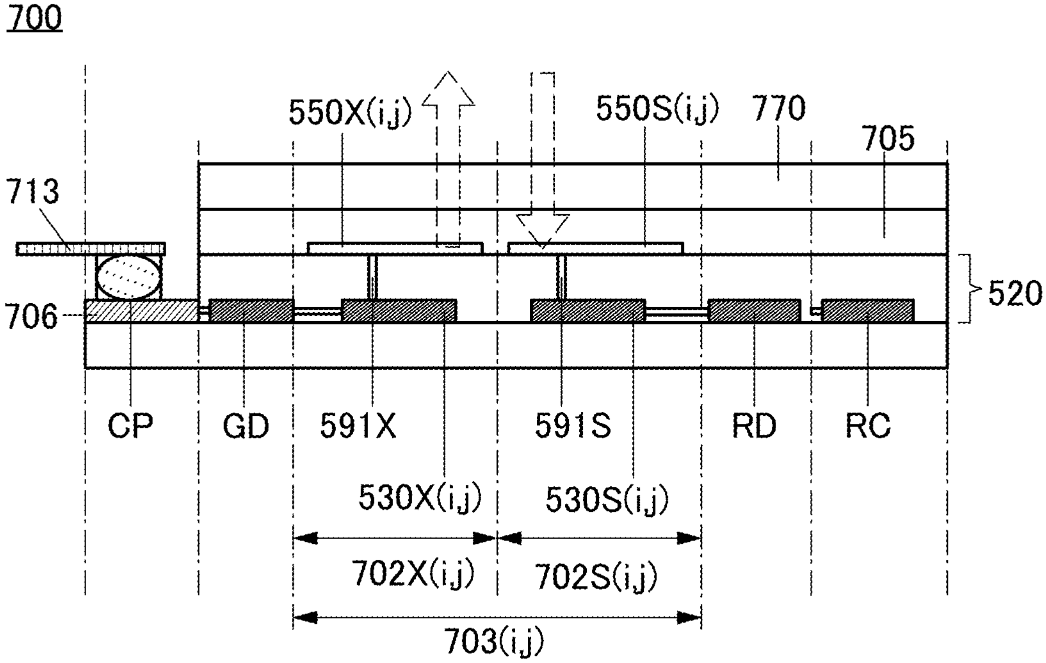

Next, a cross-sectional view of a light-emitting and light-receiving apparatus is shown. FIG. 9B is a cross-sectional view of the light-emitting and light-receiving apparatus illustrated in FIG. 8A.

FIG. 9B is a cross-sectional view of part of a region including the FPC 713 and the wiring 706 and part of the display region 701 including the pixel 703(*i,j*).

In FIG. 9B, the light-emitting and light-receiving apparatus 700 includes the functional layer 520 between the first substrate 510 and the second substrate 770. The functional layer 520 includes, as well as the above-described transistors, the capacitors, and the like, wirings electrically connected to these components, for example. Although the functional layer 520 includes a pixel circuit 530X(i,j), a pixel circuit 530S(i,j), and a circuit GD in FIG. 9B, one embodiment of the present invention is not limited thereto.

Furthermore, each pixel circuit (e.g., the pixel circuit 530X(i,j) and the pixel circuit 530S(i,j) in FIG. 9B) included in the functional layer 520 is electrically connected to a light-emitting device and a light-receiving device (e.g., a light-emitting device 550X(i,j) and a light-receiving device 550S(i,j) in FIG. 9B) formed over the functional layer 520. Specifically, the light-emitting device 550X(i,j) is electrically connected to the pixel circuit 530X(i,j) through a wiring 591X, and the light-receiving device 550S(i,j) is electrically connected to the pixel circuit 530S(i,j) through a wiring 591S. The insulating layer 705 is provided over the functional layer 520, the light-emitting devices, and the light-receiving device, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting and light-receiving apparatus of one embodiment of the present invention can be used as a touch panel.

The structures described in this embodiment can be used in appropriate combination with any of the structures described in the other embodiments.

Embodiment 5

This embodiment will describe structures of electronic devices of embodiments of the present invention with reference to FIGS. 10A to 10E, FIGS. 11A to 11E, and FIGS. 12A and 12B.

Figure 10A:
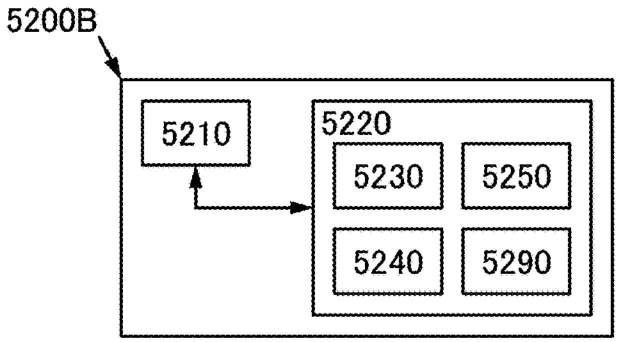
FIGS. 10A to 10E illustrate electronic devices of an embodiment.
Figure 10B:
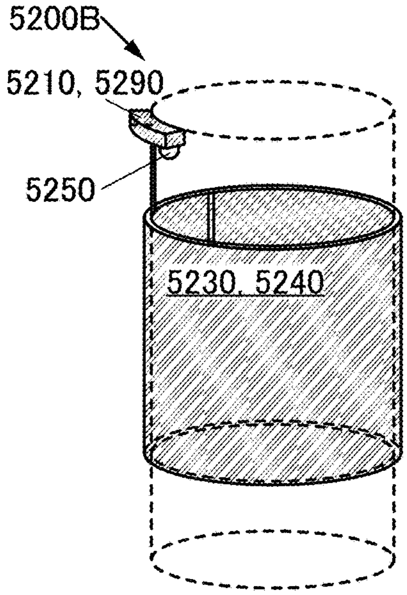
Figure 10C:
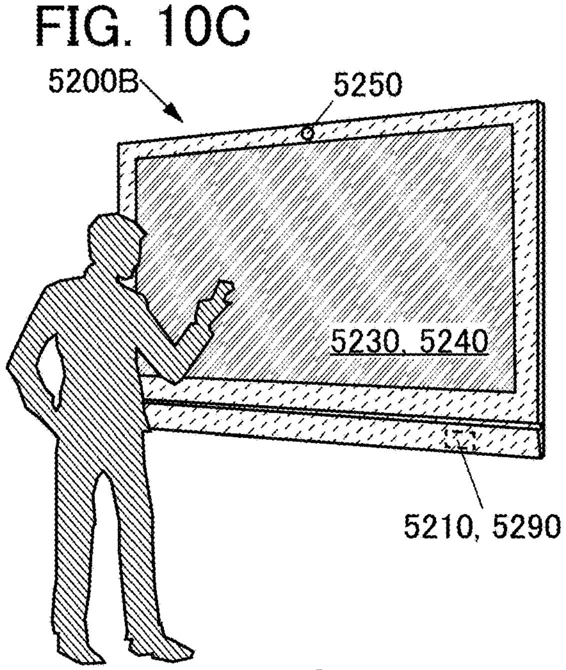
Figure 10D:
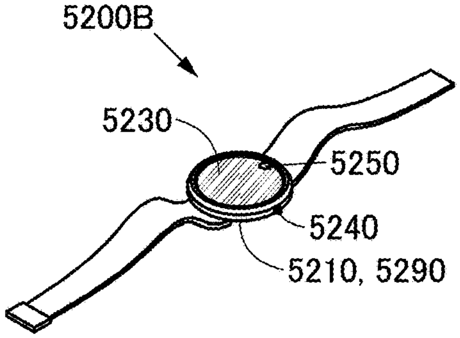
Figure 10E:
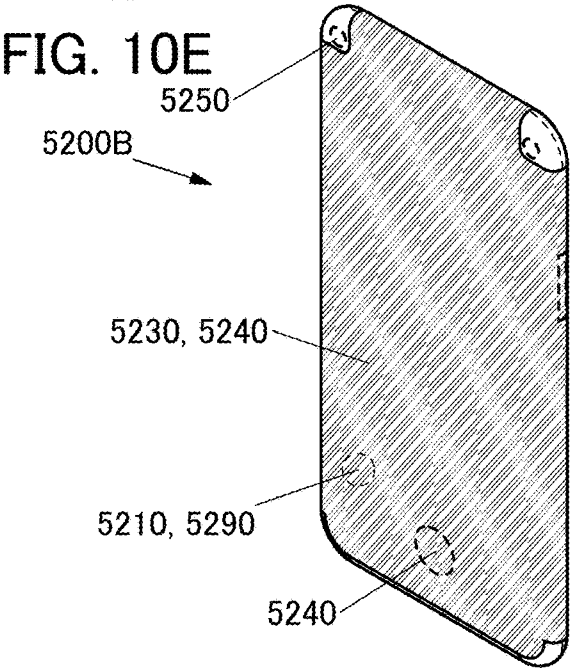
Figure 11A:
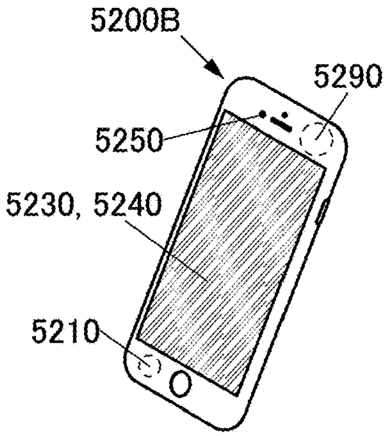
FIGS. 11A to 11E illustrate electronic devices of an embodiment.
Figure 11B:
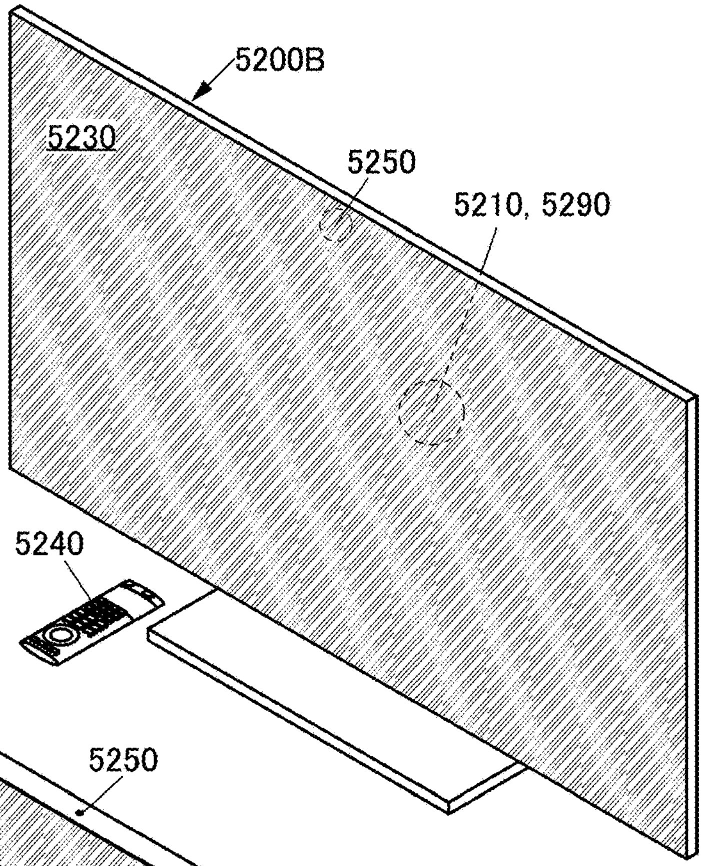
Figure 11C:
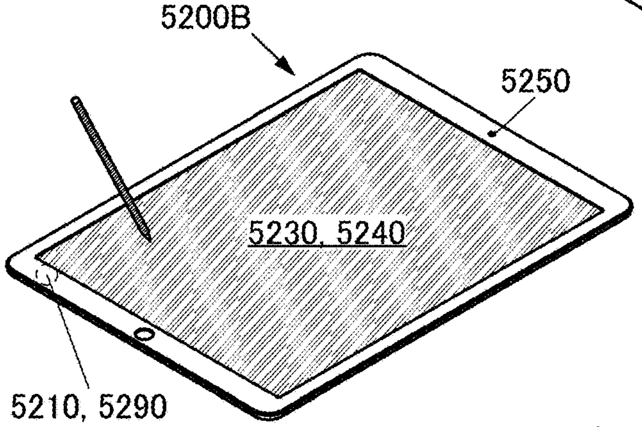
Figure 11D:
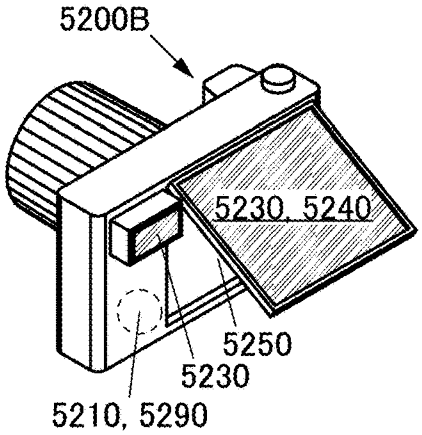
Figure 11E:
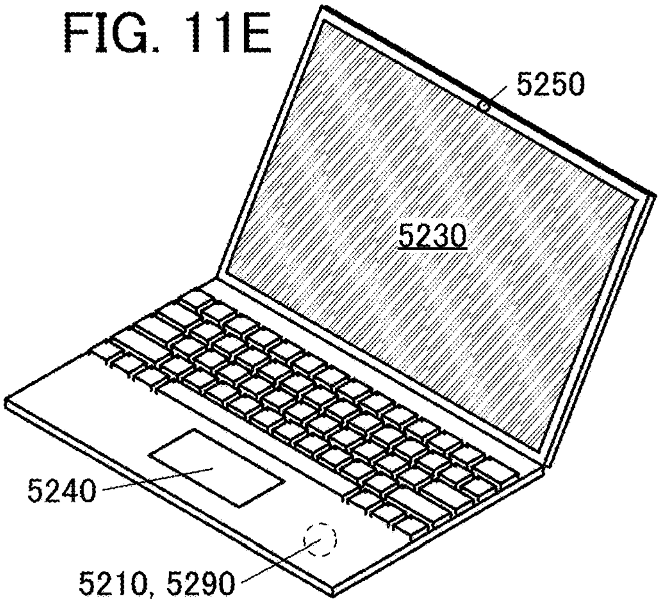
Figure 12A:
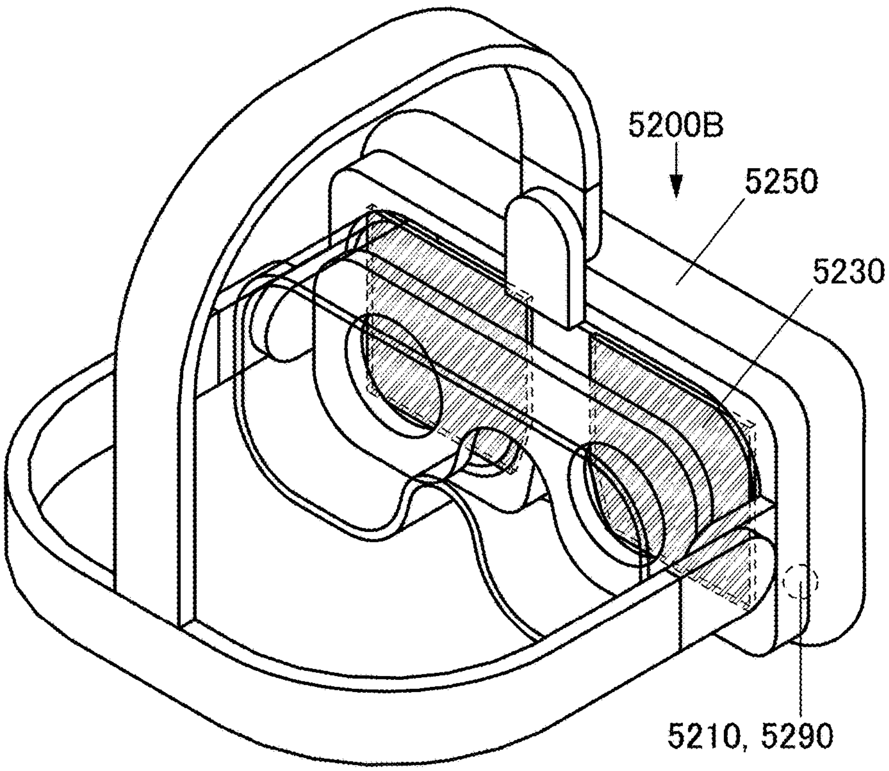
FIGS. 12A and 12B illustrate electronic devices of an embodiment.
Figure 12B:
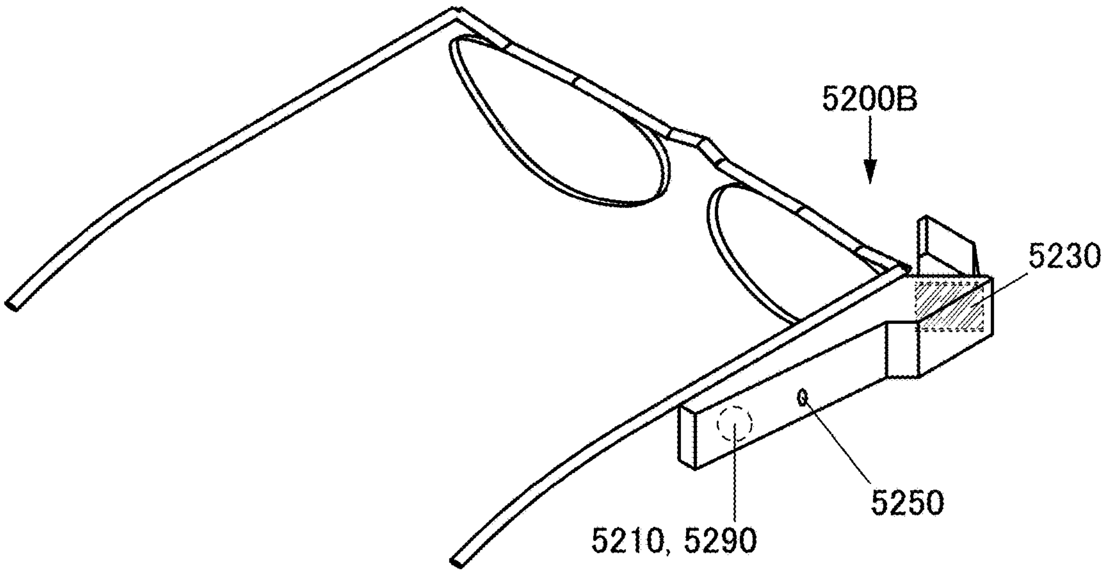

FIGS. 10A to 10E, FIGS. 11A to 11E, and FIGS. 12A and 12B each illustrate a structure of an electronic device of one embodiment of the present invention. FIG. 10A is a block diagram of an electronic device, and FIGS. 10B to 10E are perspective views illustrating structures of the electronic device. FIGS. 11A to 11E are perspective views illustrating structures of electronic devices. FIGS. 12A and 12B are perspective views illustrating structures of electronic devices.

An electronic device 5200B described in this embodiment includes an arithmetic device 5210 and an input/output device 5220 (see FIG. 10A).

The arithmetic device 5210 has a function of receiving handling data and a function of supplying image data on the basis of the handling data.

The input/output device 5220 includes a display portion 5230, an input portion 5240, a sensor portion 5250, and a communication portion 5290, and has a function of supplying handling data and a function of receiving image data. The input/output device 5220 also has a function of supplying sensing data, a function of supplying communication data, and a function of receiving communication data.

The input portion 5240 has a function of supplying handling data. For example, the input portion 5240 supplies handling data on the basis of handling by a user of the electronic device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 3 can be used for the display portion 5230.

The sensor portion 5250 has a function of supplying sensing data. For example, the sensor portion 5250 has a function of sensing a surrounding environment where the electronic device is used and supplying the sensing data.

Specifically, an illuminance sensor, an imaging device, an attitude sensing device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network by wireless communication or wired communication. Specifically, the communication portion 5290 has a function of wireless local area network communication, telephone communication, near field communication, or the like.

FIG. 10B illustrates an electronic device having an outer shape along a cylindrical column or the like. An example of such an electronic device is digital signage. The display panel of one embodiment of the present invention can be used for the display portion 5230. The electronic device may have a function of changing its display method in accordance with the illuminance of a usage environment. The electronic device has a function of changing the displayed content when sensing the existence of a person. Thus, for example, the electronic device can be provided on a column of a building. The electronic device can display advertising, guidance, or the like.

FIG. 10C illustrates an electronic device having a function of generating image data on the basis of the path of a pointer used by the user. Examples of such an electronic device include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 10D illustrates an electronic device that is capable of receiving data from another device and displaying the data on the display portion 5230. An example of such an electronic device is a wearable electronic device. Specifically, the electronic device can display several options, and the user can choose some from the options and send a reply to the data transmitter. As another example, the electronic device has a function of changing its display method in accordance with the illuminance of a usage environment. Thus, for example, power consumption of the wearable electronic device can be reduced. As another example, the wearable electronic device can display an image so as to be suitably used even in an environment under strong external light, e.g., outdoors in fine weather.

FIG. 10E illustrates an electronic device including the display portion 5230 having a surface gently curved along a side surface of a housing. An example of such an electronic device is a mobile phone. The display portion 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 11A illustrates an electronic device that is capable of receiving data via the Internet and displaying the data on the display portion 5230. An example of such an electronic device is a smartphone. For example, the user can check a created message on the display portion 5230 and send the created message to another device. As another example, the electronic device has a function of changing its display method in accordance with the illuminance of a usage environment. Thus, power consumption of the smartphone can be reduced. As another example, it is possible to obtain a smartphone which can display an image such that the smartphone can be suitably used in an environment under strong external light, e.g., outdoors in fine weather.

FIG. 11B illustrates an electronic device that can use a remote controller as the input portion 5240. An example of such an electronic device is a television system. For example, data received from a broadcast station or via the Internet can be displayed on the display portion 5230. The electronic device can take an image of the user with the sensor portion 5250 and transmit the image of the user. The electronic device can acquire a viewing history of the user and provide it to a cloud service. The electronic device can acquire recommendation data from a cloud service and display the data on the display portion 5230. A program or a moving image can be displayed on the basis of the recommendation data. As another example, the electronic device has a function of changing its display method in accordance with the illuminance of a usage environment. Accordingly, for example, it is possible to obtain a television system which can display an image such that the television system can be suitably used even under strong external light entering the room from the outside in fine weather.

FIG. 11C illustrates an electronic device that is capable of receiving an educational material via the Internet and displaying it on the display portion 5230. An example of such an electronic device is a tablet computer. The user can input an assignment with the input portion 5240 and send it via the Internet. The user can obtain a corrected assignment or the evaluation from a cloud service and have it displayed on the display portion 5230. The user can select a suitable educational material on the basis of the evaluation and have it displayed.

For example, an image signal can be received from another electronic device and displayed on the display portion 5230. When the electronic device is placed on a stand or the like, the display portion 5230 can be used as a sub-display. Thus, for example, it is possible to obtain a tablet computer which can display an image such that the tablet computer is favorably used even in an environment under strong external light, e.g., outdoors in fine weather.

FIG. 11D illustrates an electronic device including a plurality of display portions 5230. An example of such an electronic device is a digital camera. For example, the display portion 5230 can display an image that the sensor portion 5250 is capturing. A captured image can be displayed on the sensor portion. A captured image can be decorated using the input portion 5240. A message can be attached to a captured image. A captured image can be transmitted via the Internet. The electronic device has a function of changing shooting conditions in accordance with the illuminance of a usage environment. Accordingly, for example, it is possible to obtain a digital camera that can display a subject such that an image is favorably viewed even in an environment under strong external light, e.g., outdoors in fine weather.

FIG. 11E illustrates an electronic device in which the electronic device of this embodiment is used as a master to control another electronic device used as a slave. An example of such an electronic device is a portable personal computer. For example, part of image data can be displayed on the display portion 5230 and another part of the image data can be displayed on a display portion of another electronic device. Image signals can be supplied. Data written from an input portion of another electronic device can be obtained with the communication portion 5290. Thus, a large display region can be utilized in the case of using a portable personal computer, for example.

FIG. 12A illustrates an electronic device including the sensor portion 5250 that senses an acceleration or a direction. An example of such an electronic device is a goggles-type electronic device. The sensor portion 5250 can supply data on the position of the user or the direction in which the user faces. The electronic device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on the goggles-type electronic device, for example.

FIG. 12B illustrates an electronic device including an imaging device and the sensor portion 5250 that senses an acceleration or a direction. An example of such an electronic device is a glasses-type electronic device. The sensor portion 5250 can supply data on the position of the user or the direction in which the user faces. The electronic device can generate image data in accordance with the position of the user or the direction in which the user faces. Accordingly, the data can be shown together with a real-world scene, for example. Alternatively, an augmented reality image can be displayed on the glasses-type electronic device.

Note that this embodiment can be combined with any of the other embodiments in this specification as appropriate.

Embodiment 6

Figure 13A:
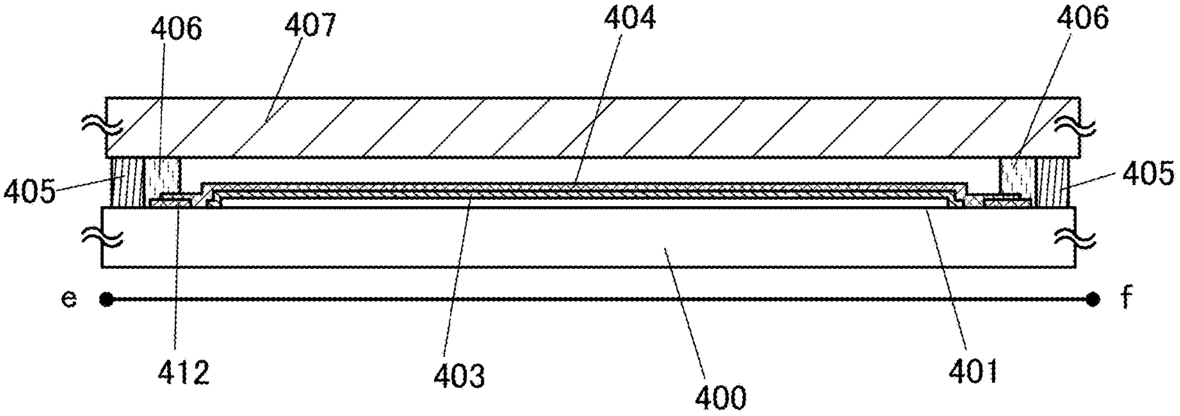
FIGS. 13A and 13B illustrate a lighting device of an embodiment.
Figure 13B:
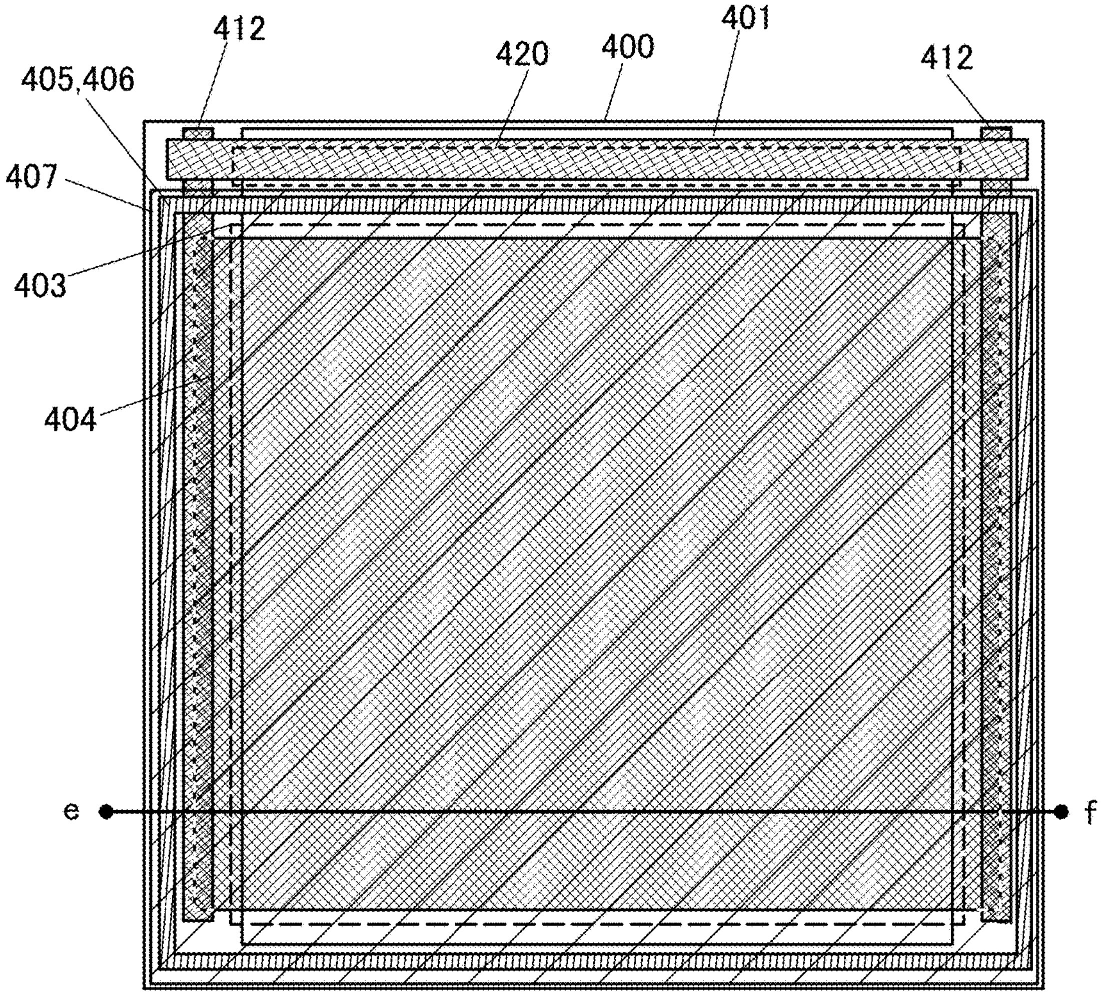

This embodiment will describe a structure in which any of the light-emitting devices described in Embodiment 2 is used as a lighting device with reference to FIGS. 13A and 13B. FIG. 13A is a cross-sectional view taken along the line e-f in a top view of the lighting device in FIG. 13B.

In the lighting device in this embodiment, a first electrode 401 is formed over a substrate 400 that is a support and has a light-transmitting property. The first electrode 401 corresponds to the first electrode 101 in Embodiment 2. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to the structure of the EL layer 103 in Embodiment 2. Refer to the corresponding description for these structures.

The second electrode 404 is formed to cover the EL layer 403. The second electrode 404 corresponds to the second electrode 102 in Embodiment 2. The second electrode 404 is formed using a material having high reflectance when light is extracted from the first electrode 401 side. The second electrode 404 is connected to the pad 412 so that voltage is supplied to the second electrode 404.

As described above, the lighting device described in this embodiment includes a light-emitting device including the first electrode 401, the EL layer 403, and the second electrode 404. Since the light-emitting device has high emission efficiency, the lighting device in this embodiment can have low power consumption.

The substrate 400 provided with the light-emitting device having the above structure and a sealing substrate 407 are fixed and sealed with sealing materials 405 and 406, whereby the lighting device is completed. It is possible to use only either the sealing material 405 or the sealing material 406. In addition, the inner sealing material 406 (not illustrated in FIG. 13B) can be mixed with a desiccant that enables moisture to be adsorbed, leading to an improvement in reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

Embodiment 7

Figure 14:
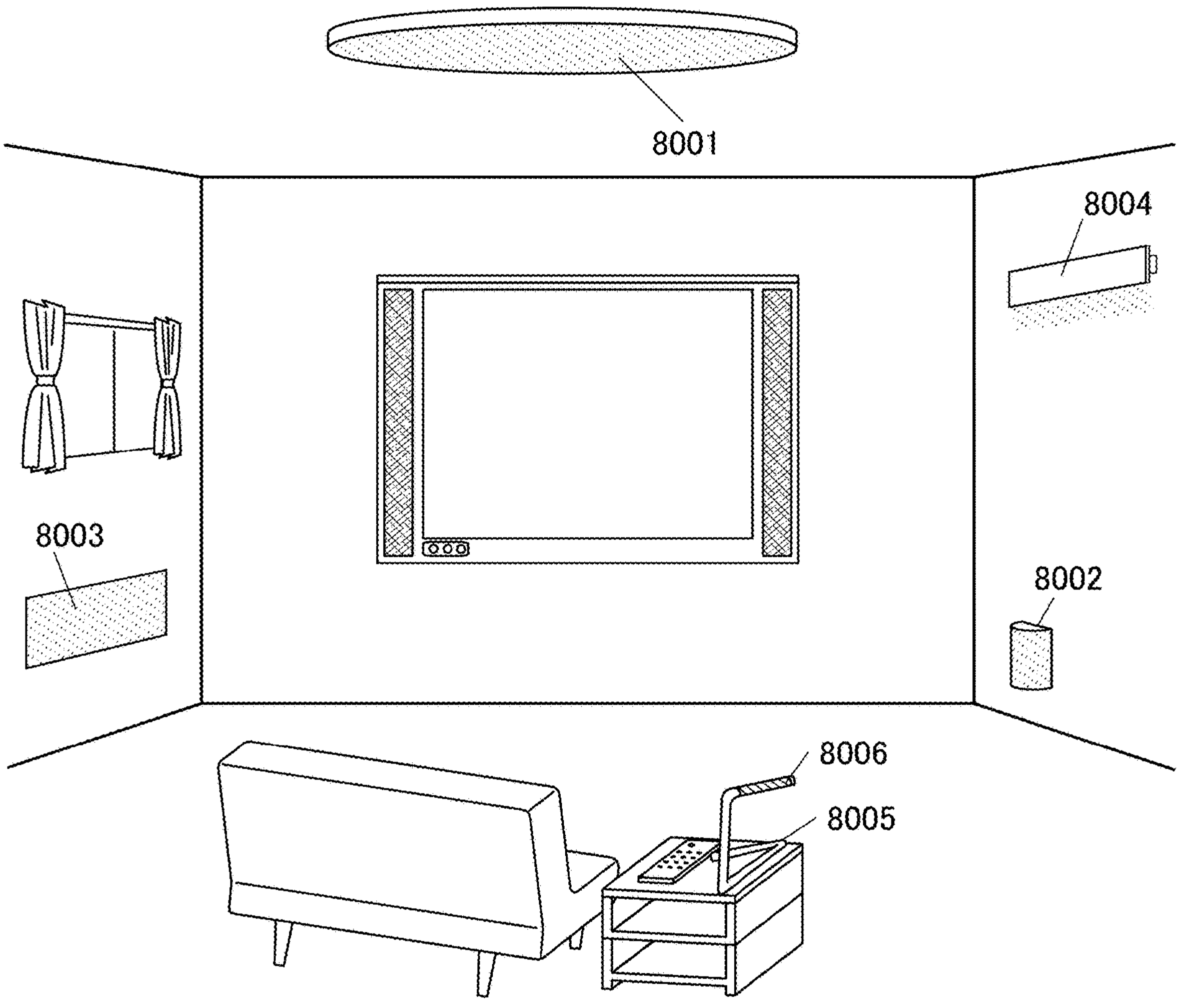
FIG. 14 illustrates lighting devices of an embodiment.

This embodiment will describe application examples of lighting devices fabricated using the light-emitting apparatus of one embodiment of the present invention or the light-emitting device, which is part of the light-emitting apparatus with reference to FIG. 14.

A ceiling light 8001 can be used as an indoor lighting device. Examples of the ceiling light 8001 include a direct-mount light and an embedded light. Such lighting devices are fabricated using the light-emitting apparatus and a housing and a cover in combination. Application to a cord pendant light (light that is suspended from a ceiling by a cord) is also possible.

Afoot light 8002 lights a floor so that safety on the floor can be improved. For example, it can be effectively used in a bedroom, on a staircase, and on a passage. In such cases, the size and shape of the foot light can be changed in accordance with the dimensions and structure of a room. The foot light can be a stationary lighting device using the light-emitting apparatus and a support in combination.

A sheet-like lighting 8003 is a thin sheet-like lighting device. The sheet-like lighting, which is attached to a wall when used, is space-saving and thus can be used for a wide variety of uses. Furthermore, the area of the sheet-like lighting can be easily increased. The sheet-like lighting can also be used on a wall or a housing that has a curved surface.

A lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device, which is part of the light-emitting apparatus, is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in appropriate combination with any of the structures described in the other embodiments.

Example 1

In this example, the first organic compound that can be used for the light-emitting device of one embodiment of the present invention was analyzed by calculation, and the results are described with reference to FIGS. 15A to 15E and FIGS. 16A and 16B.

Shown below are the chemical formulae of the analyzed compounds, 9,9'-{6-[3-(triphenylsilyl)phenyl]-1,3,5-triazine-2,4-diyl}bis(9H-carbazole) (abbreviation: SiTrzCz2), 9-[3-(triphenylsilyl)phenyl]-3,9'-bi-9H-carbazole (abbreviation: PSiCzCz), 3,3'-bis(9-phenyl-9H-carbazole) (abbreviation: PCCP), and 8-(biphenyl-4-yl)-4-[3-(dibenzothiophen-4-yl)phenyl]-[1]benzofuro[3,2-d]pyrimidine (abbreviation: 8BP-4mDBtPBfpm), and the chemical formula of 9-(1-naphthyl)-10-[4-(2-naphthyl)phenyl]anthracene (abbreviation: aN-PNPAnth) analyzed as a comparative example.

[Chemical Formula 13]

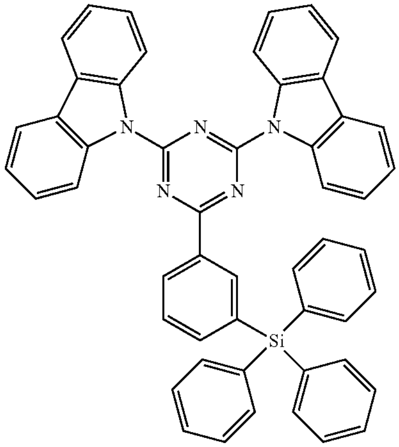

SiTrzCz2

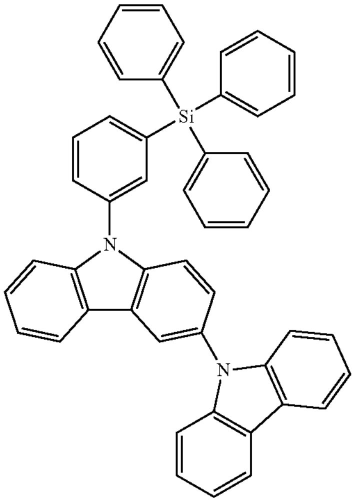

PSiCzCz

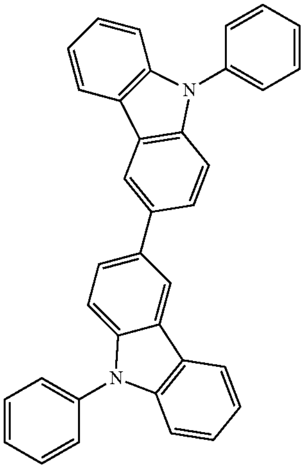

PCCP

-continued

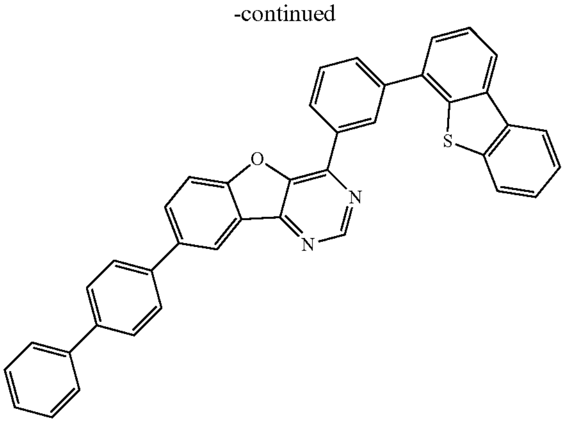

8BP-4mDBtPBfpm

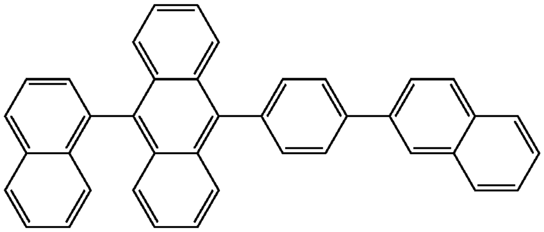

αN-β NPAnth

The oxygen-molecule addition position with the lowest formation energy was analyzed for each of the above organic compounds. Furthermore, for each of the above organic compounds, the difference (ΔH) between the energy of an oxygen adduct in a ground state formed when an oxygen molecule is added to the oxygen oxygen-molecule addition position and the sum of the energy of the pre-reaction organic compound in a ground state and the energy of an oxygen molecule in a ground state, the difference (ΔEa) between the sum of the energy of the pre-reaction organic compound in a ground state and the energy of the oxygen molecule in a ground state and the energy of the transition state formed by the organic compound and the oxygen molecule as a result of a reaction in which the oxygen molecule is added to the oxygen-molecule addition position, and the difference (ΔEb) between the energy of the transition state formed by the organic compound and the oxygen molecule and the energy of the oxygen adduct in a ground state formed when an oxygen molecule is added to the oxygen-molecule addition position were analyzed.

<Calculation Method>

The energy of the oxygen adduct and the energy of the pre-reaction organic compound in a ground state were analyzed by analyzing the most stable structure where the singlet ground state (S0) level of the compound is the lowest. The energy of the oxygen molecule in a ground state was analyzed by analyzing the most stable structure where the triplet ground state (To) level of the oxygen molecule is the lowest. The energy of the transition state formed by the organic compound and the oxygen molecule as a result of the reaction in which the oxygen molecule is added was analyzed by analyzing a structure where the singlet ground state (S0) level of the compound becomes a saddle point. A density functional theory (DFT) method was used as the calculation method. The total energy calculated by the DFT is represented as the sum of potential energy, electrostatic energy between electrons, electronic kinetic energy, and exchange-correlation energy including all the complicated interactions between electrons. In the DFT, an exchange-correlation interaction is approximated by a functional (a function of another function) of one electron potential represented in terms of electron density to enable high-speed calculations. Here, B3LYP which is a hybrid functional was used to specify the weight of each parameter related to exchange-correlation energy. As a basis function, 6-311G (d,p) was used. Gaussian 16 was used as a computational program.

Shown below are structures of oxygen adducts of the above compounds, each of which is formed by addition of an oxygen molecule to the oxygen-molecule addition position with the lowest formation energy. Note that the oxygen adducts of SiTrzCz2, PSiCzCz, PCCP, 8BP-4mDBtPBfpm, and aN-PNPAnth, each of which is a structure formed by addition of an oxygen molecule to the oxygen-molecule addition position with the lowest formation energy, are represented below by SiTrzCz2-$O_2$, PSiCzCz-$O_2$, PCCP-$O_2$, 8BP-4mDBtPBfpm-$O_2$, and αN-βNPAnth-$O_2$, respectively.

[Chemical Formula 14]

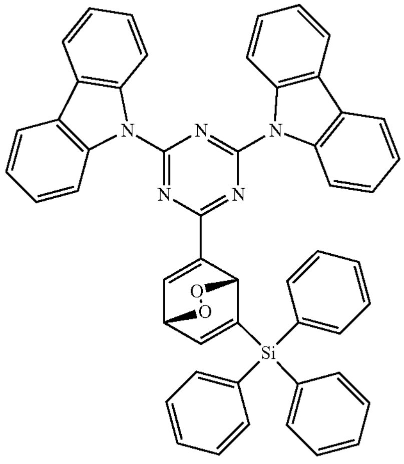

SiTrzCz2-$O_2$

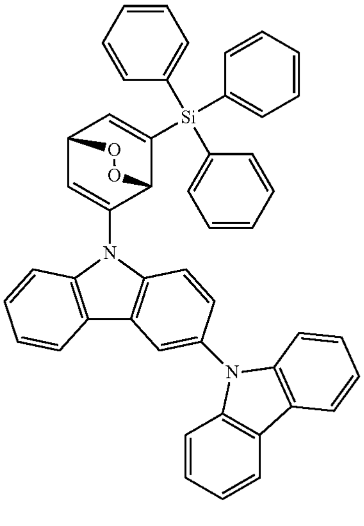

PSiCzCz-$O_2$

-continued

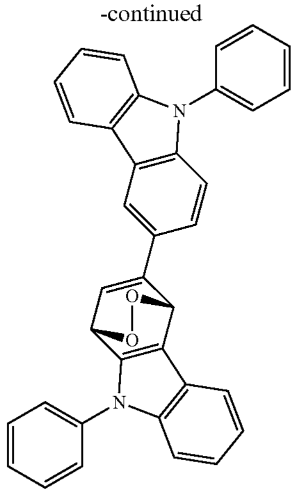

PCCP-$O_2$

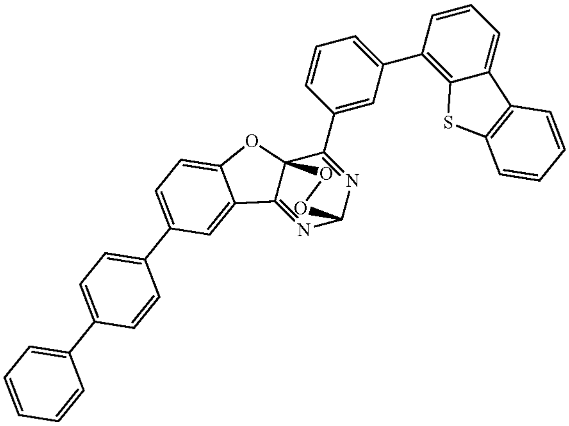

8BP-4mDBtPBfpm-$O_2$

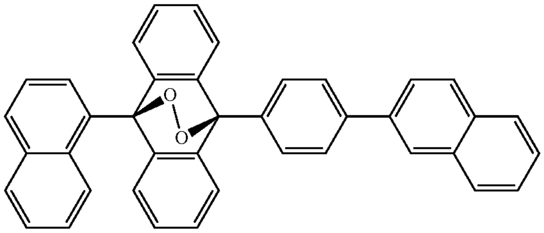

αN-β NPAnth-$O_2$

As shown in the above Structural Formulae, it is found that an oxygen molecule is likely to be added to a phenylene group in SiTrzCz2-$O_2$ and PSiCzCz-$O_2$, an oxygen molecule is likely to be added to a carbazole skeleton in PCCP-$O_2$, an oxygen molecule is likely to be added to a benzofuropyrimidine skeleton in 8BP-4mDBtPBfpm-$O_2$, and an oxygen molecule is likely to be added to an anthracene skeleton in αN-βNPAnth-$O_2$.

The table below shows the analysis results of ΔEa, ΔEb, and ΔH of the above compounds.

TABLE 1

| | ΔEa | ΔEb | ΔH |
|---|---|---|---|
| SiTrzCz2 | 1.97 eV | 0.74 eV | 1.23 eV |
| PSiCzCz | 1.92 eV | 0.63 eV | 1.29 eV |
| PCCP | 1.95 eV | 0.57 eV | 1.38 eV |
| 8BP-4mDBtPBfpm | 1.87 eV | 0.85 eV | 1.02 eV |
| αN-βNP Anth | 1.38 eV | 1.08 eV | 0.30 eV |

As shown in the above table, ΔEa values of SiTrzCz2, PSiCzCz, PCCP, and 8BP-4mDBtPBfpm are 1.97 eV, 1.92 eV, 1.95 eV, and 1.87 eV, respectively, which are each greater than or equal to 1.84 eV. The results indicate that oxygen adducts of these organic compounds are less likely to be formed at room temperature. As shown in the above table, ΔEb values of SiTrzCz2, PSiCzCz, PCCP, and 8BP-4mDBtPBfpm are 0.74 eV, 0.63 eV, 0.57 eV, and 0.85 eV, respectively, which are each less than or equal to 0.87 eV. The results indicate that even when an oxygen adduct is formed in each of the organic compounds, the oxygen adduct easily returns to the organic compound and the oxygen molecule at room temperature. As shown in the above table, ΔH values of SiTrzCz2, PSiCzCz, PCCP, and 8BP-4mDBtPBfpm are 1.23 eV, 1.29 eV, 1.38 eV, and 1.02 eV, respectively, which are each greater than or equal to 0.97 eV. The results indicate that even when an oxygen adduct is formed in each of the organic compounds, the oxygen adduct can return to the original compound and the oxygen molecule more easily. Accordingly, each of these organic compounds is preferably used as the first organic compound in the light-emitting device of one embodiment of the present invention, capable of increasing the emission efficiency and the reliability of the light-emitting device 100.

On the other hand, ΔEa, ΔEb, and ΔH of αN-βNPAnth shown as the comparative example, which is an organic compound from which an oxygen adduct is likely to be formed, are 1.38 eV, 1.08 eV, and 0.30 eV, respectively. The results indicate that αN-βNPAnth is a material from which an oxygen adduct is likely to be formed at room temperature.

The above compounds were subjected to analysis of HOMO distribution.

<Calculation Method>

The analysis of HOMO distribution was performed on the most stable structure of each of the compounds where the singlet ground state (S0) level is the lowest. A density functional theory (DFT) method was used as the calculation method. The total energy calculated by the DFT is represented as the sum of potential energy, electrostatic energy between electrons, electronic kinetic energy, and exchange-correlation energy including all the complicated interactions between electrons. In the DFT, an exchange-correlation interaction is approximated by a functional (a function of another function) of one electron potential represented in terms of electron density to enable high-speed calculations. Here, B3LYP which is a hybrid functional was used to specify the weight of each parameter related to exchange-correlation energy. As a basis function, 6-311G (d,p) was used. Gaussian 16 was used as a computational program.

FIGS. 15A to 15E show the HOMO analysis results of the organic compounds. In each of FIGS. 15A to 15E, the absolute value of the threshold for displaying a molecular orbital is 0.04 $(e\cdot bohr^{-3})^{1/2}$. FIG. 15A, FIG. 15B, FIG. 15C, FIG. 15D, and FIG. 15E show the analysis results of SiTrzCz2, PSiCzCz, PCCP, 8BP-4mDBtPBfpm, and αN-βNPAnth, respectively. Note that shades around molecules in FIGS. 15A to 15E indicate HOMO distribution of the molecules.

Figure 15A:
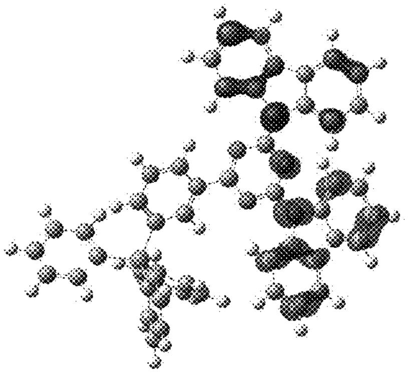
FIGS. 15A to 15E show HOMO distribution of organic compounds.
Figure 15B:
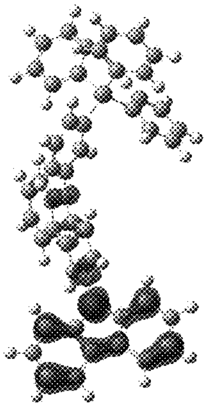

As shown in FIGS. 15A and 15B, HOMO distribution is located on a carbazole skeleton in each of SiTrzCz2 and PSiCzCz. As shown in FIG. 15D, HOMO distribution is mainly located on a dibenzothiophene skeleton in 8BP-4mDBtPBfpm. These results show that, in each of the molecules, a portion to which an oxygen molecule is added is different from a portion on which HOMO distribution is located. This is because each of the molecules is more stable as compared to the case where oxygen is added to the portion on which HOMO distribution is located because, in SiTrzCz2 and PSiCzCz, addition of oxygen reduces the steric hindrance in a molecule and because, in 8BP-4mDBtPBfpm, electrostatic interaction between a carbon atom having a high positive charge and an oxygen molecule is high.

Figure 15C:
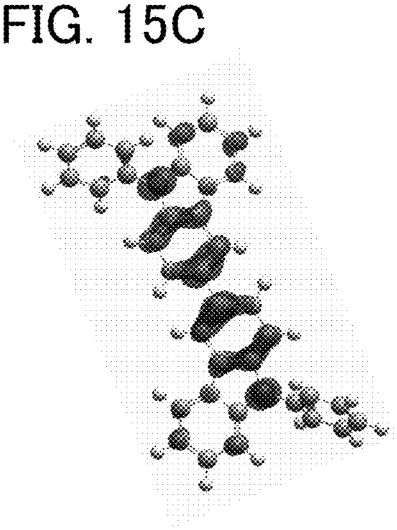
Figure 15D:
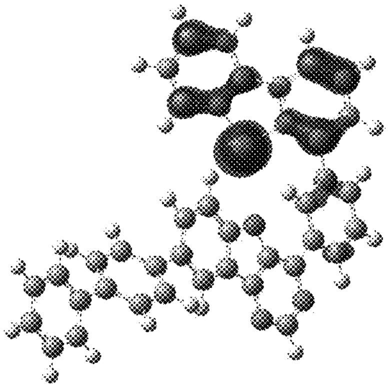
Figure 16A:
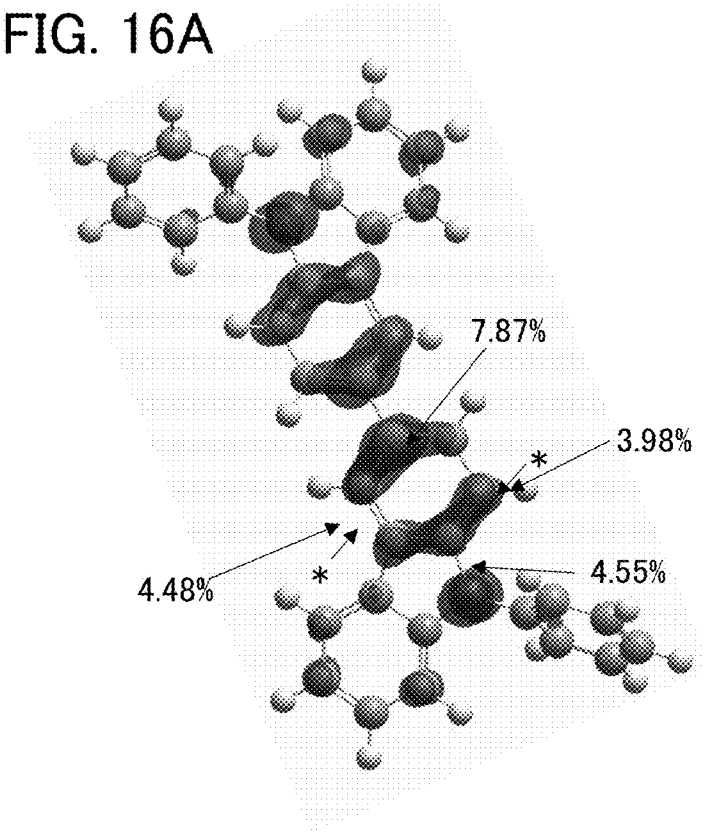
FIGS. 16A and 16B show HOMO distribution of organic compounds.

As shown in FIG. 15C, HOMO distribution is located on two carbazole skeletons in PCCP. The result shows that a portion to which an oxygen molecule is added is the same as part of a portion on which HOMO distribution is located in PCCP. FIG. 16A is an enlarged view showing the HOMO analysis result of PCCP. FIG. 16A shows percentages of HOMO distribution of carbon atoms. A carbon atom to which an oxygen molecule is likely to be added is denoted with *. Oxygen generally tends to be added to a pair of carbon atoms at p-position of a ring whose sum of percentages of HOMO distribution becomes maximum. However, FIG. 16A reveals that carbon atoms to which oxygen is likely to be added do not correspond with a pair of carbon atoms at p-position of the ring whose sum of percentages of HOMO distribution becomes maximum (7.87% and 4.55%) in PCCP. This is because, when a carbon atom has a large percentage of HOMO distribution but is shared by a plurality of rings, a change from a planar structure derived from $sp^2$ hybrid orbitals of a carbon atom of an aromatic compound into a tetrahedral structure derived from $sp^3$ hybrid orbitals due to addition of oxygen is inhibited.

Figure 15E:
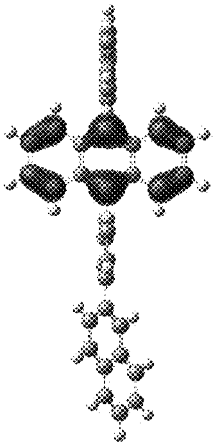
Figure 16B:
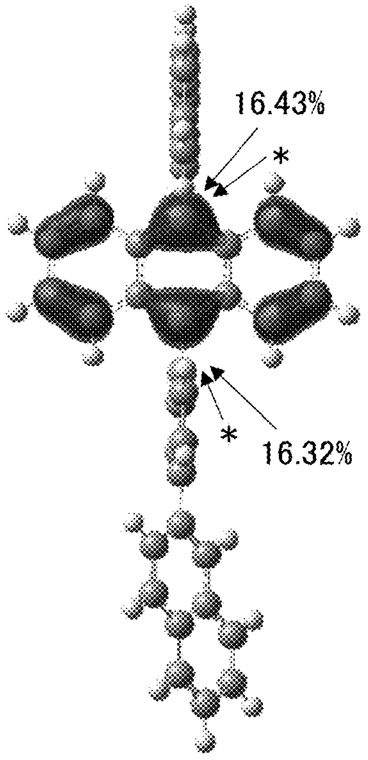

As shown in FIG. 15E, HOMO distribution is located on an anthracene skeleton in αN-βNPAnth. The result shows that a portion to which an oxygen molecule is added is the same as a portion on which HOMO distribution is located in αN-βNPAnth. FIG. 16B is an enlarged view showing the HOMO analysis result of αN-βNPAnth. FIG. 16B shows percentages of HOMO distribution of carbon atoms on the anthracene skeleton. A carbon atom to which an oxygen molecule is likely to be added is denoted with *. FIG. 16B reveals that carbon atoms to which oxygen is likely to be added correspond with carbon atoms whose sum of percentages of HOMO distribution becomes maximum.

The above results show that in the organic compound from which an oxygen adduct is less likely to be formed, a portion to which an oxygen molecule is added and a portion on which HOMO distribution is located tend to be different from each other. Accordingly, it is confirmed that a molecule structure designed to include a portion to which an oxygen molecule is added and a portion on which HOMO distribution is located that are different from each other is suitable for an organic compound from which an oxygen adduct is less likely to be formed.

Example 2

In this example, organic compounds described in Embodiment 1 as the first organic compounds that can be used for the light-emitting device of one embodiment of the present invention were analyzed by calculation, and the results are described with reference to FIGS. 17A and 17B.

Shown below are the chemical formulae of the analyzed compounds, 4-[3'-(dibenzothiophen-4-yl)biphenyl-3-yl]benzofuro[3',2':5,6]benzofuro[3,2-d]pyrimidine (abbreviation: 4mDBtBPBffpm) represented by Structural Formula (100) and 9-phenyl-4-[3'-(dibenzothiophen-4-yl)biphenyl-3-yl]benzofuro[3',2':5,6]benzofuro[3,2-d]pyrimidine (abbreviation: 9Ph-4mDBtBPBffpm) represented by Structural Formula (101).

[Chemical Formula 15]

(100)

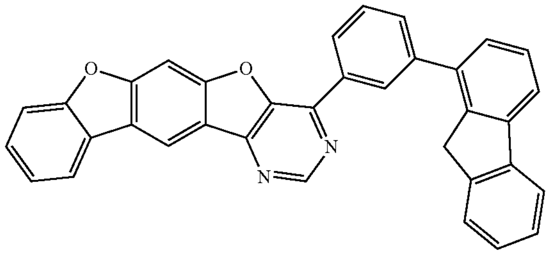

4mDBtBPBffpm (101)

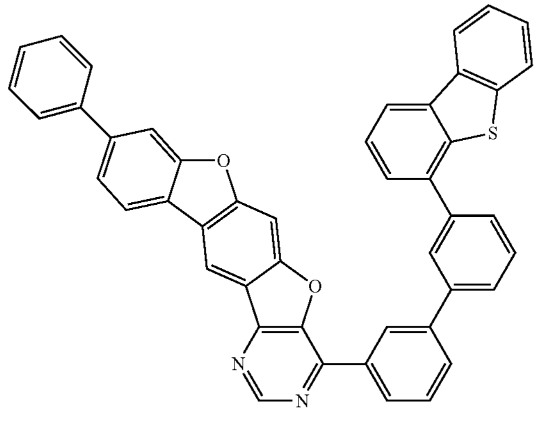

9Ph-4mDBtBPBffpm

As in Example 1, the oxygen-molecule addition position with the lowest formation energy, ΔH, ΔEa, and ΔEb were analyzed for each of the above organic compounds.

Shown below are structures of oxygen adducts of the above compounds, each of which is formed by addition of an oxygen molecule to the oxygen-molecule addition position with the lowest formation energy. Note that the oxygen adducts of 4mDBtBPBffpm and 9Ph-4mDBtBPBffpm, each of which is a structure formed by addition of an oxygen molecule to the oxygen-molecule addition position with the lowest formation energy, are represented below by 4mDBtBPBffpm-$O_2$ and 9Ph-4mDBtBPBffpm-$O_2$, respectively.

[Chemical Formula 16]

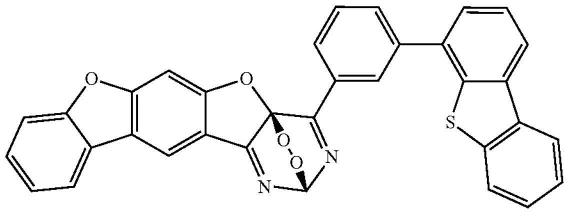

4mDBtBPBffpm-$O_2$

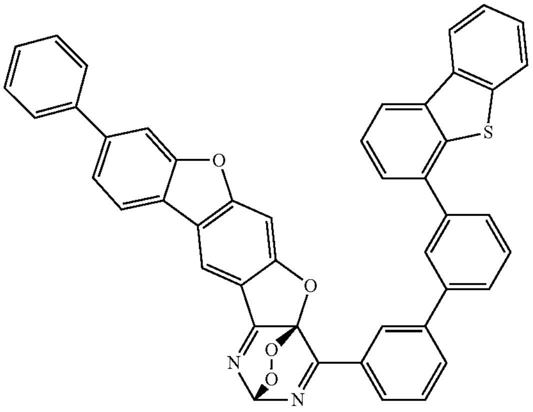

9Ph-4mDBtBPBffpm-$O_2$

As shown in the above Structural Formulae, it is found that an oxygen molecule is likely to be added to a benzofuropyrimidine ring in 4mDBtBPBffpm-$O_2$ and 9Ph-4mDBtBPBffpm-$O_2$.

The table below shows the analysis results of ΔEa, ΔEb, and ΔH of the above compounds.

TABLE 2

| | ΔEa | ΔEb | ΔH |
|---|---|---|---|
| 4mDBtBPBffpm | 1.85 eV | 0.86 eV | 0.99 eV |
| 9Ph-4mDBtBPBffpm | 1.85 eV | 0.86 eV | 0.99 eV |

As shown in the above table, ΔEa values of 4mDBtBPBffpm and 9Ph-4mDBtBPBffpm are each 1.85 eV, which is higher than or equal to 1.84 eV. The results indicate that oxygen adducts of these organic compounds are less likely to be formed at room temperature. As shown in the above table, ΔEb values of 4mDBtBPBffpm and 9Ph-4mDBtBPBffpm are each 0.86 eV, which is lower than or equal to 0.87 eV. The results indicate that even when an oxygen adduct is formed in each of the organic compounds, the oxygen adduct easily returns to the organic compound and the oxygen molecule at room temperature. As shown in the above table, ΔH values of 4mDBtBPBffpm and 9Ph-4mDBtBPBffpm are each 0.99 eV, which is higher than or equal to 0.97 eV. The results indicate that even when an oxygen adduct is formed in each of the organic compounds, the oxygen adduct can return to the original compound and the oxygen molecule more easily. Accordingly, each of these organic compounds is preferably used as the first organic compound in the light-emitting device of one embodiment of the present invention, capable of increasing the emission efficiency and the reliability of the light-emitting device 100.

The above compounds were subjected to analysis of HOMO distribution as in Example 1.

Figure 17A:
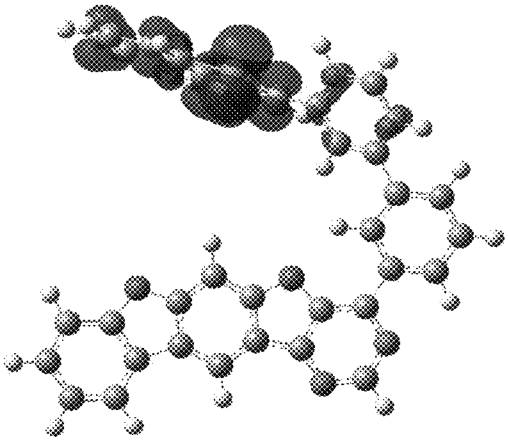
FIGS. 17A and 17B show HOMO distribution of organic compounds.
Figure 17B:
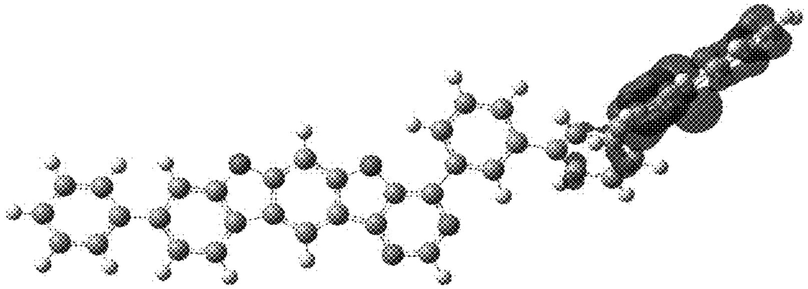

FIGS. 17A and 17B show the HOMO analysis results of the organic compounds. In each of FIGS. 17A and 17B, the absolute value of the threshold for displaying a molecular orbital is 0.04 $(e \cdot bohr^{-3})^{1/2}$. FIG. 17A and FIG. 17B show the analysis results of 4mDBtBPBfpm and 9Ph-4mDBtBPBfpm, respectively. Note that shades around molecules in FIGS. 17A and 17B indicate HOMO distribution of the molecules.

As shown in FIGS. 17A and 17B, HOMO distribution is located on a dibenzothiophene skeleton in each of 4mDBtBPBfpm and 9Ph-4mDBtBPBfpm. The results show that, in each of the molecules, a portion to which an oxygen molecule is added is different from a portion on which HOMO distribution is located.

The above results reveal that oxygen adducts of the organic compounds described in Embodiment 1 that can be used as the first organic compounds are less likely to be formed. Furthermore, it is confirmed that a portion to which an oxygen molecule is added is different from a portion on which HOMO distribution is located in each of the organic compounds.

Example 3

In this example, organic compounds described in Embodiment 1 as the first organic compounds that can be used for the light-emitting device of one embodiment of the present invention were analyzed by calculation, and the results are described with reference to FIGS. 18A to 18C and FIGS. 19A and 19B.

Shown below are the chemical formulae of the analyzed compounds, 2,2"-bi(9,9'-spirobi[9H-fluorene]) (Compound 1) represented by Structural Formula (200), 2,7-bis(pyren-1-yl)-9,9'-spirobi[fluorene] (Compound 2) represented by Structural Formula (201), and 9-[4-(3-fluoranthenyl)phenyl]-9H-carbazole (abbreviation: CzPFlt) represented by Structural Formula (202).

[Chemical Formula 17]

(200)

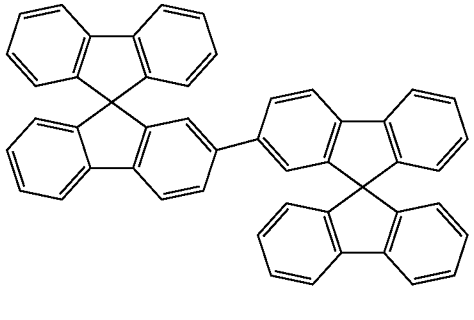

Compound 1

(201)

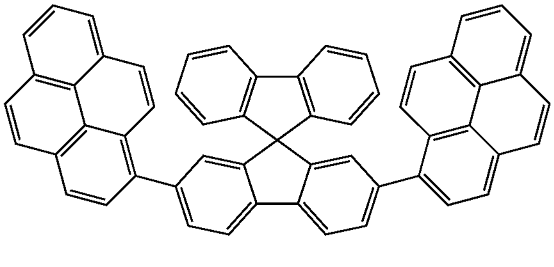

Compound 2

-continued (203)

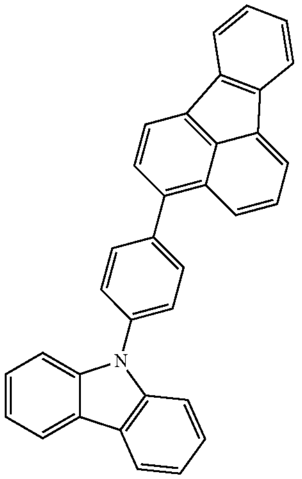

CzPFlt

As in Example 1 and Example 2, the oxygen-molecule addition position with the lowest formation energy, ΔH, ΔEa, and ΔEb were analyzed for each of the above organic compounds.

Shown below are structures of oxygen adducts of the above compounds, each of which is formed by addition of an oxygen molecule to the oxygen-molecule addition position with the lowest formation energy. Note that the oxygen adducts of Compound 1, Compound 2, and CzPFIt, each of which is a structure formed by addition of an oxygen molecule to the oxygen-molecule addition position with the lowest formation energy, are represented below by Compound 1-$O_2$, Compound 2-$O_2$ and CzPFIt-$O_2$, respectively.

[Chemical Formula 18]

Compound 1-$O_2$

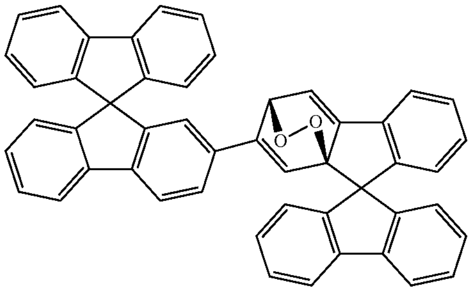

Compound 2-$O_2$

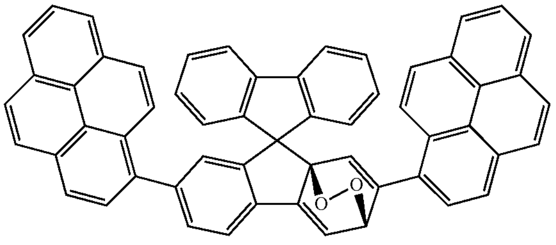

-continued

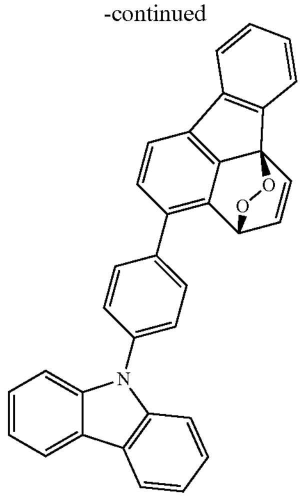

CzPFlt-$O_2$

As shown in the above Structural Formulae, an oxygen molecule is added to a spirobifluorenyl group in Compound 1-$O_2$ and Compound 2-$O_2$, and an oxygen molecule is added to a fluoranthene skeleton in CzPFlt-$O_2$.

The table below shows the analysis results of ΔEa, ΔEb, and ΔH of the above compounds.

TABLE 3

| | ΔEa | ΔEb | ΔH |
|---|---|---|---|
| Compound 1 | 1.99 eV | 0.58 eV | 1.41 eV |
| Compound 2 | 1.97 eV | 0.61 eV | 1.36 eV |
| CzPFlt | 1.85 eV | 0.62 eV | 1.23 eV |

As shown in the above table, ΔEa values of Compound 1, Compound 2, and CzPFlt are 1.99 eV, 1.97 eV, and 1.85 eV, respectively, which are each higher than or equal to 1.84 eV. The results indicate that oxygen adducts of these organic compounds are less likely to be formed at room temperature. As shown in the above table, ΔEb values of Compound 1, Compound 2, and CzPFlt are 0.58 eV, 0.61 eV, and 0.62 eV, respectively, which are each lower than or equal to 0.87 eV. The results indicate that even when an oxygen adduct is formed in each of the organic compounds, the oxygen adduct easily returns to the organic compound and the oxygen molecule at room temperature. As shown in the above table, ΔH values of Compound 1, Compound 2, and CzPFlt are 1.41 eV, 1.36 eV, and 1.23 eV, respectively, which are each higher than or equal to 0.97 eV. The results indicate that even when an oxygen adduct is formed in each of the organic compounds, the oxygen adduct can return to the first organic compound and the oxygen molecule more easily. Accordingly, each of these organic compounds is preferably used as the first organic compound in the light-emitting device of one embodiment of the present invention, capable of increasing the emission efficiency and the reliability of the light-emitting device 100.

The above compounds were subjected to analysis of HOMO distribution as in Example 1 and Example 2.

Figure 18A:
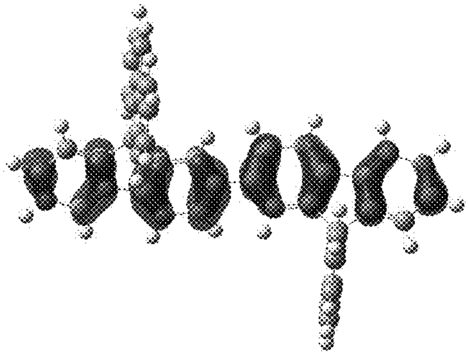
FIGS. 18A to 18C show HOMO distribution of organic compounds.
Figure 18B:
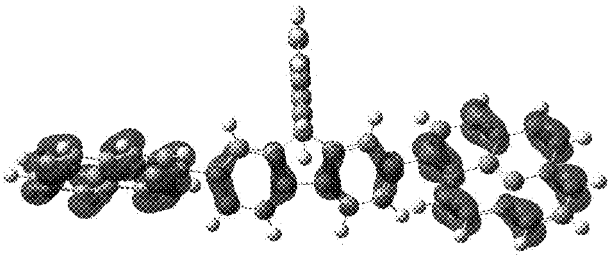
Figure 18C:
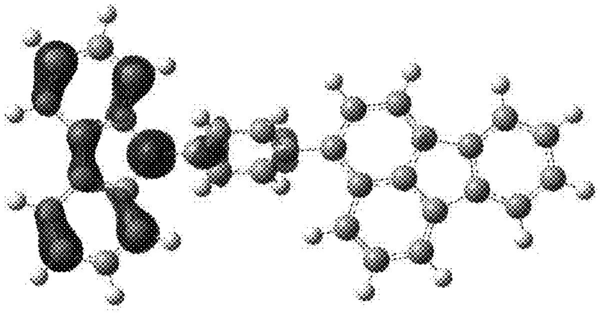

FIGS. 18A to 18C show the HOMO analysis results of the organic compounds. In each of FIGS. 18A to 18C, the absolute value of the threshold for displaying a molecular orbital is 0.04 $(e \cdot bohr^{-3})^{1/2}$. FIG. 18A, FIG. 18B, and FIG. 18C show the analysis results of Compound 1, Compound 2, and CzPFlt, respectively. Note that shades around molecules in FIGS. 18A to 18C indicate HOMO distribution of the molecules.

As shown in FIG. 18C, HOMO distribution is located on a carbazole skeleton in CzPFlt. The result shows that, in this molecule, a portion to which an oxygen molecule is added is different from a portion on which HOMO distribution is located.

As shown in FIG. 18A and FIG. 18B, HOMO distribution is located over two spirobifluorene skeletons in Compound 1 and over a spirobifluorene skeleton and a pyrene skeleton in Compound 2. These results show that, in each of the molecules, a portion to which an oxygen molecule is added is the same as part of a portion on which HOMO distribution is located.

Figure 19A:
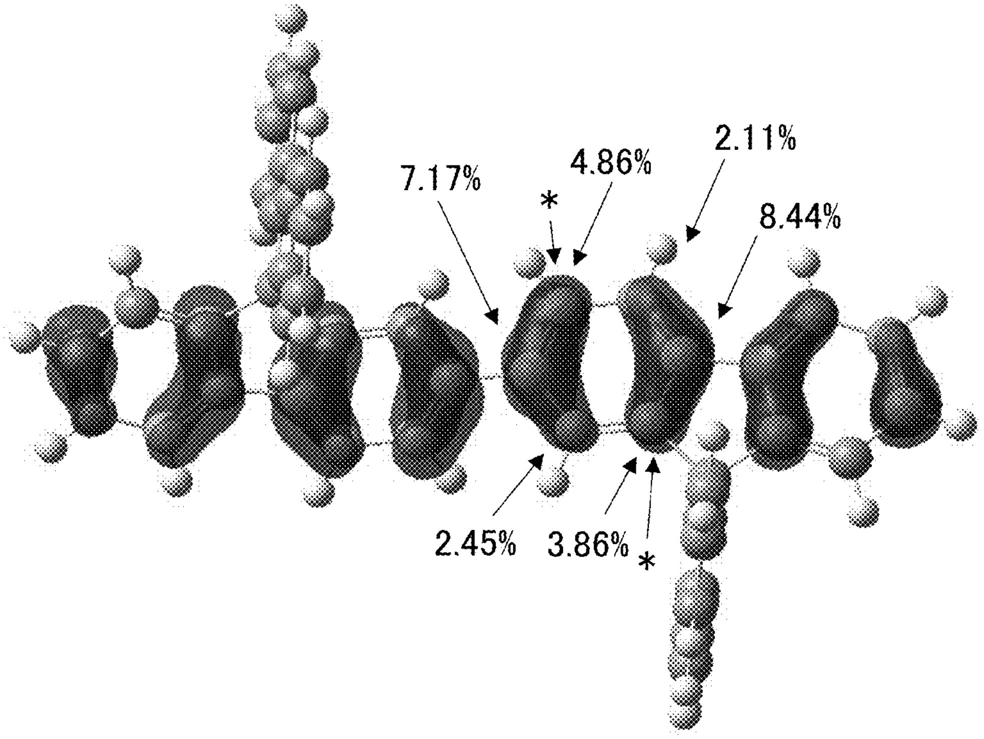
FIGS. 19A and 19B show HOMO distribution of organic compounds.

FIG. 19A is an enlarged view showing the HOMO analysis result of Compound 1. FIG. 19A shows percentages of HOMO distribution of carbon atoms. A carbon atom to which an oxygen molecule is likely to be added is denoted with *. Oxygen generally tends to be added to a pair of carbon atoms at p-position of a ring whose sum of percentages of HOMO distribution becomes maximum. However, FIG. 19A reveals that carbon atoms to which oxygen is likely to be added do not correspond with a pair of carbon atoms at p-position of the ring whose sum of percentages of HOMO distribution becomes maximum (8.44% and 7.17%) in Compound 1.

Figure 19B:
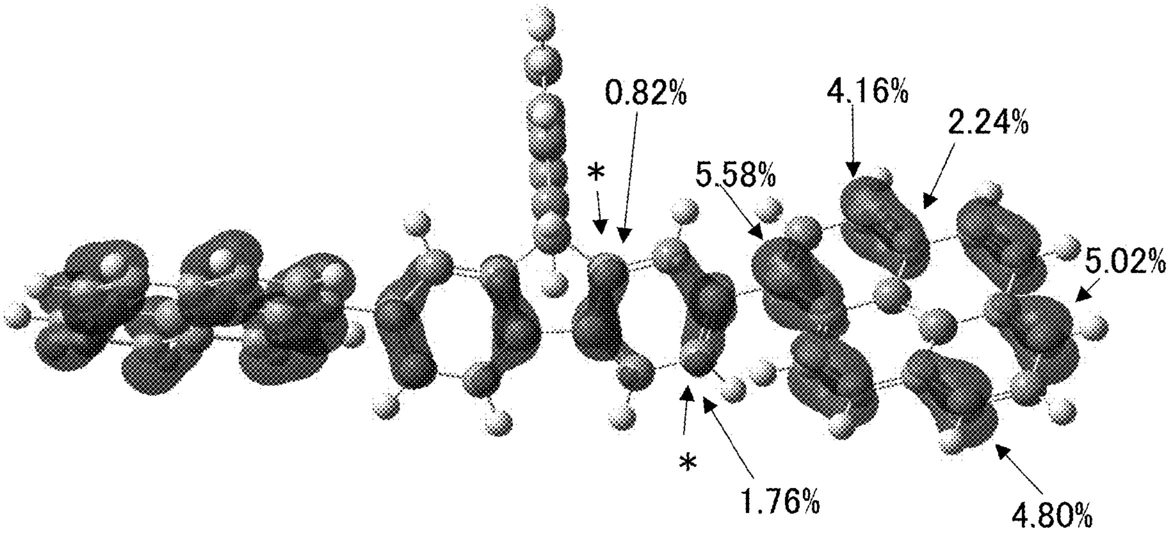

FIG. 19B is an enlarged view showing the HOMO analysis result of Compound 2. FIG. 19B shows percentages of HOMO distribution of carbon atoms. A carbon atom to which an oxygen molecule is likely to be added is denoted with *. FIG. 19B reveals that, in Compound 2, the percentages of HOMO distribution are particularly high in a pyrene skeleton and the percentages of HOMO distribution of carbon atoms to which oxygen is likely to be added in a spirobifluorene skeleton are smaller than 2%, which are low.

The above results show that in the organic compound from which an oxygen adduct is less likely to be formed, a portion to which an oxygen molecule is added and a portion on which HOMO distribution is located tend to be different from each other. Accordingly, it is confirmed that a molecule structure designed to include a portion to which an oxygen molecule is added and a portion on which HOMO distribution is located that are different from each other is suitable for an organic compound from which an oxygen adduct is less likely to be formed.

Example 4

In this example, a light-emitting device 1 of one embodiment of the present invention containing CzPFlt (Structural Formula (202)) analyzed in Example 3 and a comparative light-emitting device 2 were fabricated and the characteristics thereof were compared. Structural Formulae of organic compounds used for the light-emitting device 1 and the comparative light-emitting device 2 are shown below. Furthermore, device structures of the light-emitting device 1 and the comparative light-emitting device 2 are shown.

[Chemical Formula 19]
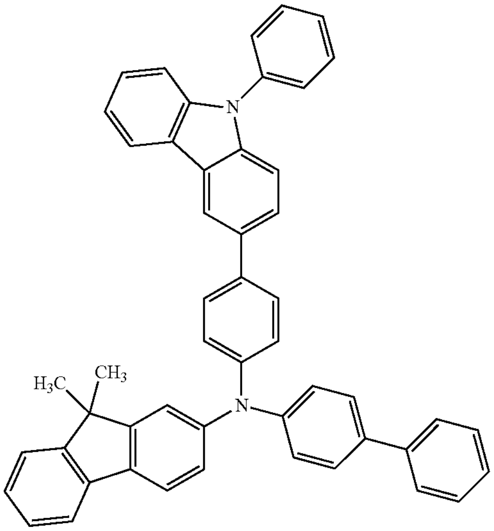
PCBBiF
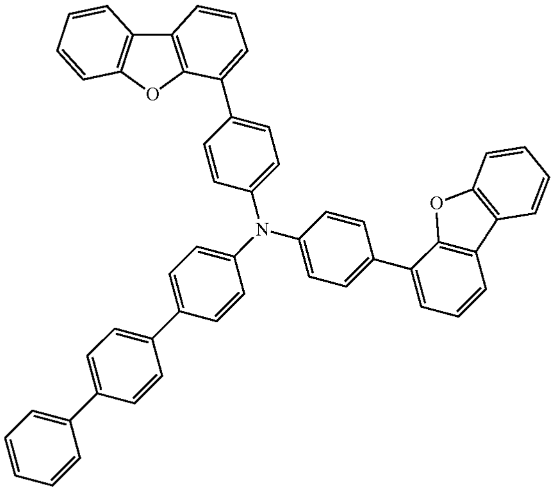
DBfBB1TP
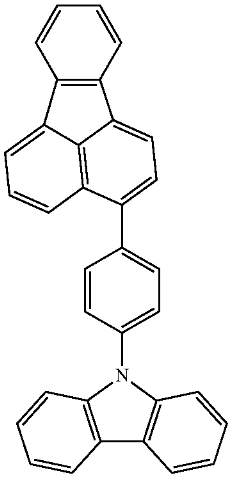
(CzPFlt)
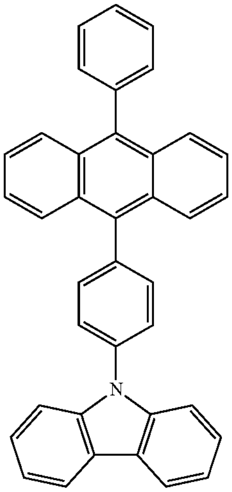
CzPA
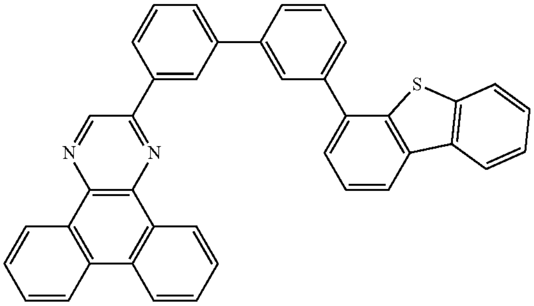
2mDBTBPDBq-II
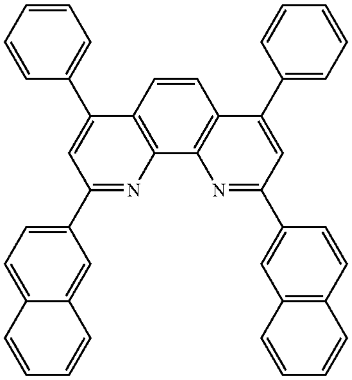
NBPhen -continued

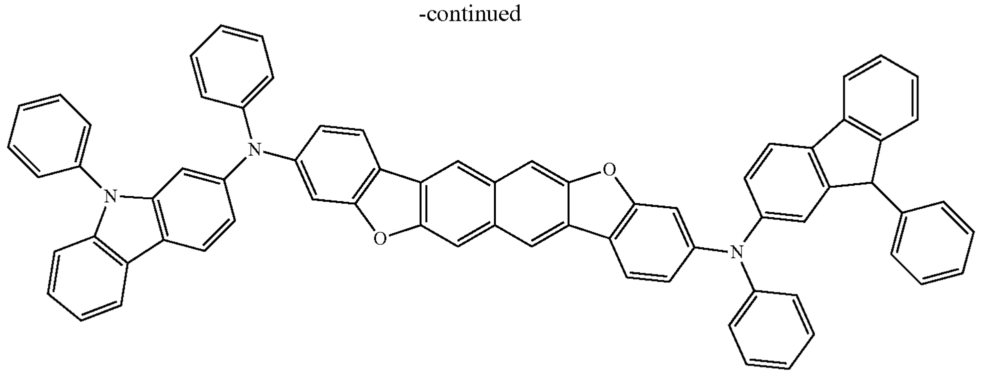

3,10PCA2Nbf(IV)-02

TABLE 4

| | Film thick-ness | Light-emitting device 1 | Comparative light-emitting device 2 |
|---|---|---|---|
| Second electrode | 150 nm | Al | |
| Electron-injection layer | 1 nm | LiF | |
| Electron-transport layer 2 | 15 nm | NBPhen | |
| Electron-transport layer 1 | 10 nm | 2mDBTBPDBq-II | |
| Light-emitting layer | 25 nm | CzPFlt: 3,10PCA2Nbf(IV)-02 (1:0.015) | CzPA: 3,10PCA2Nbf(IV)-02 (1:0.015) |
| Hole-transport layer 2 | 10 nm | DBfBB1TP | |
| Hole-transport layer 1 | 20 nm | PCBBiF | |
| Hole-injection layer | 10 nm | PCBBiF:OCHD-003 (1:0.03) | |
| First electrode | 70 nm | ITSO | |

<<Fabrication of Light-Emitting Device 1>>

In the light-emitting device 1 described in this example, a hole-injection layer, a hole-transport layer, a light-emitting layer, an electron-transport layer, and an electron-injection layer are stacked in this order over a first electrode formed over a substrate, and a second electrode is stacked over the electron-injection layer.

First, the first electrode was formed over the substrate. The electrode area was set to 4 $mm^2$ (2 mm×2 mm). A glass substrate was used as the substrate. As the first electrode, an indium tin oxide containing silicon oxide (ITSO) was deposited to a thickness of 70 nm by a sputtering method. In this example, the first electrode functions as an anode.

For pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 60 minutes.

Next, the hole-injection layer was formed over the first electrode. The hole-injection layer was formed in the following manner: the pressure in the vacuum evaporation apparatus was reduced to $10^{-4}$ Pa, and then N-(biphenyl-4-yl)-N-[4-(9-phenyl-9H-carbazol-3-yl)phenyl]-9,9-dimethyl-9H-fluoren-2-amine (abbreviation: PCBBiF) and an electron acceptor material (OCHD-003) that contains fluorine and has a molecular weight of 672 were deposited by co-evaporation to a thickness of 10 nm in a weight ratio of PCBBiF:OCHD-003=1:0.03.

Then, the hole-transport layer was formed over the hole-injection layer. The hole-transport layer was formed in such a manner that PCBBiF was deposited by evaporation to a thickness of 20 nm, and N,N-bis[4-(dibenzofuran-4-yl)phenyl]-4-amino-p-terphenyl (abbreviation: DBfBB1TP) was deposited by evaporation to a thickness of nm.

Next, the light-emitting layer was formed over the hole-transport layer. The light-emitting layer was formed to a thickness of 25 nm by co-evaporation of 9-[4-(3-fluoranthenyl)phenyl]-9H-carbazole (abbreviation: CzPFlt) and N,N-diphenyl-N,N-bis(9-phenyl-9H-carbazol-2-yl)naphtho[2,3-b;6,7-b']bisbenzofuran-3,10-diamine (abbreviation: 3,10PCA2Nbf(IV)-02) such that the weight ratio of CzPFlt to 3,10PCA2Nbf(IV)-02 was 1:0.015.

After that, the electron-transport layer was formed over the light-emitting layer. As the electron-transport layer, 2-[3'-(dibenzothiophen-4-yl)biphenyl-3-yl]dibenzo[f,h]quinoxaline (abbreviation: 2mDBTBPDBq-II) was evaporated to a thickness of 10 nm and then 2,9-di(2-naphthyl)-4,7-diphenyl-1,10-phenanthroline (abbreviation: NBPhen) was evaporated to a thickness of 15 nm.

Then, the electron-injection layer was formed over the electron-transport layer. The electron-injection layer was formed to a thickness of 1 nm by evaporation of lithium fluoride (LiF).

Next, the second electrode was formed over the electron-injection layer. The second electrode was formed to a thickness of 150 nm by evaporation of aluminum (A1). In this example, the second electrode functions as a cathode.

Through the above process, the light-emitting device 1 was fabricated. Next, a method for fabricating the light-emitting device 2 will be described.

<<Fabrication of Comparative Light-Emitting Device 2>>

The comparative light-emitting device 2 was obtained by replacing CzPFlt used for the light-emitting layer in the light-emitting device 1 with 9-[4-(10-phenyl-9-anthracenyl)phenyl]-9H-carbazole (abbreviation: CzPA). The other components were fabricated in a manner similar to that for the light-emitting device 1.

Shown below is a structure of an oxygen adduct of CzPA, which is formed by addition of an oxygen molecule to the oxygen-molecule addition position with the lowest formation energy.

[Chemical Formula 20]

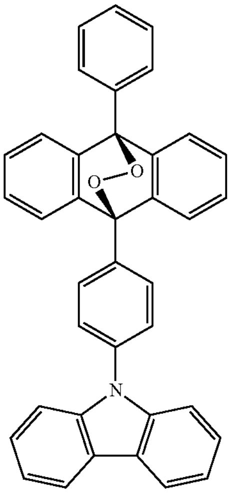

The analysis results of ΔEa, ΔEb, and ΔH of CzPA are shown below.

TABLE 5

| | ΔEa | ΔEb | ΔH |
|---|---|---|---|
| CzPA | 1.37 eV | 0.92 eV | 0.45 eV |

Since ΔEa of CzPA is lower than 1.84 eV and ΔH of CzPA is lower than 0.96 eV, CzPA is found to be a material from which an oxygen adduct is likely to be formed at room temperature. The comparison of the above results with the analysis results of CzPFlt shown in Example 3 reveals that CzPA is a material to which oxygen is more likely to be added as compared to CzPFlt.

The light-emitting device 1 and the comparative light-emitting device 2 were sealed using a glass substrate in a glove box containing a nitrogen atmosphere so as not to be exposed to the air (a sealant was applied to surround the devices and UV treatment and heat treatment at 80° C. for one hour were performed at the time of sealing). FIG. shows the changes in luminance of the light-emitting device 1 and the comparative light-emitting device 2 over driving time in constant-current driving at a current density of 50 $mA/cm^2$.

Figure 20:
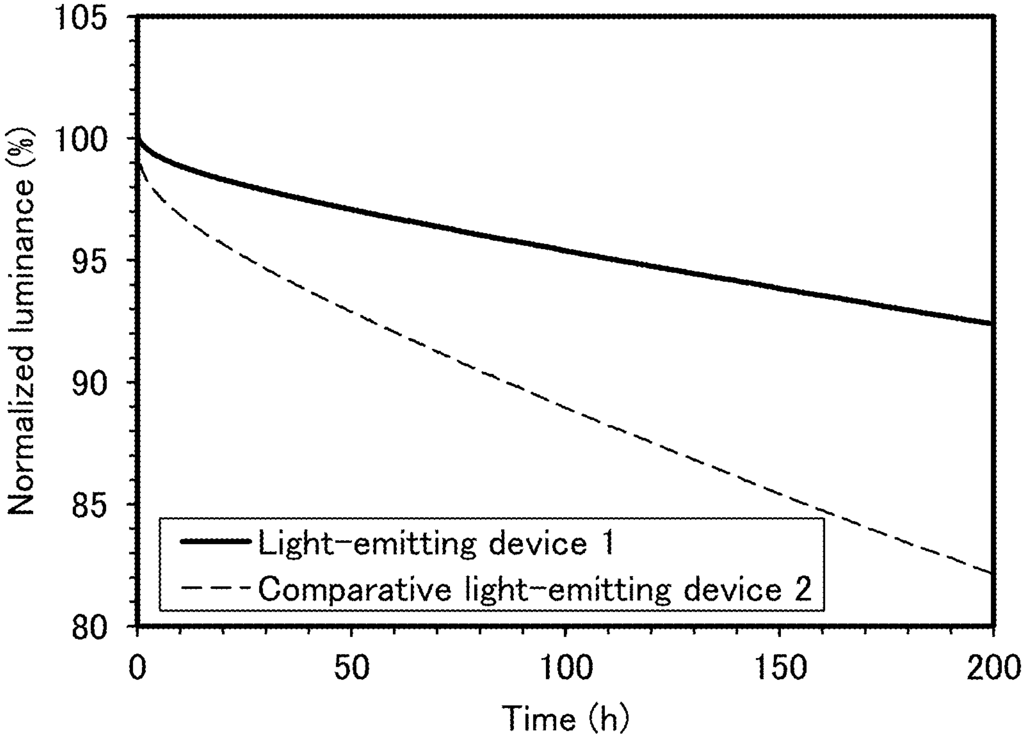
FIG. 20 is a graph showing a change in luminance over driving time of a light-emitting device 1 and a comparative light-emitting device 2.

It is found from FIG. 20 that the light-emitting device 1 of one embodiment of the present invention is a light-emitting device having a longer lifetime than the comparative light-emitting device 2. Note that CzPFlt used for the light-emitting layer in the light-emitting device 1 is a material to which oxygen is less likely to be added as compared to CzPA used for the light-emitting layer in the comparative light-emitting device 2. This indicates that the use of a material to which oxygen is less likely to be added for a light-emitting layer enables a light-emitting device to have a long lifetime.

Reference Example 1

Described in this reference example is a synthesis example of 4-[3'-(dibenzothiophen-4-yl)biphenyl-3-yl]benzofuro[3',2':5,6]benzofuro[3,2-d]pyrimidine (abbreviation: 4mDBtBPBffpm) represented by Structural Formula (100), which is the organic compound described in Embodiment 1.

[Chemical Formula 21]

(100)

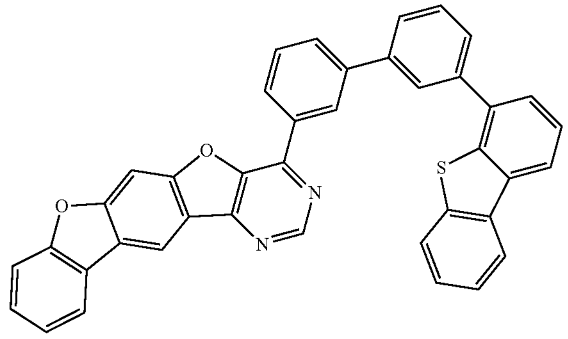

4mDBtBPBffpm

Step 1: Synthesis of 3-methoxydibenzofuran

First, into a three-neck flask equipped with a reflux pipe were put 3-bromodibenzofuran (5.01 g), cesium carbonate (9.81 g), toluene (20 mL), and methanol (20 mL), and the air in the flask was replaced with nitrogen. The mixture in the flask was degassed by being stirred under reduced pressure, and then palladium(II) acetate (abbreviation: $Pd(OAc)_2$) (0.42 g) and 2-di-tert-butylphosphino-2',4',6'-triisopropylbiphenyl (abbreviation: tBuXPhos) (1.53 g) were added thereto. The mixture was stirred at 80° C. for 16.5 hours to be reacted.

After a predetermined time elapsed, the obtained mixture was subjected to suction filtration and the filtrate was concentrated. Then, purification by silica gel column chromatography using a developing solvent (hexane:ethyl acetate=100:1) was performed, so that 2.25 g of a target white solid was obtained in a yield of 56%. A synthesis scheme of Step 1 is shown in (a-1) below.

[Chemical Formula 22]

(a-1)

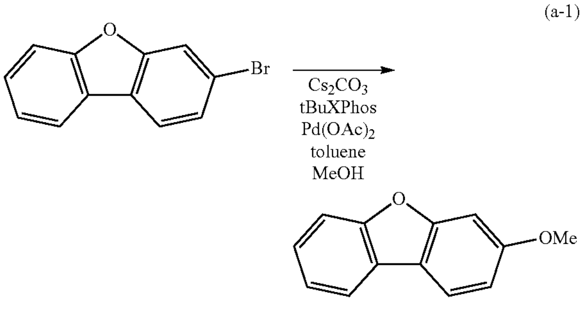

Step 2: Synthesis of 2-bromo-3-methoxydibenzofuran

Next, into a recovery flask were put 3-methoxydibenzofuran (2.25 g) obtained in Step 1 and N,N-dimethylformamide (abbreviation: DMF) (57 mL). To the obtained mixture was added N-bromosuccinimide (abbreviation: NBS) (2.23 g), and stirring was performed at room temperature for 17 hours.

After a predetermined time elapsed, 1M hydrochloric acid (100 mL) was added, and extraction was performed with toluene. Then, purification by silica gel column chromatography using a developing solvent (hexane:ethyl acetate=10:1) was performed, so that 2.65 g of a target white solid was obtained in a yield of 84%. A synthesis scheme of Step 2 is shown in (a-2) below.

[Chemical Formula 23]

(a-2)

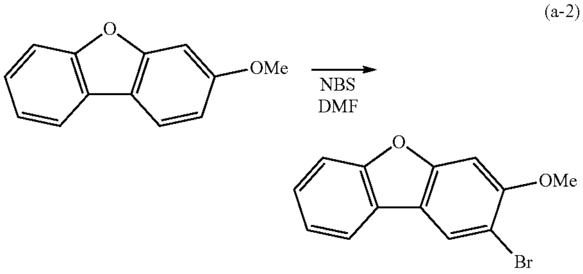

Step 3: Synthesis of 2-cyano-3-methoxydibenzofuran

Next, into a three-neck flask equipped with a reflux pipe were put 2-bromo-3-methoxydibenzofuran (2.63 g) obtained in Step 2 and dehydrated DMF (48 mL), and the air in the flask was replaced with nitrogen. To the obtained mixture was added copper(I) cyanide (1.72 g), and stirring was performed at 150° C. for 7 hours.

After a predetermined time elapsed, water (20 mL) and ammonia water (20 mL) were added, stirring was performed at room temperature for 30 minutes, and extraction was performed with dichloromethane. Then, purification by silica gel column chromatography using a developing solvent (hexane:ethyl acetate=5:1) was performed, so that 1.65 g of a target yellowish white solid was obtained in a yield of 78%. A synthesis scheme of Step 3 is shown in (a-3) below.

[Chemical Formula 24]

(a-3)

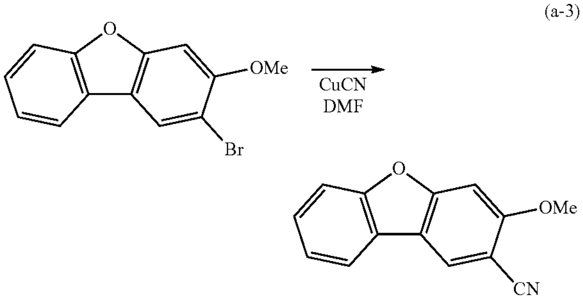

Step 4: Synthesis of 2-cyano-3-hydroxydibenzofuran

Next, into a three-neck flask equipped with a reflux pipe were put 2-cyano-3-methoxydibenzofuran (6.01 g) obtained in Step 3 and pyridine hydrochloride (15.63 g), and the air in the flask was replaced with nitrogen. After that, stirring was performed at 180° C. for 5.5 hours.

After a predetermined time elapsed, the obtained mixture was suction-filtered and washed with water and then washed with methanol, so that 5.53 g of a target yellowish white solid was obtained in a yield of 98%. A synthesis scheme of Step 4 is shown in (a-4) below.

[Chemical Formula 25]

(a-4)

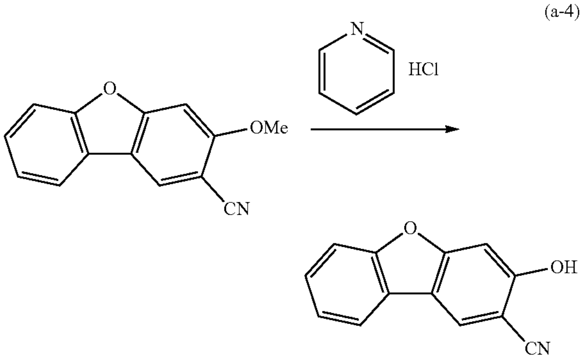

Step 5: Synthesis of ethyl 3-amino-benzo[b]furo[2',3':4,5]benzofuro[1,2-d]furan-2-carboxylate Next, into a three-neck flask equipped with a reflux pipe were put 2-cyano-3-hydroxydibenzofuran (5.53 g) obtained in Step 4, potassium carbonate (7.28 g), and dehydrated DMF (54 mL), and the air in the flask was replaced with nitrogen. To the obtained mixture was added ethyl bromoacetate (4.85 g), and stirring was performed at 100° C. for 7 hours.

After a predetermined time elapsed, water (100 mL) was added, and the obtained mixture was suction-filtered and washed with methanol, so that 7.21 g of a target ocher solid was obtained in a yield of 93%. A synthesis scheme of Step 5 is shown in (a-5) below.

[Chemical Formula 26]

(a-5)

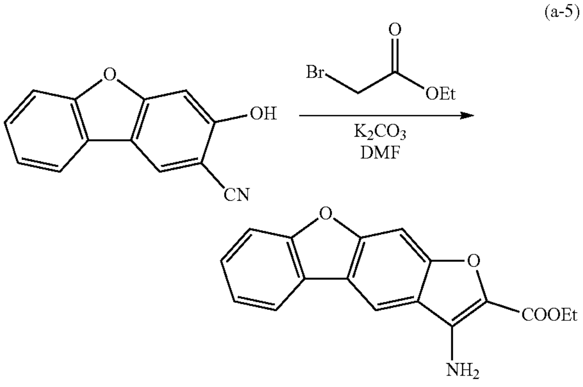

Step 6: Synthesis of benzofuro[3',2':5,6]benzofuro[3,2-d]pyrimidin-4-one

Next, into a three-neck flask equipped with a reflux pipe were put ethyl 3-amino-benzo[b]furo[2',3':4,5]benzofuro[1,2-d]furan-2-carboxylate (3.60 g) obtained in Step 5, formamidine acetate (2.55 g), and formamide (61 mL), the air in the flask was replaced with nitrogen, and stirring was performed at 160° C. for 11 hours.

After a predetermined time elapsed, water (100 mL) was added, and the obtained mixture was suction-filtered and washed with water and ethanol, so that 3.23 g of a target brown solid was obtained in a yield of 96%. A synthesis scheme of Step 6 is shown in (a-6) below.

[Chemical Formula 27]

(a-6)

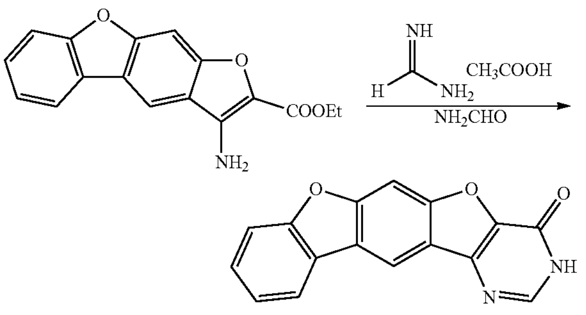

Step 7: Synthesis of 4-chlorobenzofuro[3',2':5,6]benzofuro[3,2-d]pyrimidine

Next, into a three-neck flask equipped with a reflux pipe were put benzofuro[3',2':5,6]benzofuro[3,2-d]pyrimidin-4-one (3.21 g) obtained in Step 6, dehydrated toluene (23 mL), and dehydrated DMF (5.4 mL), and the air in the flask was replaced with nitrogen. To the obtained mixture was added phosphoryl chloride (5.4 mL), and stirring was performed at 100° C. for 14 hours.

After a predetermined time elapsed, the resulting mixture was neutralized with a sodium hydroxide solution and the obtained mixture was suction-filtered and washed with water and ethanol. The obtained solid was dissolved in toluene, and the mixture was filtered through a filter aid in which Celite, alumina, and Celite were stacked in this order, so that 2.12 g of a target yellowish white solid was obtained in a yield of 62%. A synthesis scheme of Step 7 is shown in (a-7) below.

[Chemical Formula 28]

(a-7)

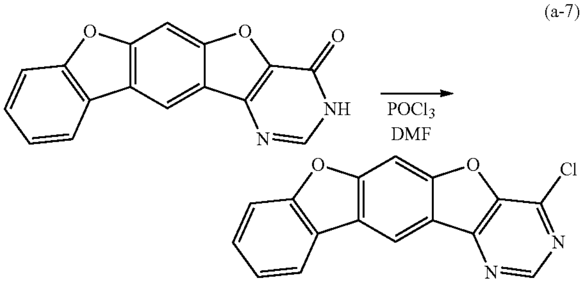

Step 8: Synthesis of 4-[3'-(dibenzothiophen-4-yl)biphenyl-3-yl]benzofuro[3',2':5,6]benzofuro[3,2-d]pyrimidine (abbreviation: 4mDBtBPBffpm)

After that, into a three-neck flask equipped with a reflux pipe were put 4-chlorobenzofuro[3',2':5,6]benzofuro[3,2-d]pyrimidine (1.01 g) obtained in Step 7, 3'-(dibenzothiophen-4-yl)-1,1'-biphenyl-3-ylboronic acid (1.46 g), a 2M potassium carbonate aqueous solution (3.4 mL), toluene (20 mL), and ethanol (2 mL), and the air in the flask was replaced with nitrogen. The mixture in the flask was degassed by being stirred under reduced pressure, and then tetrakis(triphenylphosphine)palladium(0) (abbreviation: $Pd(PPh_3)_4$) (0.20 g) was added thereto. The mixture was stirred at 85° C. for 7 hours to be reacted.

After a predetermined time elapsed, the obtained suspension was suction-filtered and washed with water and ethanol. The obtained solid was dissolved in toluene, and the mixture was filtered through a filter aid in which Celite, alumina, and Celite were stacked in this order. Recrystallization was then performed from toluene, so that 1.80 g of a target white solid was obtained in a yield of 89%.

By a train sublimation method, 1.50 g of the obtained white solid was purified by sublimation. In the purification by sublimation, the solid was heated at 320° C. under a pressure of 2.7 Pa with an argon gas flow rate of 11 mL/min. After the purification by sublimation, 1.64 g of a target white solid was obtained in a yield of 91%. A synthesis scheme of Step 8 is shown in (a-8) below.

[Chemical Formula 29]

(a-8)

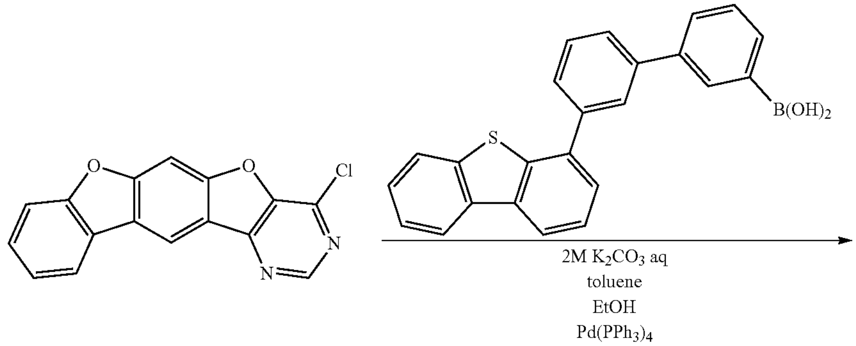

-continued

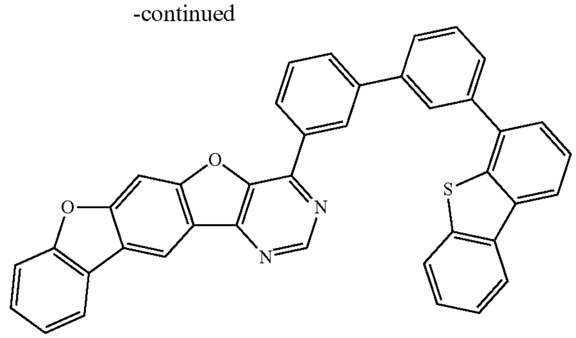

<Characteristics of Organic Compound>

Analysis results by nuclear magnetic resonance ($^1$H-NMR) spectroscopy of the white solid obtained in Step 8 are shown below. The results revealed that 4mDBtBPBffpm, the organic compound represented by Structure Formula (100), was obtained in this synthesis example $^1$H-NMR. δ ($CDCl_3$): 7.43-7.47 (m, 2H), 7.50 (t, 1H), 7.54 (t, 1H), 7.61-7.64 (m, 3H), 7.70 (t, 1H), 7.76 (t, 1H), 7.81 (t, 2H), 7.84-7.86 (m, 2H), 7.93 (d, 1H), 8.10 (d, 1H), 8.19 (s, 1H), 8.21-8.24 (m, 2H), 8.64 (d, 1H), 8.84 (s, 1H), 8.97 (s, 1H), 9.31 (s, 1H).

Reference Example 2

In this reference example, a synthesis method of 9-phenyl-4-[3'-(dibenzothiophen-4-yl)biphenyl-3-yl]benzofuro[3',2':5,6]benzofuro[3,2-d]pyrimidine (abbreviation: 9Ph-4mDBtBPBffpm) represented by Structural Formula (101), which is the organic compound described in Embodiment 1, is specifically described.

[Chemical Formula 30]

(101)

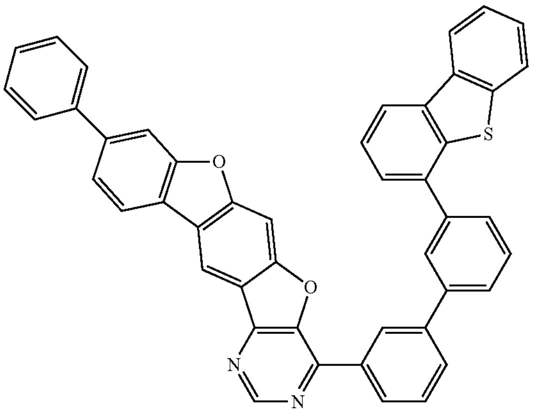

9Ph-4mDBtBPBffpm

Step 1: Synthesis of 4,4'-dibromo-2-fluoro-2'-methoxy-1,1'-biphenyl

Into a 500-mL three-neck flask were put (4-bromo-2-methoxyphenyl)boronic acid (19.30 g), 1-bromo-3-fluoro-4-iodobenzene (25.16 g), cesium carbonate (82.44 g), toluene (125 mL), ethanol (42 mL), and water (42 mL), and the mixture in the flask was degassed by being stirred under reduced pressure. After that, tetrakis(triphenylphosphine)palladium(0) (abbreviation: $Pd(PPh_3)_4$) (4.68 g) was added to the mixture, and then the obtained mixture was stirred under nitrogen stream at 80° C. for 12 hours. After the reaction, the precipitated solid was removed by suction filtration. The filtrate was subjected to extraction with toluene, and the obtained organic layer was washed with saturated saline and dried with magnesium sulfate. This mixture was separated by gravity filtration, and the filtrate was concentrated to give a brown oily substance. The obtained oily substance was purified by silica gel column chromatography (hexane: toluene=15:1) to give 27.34 g of a target transparent oily substance in a yield of 91%. A synthesis scheme of Step 1 is shown in (b-1) below.

[Chemical Formula 31]

(b-1)

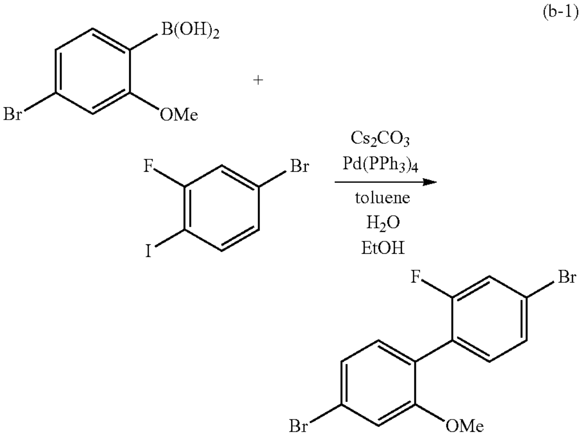

Step 2: Synthesis of 4,4'-dibromo-2'-fluoro-1,1'-biphenyl-2-ol

Into a 1-L three-neck flask were put 4,4'-dibromo-2-fluoro-2'-methoxy-1,1'-biphenyl (27.34 g) obtained in Step 1 and dehydrated dichloromethane (380 mL), and the mixture was stirred while being cooled. To the mixture was dropped 85 mL of boron tribromide (17% in dichloromethane, ca. 1 mol/L), and the resulting mixture was stirred at room temperature for 19 hours. After the reaction, the solution in the flask was stirred while being cooled, and 10 mL of water was dropped to the solution. After that, 200 mL of water was added to the solution, and then extraction was performed with dichloromethane. The obtained organic layer was washed with a saturated aqueous solution of sodium hydrogen carbonate and saturated saline, and then was dried with magnesium sulfate. This mixture was separated by gravity filtration, and the filtrate was concentrated to give 25.71 g of a target white solid in a yield of 98%. A synthesis scheme of Step 2 is shown in (b-2) below.

[Chemical Formula 32]

(b-2)

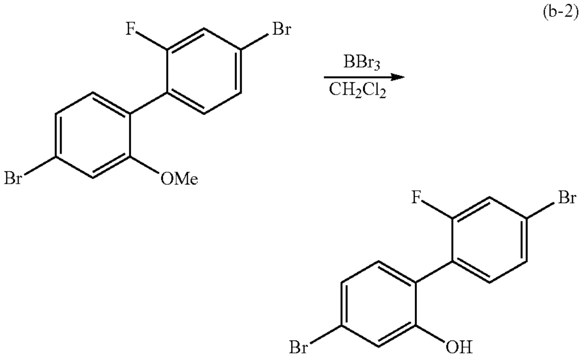

Step 3: Synthesis of 3,7-dibromodibenzofuran

Into a 1-L three-neck flask were put 4,4'-dibromo-2'-fluoro-1,1'-biphenyl-2-ol (25.71 g) obtained in Step 2, potassium carbonate (17.12 g), and N-methylpyrrolidone (500 mL), and the mixture in the flask was degassed by being stirred under reduced pressure. After that, the mixture in the flask was stirred under nitrogen stream at 180° C. for 3 hours. After a predetermined time elapsed, 4 L of water was added to the reaction solution, and the precipitate was collected by suction filtration. This solid was washed with water and ethanol, so that 23.45 g of a target white solid was obtained in a yield of 97%. A synthesis scheme of Step 3 is shown in (b-3) below.

[Chemical Formula 33]

(b-3)

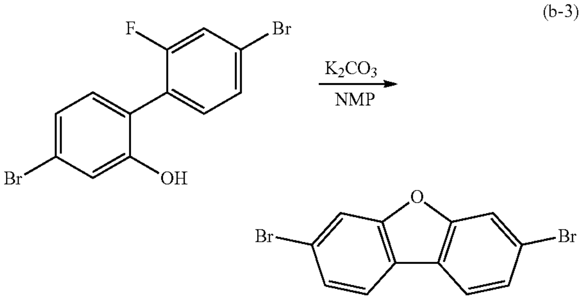

Step 4: Synthesis of 3-bromo-7-phenyldibenzofuran

Into a 500-mL three-neck flask were put 3,7-dibromodibenzofuran (13.45 g) obtained in Step 3, phenylboronic acid (5.55 g), potassium carbonate (17.08 g), toluene (165 mL), ethanol (41 mL), and water (62 mL), and the mixture in the flask was degassed by being stirred under reduced pressure. After that, the mixture in the flask was heated to 40° C. under nitrogen stream, tetrakis(triphenylphosphine)palladium(0) (abbreviation: $Pd(PPh_3)_4$) (2.45 g) was added to the mixture, and then the obtained mixture was stirred under nitrogen stream at 80° C. for 11 hours. After the reaction, the precipitated solid was separated by suction filtration, and the obtained solid was washed with water, ethanol, and toluene to give 3.91 g of a solid. This solid was recrystallized with toluene to give 2.25 g of a target white solid.

The filtrate obtained by the suction filtration was subjected to extraction with toluene, and the obtained organic layer was washed with saturated saline and dried with magnesium sulfate. This mixture was separated by gravity filtration, and the filtrate was concentrated to give 9.80 g of a yellowish white solid. This solid was subjected to ultrasonic cleaning using chloroform and then subjected to suction filtration, so that 5.25 g of a white solid was obtained. The filtrate obtained by the suction filtration was concentrated and purified by silica gel column chromatography and high performance liquid chromatography to give 1.29 g of a white solid.

These solids were mixed to obtain 8.79 g of 3-bromo-7-phenyldibenzofuran (white solid) in a yield of 66%. A synthesis scheme of Step 4 is shown in (b-4) below.

[Chemical Formula 34]

(b-4)

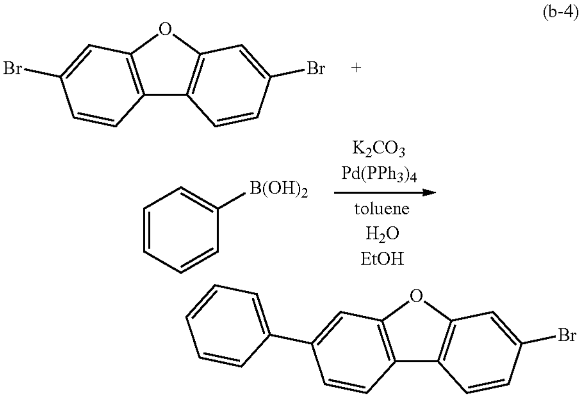

Step 5: Synthesis of 3-methoxy-7-phenyldibenzofuran

Into a three-neck flask were put 3-bromo-7-phenyldibenzofuran (12.39 g) obtained in Step 4, cesium carbonate (19.00 g), toluene (40 mL), and methanol (40 mL), and the mixture in the flask was degassed by being stirred under reduced pressure. After that, the mixture in the flask was heated to 60° C. under nitrogen stream, palladium(II) acetate (abbreviation: $Pd(OAc)_2$) (0.93 g) and 2-di-tert-butylphosphino-2',4',6'-triisopropylbiphenyl (abbreviation: tBuXPhos) (3.26 g) were added to the mixture, and then the obtained mixture was stirred at 80° C. for 3 hours. After a predetermined time elapsed, the obtained mixture was subjected to suction filtration and then, the filtrate was purified by silica gel column chromatography and high performance liquid chromatography, so that 5.68 g of a target white solid was obtained in a yield of 54%. A synthesis scheme of Step 5 is shown in (b-5) below.

[Chemical Formula 35]

(b-5)

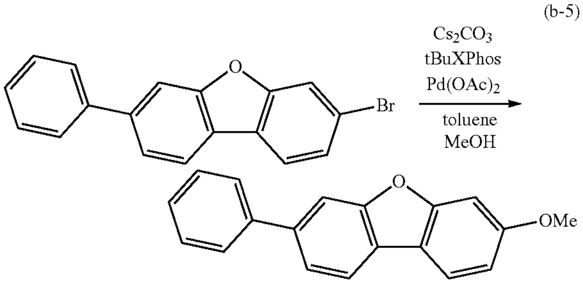

Step 6: Synthesis of 2-bromo-3-methoxy-7-phenyldibenzofuran

Into a 1-L recovery flask were put 3-methoxy-7-phenyldibenzofuran (5.68 g) obtained in Step 5 and N,N-dimethylformamide (abbreviation: DMF) (180 mL), and the mixture was stirred at room temperature. To the obtained mixture was added N-bromosuccinimide (abbreviation: NBS) (4.06 g), and stirring was performed at room temperature for two nights. After a predetermined time elapsed, toluene (200 mL) and water (200 mL) were added to the mixture and then extraction was performed with toluene. The obtained organic layer was washed with a saturated aqueous solution of sodium hydrogen carbonate and saturated saline, and then was dried with magnesium sulfate. This mixture was separated by gravity filtration, and the filtrate was concentrated to give a solid. This solid was subjected to ultrasonic cleaning using toluene and methanol and then subjected to suction filtration, so that 6.78 g of a target white solid was obtained in a yield of 93%. A synthesis scheme of Step 6 is shown in (b-6) below.

[Chemical Formula 36]

(b-6)

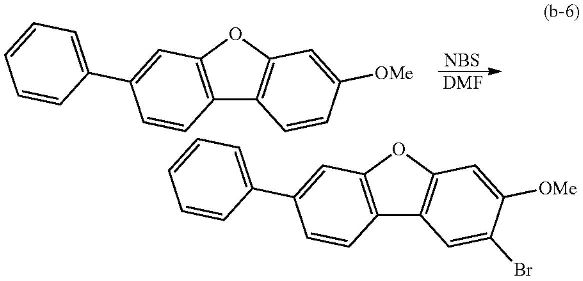

Step 7: Synthesis of 2-cyano-3-methoxy-7-phenyldibenzofuran

Next, into a 500-mL three-neck flask equipped with a reflux pipe were put 2-bromo-3-methoxy-7-phenyldibenzofuran (6.78 g) obtained in Step 6 and dehydrated DMF (100 mL), and the air in the flask was replaced with nitrogen. To the obtained mixture was added copper(I) cyanide (58.95 g), and stirring was performed at 150° C. for 6 hours. After a predetermined time elapsed, water (60 mL) and ammonia water (60 mL) were added, stirring was performed at room temperature for 30 minutes, and extraction was performed with dichloromethane. Then, purification by silica gel column chromatography using toluene as a developing solvent was performed to give a solid. The obtained solid was subjected to ultrasonic cleaning using toluene and then subjected to suction filtration, so that 5.39 g of a target white solid was obtained in a yield of 94%. A synthesis scheme of Step 7 is shown in (b-7) below.

[Chemical Formula 37]

(b-7)

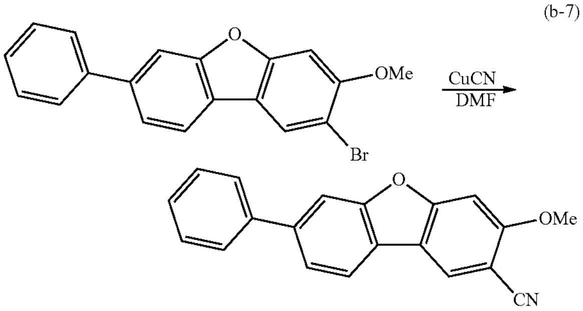

Step 8: Synthesis of 2-cyano-3-hydroxy-7-phenyldibenzofuran

Next, into a 200-mL three-neck flask equipped with a reflux pipe were put 2-cyano-3-methoxy-7-phenyldibenzofuran (5.39 g) obtained in Step 7 and pyridine hydrochloride (21.37 g), and the mixture was heated to 180° C. under nitrogen stream and stirred for 5.5 hours. After a predetermined time elapsed, water was put to the reaction solution and ultrasonic cleaning was performed. This mixed solution was subjected to suction filtration, and the resulting solid was washed with water and methanol to give 4.54 g of a target white solid in a yield of 88%. A synthesis scheme of Step 8 is shown in (b-8) below.

[Chemical Formula 38]

(b-8)

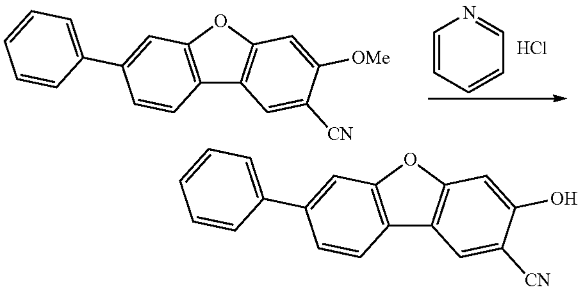

Step 9: Synthesis of ethyl 3-amino-7-phenyl-benzofuro[6,5-b]benzofuran-2-carboxylate Next, into a three-neck flask equipped with a reflux pipe were put 2-cyano-3-hydroxy-7-phenyldibenzofuran (4.54 g) obtained in Step 8 and potassium carbonate (4.45 g), and the air in the flask was replaced with nitrogen. To the obtained mixture was added dehydrated DMF (32 mL) and ethyl bromoacetate (3.06 g), and stirring was performed at 100° C. for 4.5 hours. After a predetermined time elapsed, water (100 mL) was added, and the obtained mixture was suction-filtered and washed with methanol, so that 5.64 g of a target white solid was obtained in a yield of 95%. A synthesis scheme of Step 9 is shown in (b-9) below.

[Chemical Formula 39]

(b-9)

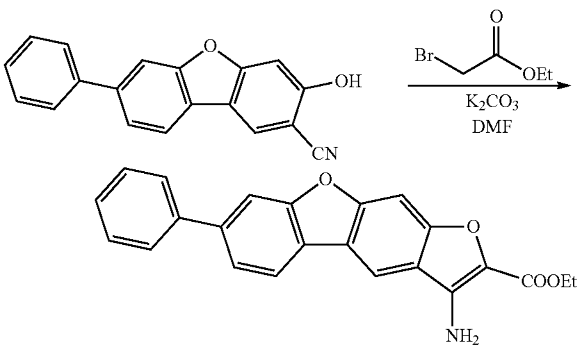

Step 10: Synthesis of 9-phenyl-benzofuro[3',2':5,6]benzofuro[3,2-d]pyrimidin-4-one Next, into a 200-mL three-neck flask equipped with a reflux pipe were put ethyl 3-amino-7-phenyl-benzofuro[6,5-b]benzofuran-2-carboxylate (5.64 g) obtained in Step 9, formamidine acetate (3.20 g), and formamide (76 mL), and the mixture was heated to 160° C. under nitrogen stream and stirred for 7 hours. After a predetermined time elapsed, water (100 mL) was added, and the obtained mixture was suction-filtered and washed with methanol, so that 5.07 g of a target brown solid was obtained in a yield of 95%. A synthesis scheme of Step 10 is shown in (b-10) below.

[Chemical Formula 40]

(b-10)

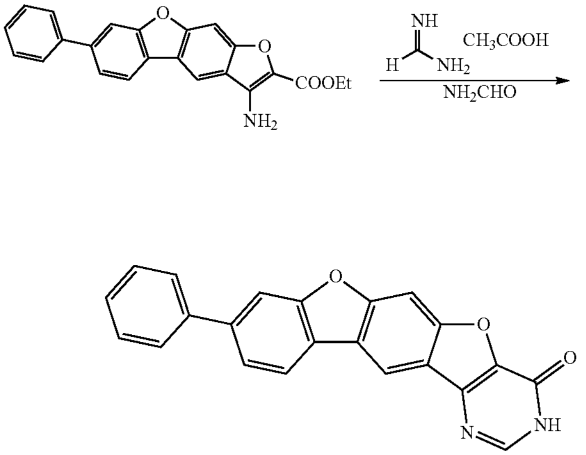

Step 11: Synthesis of 9-phenyl-4-chlorobenzofuro[3',2':5,6]benzofuro[3,2-d]pyrimidine Next, into a three-neck flask equipped with a reflux pipe were put 9-phenyl-benzofuro[3',2':5,6]benzofuro[3,2-d]pyrimidin-4-one (4.04 g) obtained in Step 10, and the air in the flask was replaced with nitrogen. To the obtained mixture was added dehydrated toluene (60 mL), dehydrated DMF (5.5 mL), and phosphoryl chloride (5.5 mL), and stirring was performed at 100° C. for 13 hours. After a predetermined time elapsed, the reaction solution was poured into a sodium hydroxide solution to neutralize the solution. The obtained mixture was suction-filtered and washed with water and ethanol. The obtained solid was dissolved in toluene, and the mixture was filtered through a filter aid in which Celite, alumina, and Celite were stacked in this order, so that 2.80 g of a target white solid was obtained in a yield of 66%. A synthesis scheme of Step 11 is shown in (b-11) below.

[Chemical Formula 41]

(b-11)

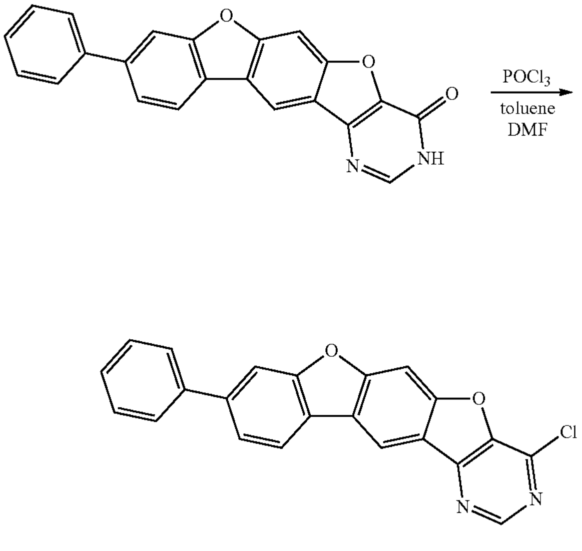

Step 12: Synthesis of 9Ph-4mDBtBPBffpm

Into a three-neck flask equipped with a reflux pipe were put 9-phenyl-4-chlorobenzofuro[3',2':5,6]benzofuro[3,2-d]pyrimidine (1.50 g) obtained in Step 11, 3'-(dibenzothiophen-4-yl)-1,1'-biphenyl-3-ylboronic acid (1.85 g), a 2M potassium carbonate aqueous solution (4.0 mL), toluene (25 mL), and ethanol (3 mL), and the air in the flask was replaced with nitrogen. The mixture in the flask was degassed by being stirred under reduced pressure, and then tetrakis(triphenylphosphine)palladium(0) (abbreviation: $Pd(PPh_3)_4$) (0.65 g) was added thereto. The mixture was stirred at 90° C. for 11 hours to be reacted. After a predetermined time elapsed, the obtained suspension was suction-filtered and washed with water and ethanol. The obtained solid was dissolved in toluene, and the mixture was filtered through a filter aid in which Celite, alumina, and Celite were stacked in this order. Recrystallization was then performed from toluene, so that 2.31 g of a target light gray solid was obtained in a yield of 85%.

By a train sublimation method, 2.31 g of the obtained light gray solid was purified by sublimation. In the purification by sublimation, the solid was heated at 355° C. under a pressure of 3.0 Pa with an argon gas flow rate of 15 mL/min. After the purification by sublimation, 2.08 g of a target white solid was obtained in a collection rate of 90%. A synthesis scheme of Step 12 is shown in (b-12) below.

[Chemical Formula 42]

(b-12)

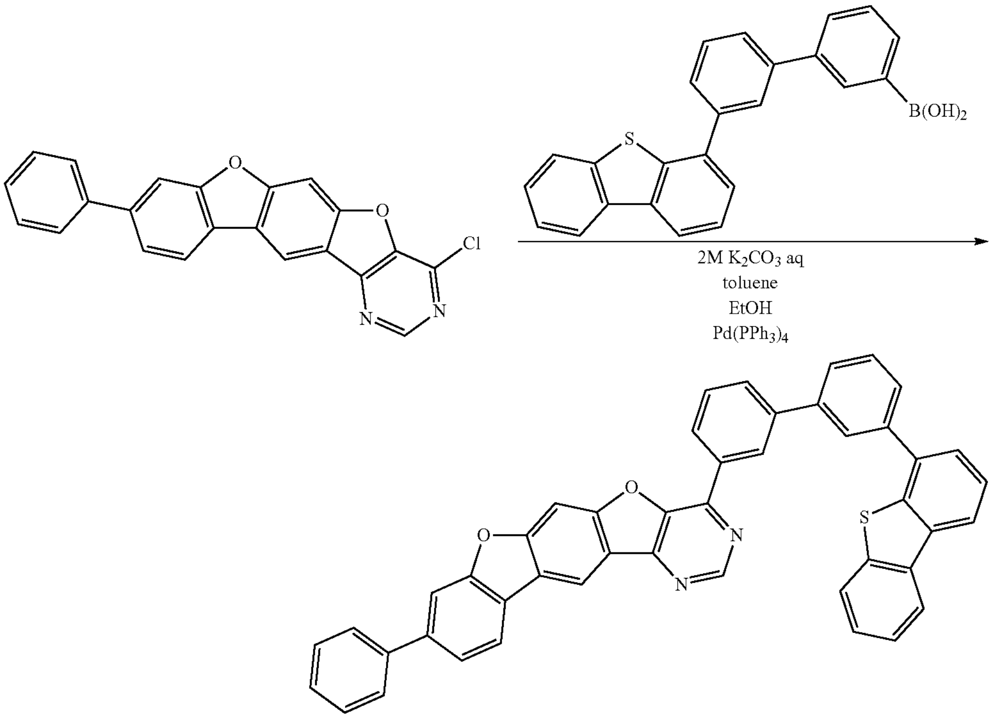

Analysis results by nuclear magnetic resonance ($^1H$-NMR) spectroscopy of the white solid obtained in Step 12 are shown below. The results revealed that 9Ph-4mDBtBPBfpm, the organic compound represented by Structure Formula (101), was obtained in this synthesis example $^1H$-NMR. δ ($C_2D_2Cl_4$, 500 mHz, 100° C.): 7.44-7.57 (m, 5H), 7.67-7.92 (m, 12H), 7.98 (d, 1H), 8.17 (d, 1H), 8.23-8.28 (m, 3H), 8.70 (d, 1H), 8.91 (s, 1H), 9.04 (s, 1H), 9.37 (s, 1H).

This application is based on Japanese Patent Application Serial No. 2022-127992 filed with Japan Patent Office on Aug. 10, 2022 and Japanese Patent Application Serial No. 2022-195341 filed with Japan Patent Office on Dec. 7, 2022, the entire contents of which are hereby incorporated by reference.

What is claimed is:

1. A light-emitting device comprising:

a first electrode;

a second electrode; and a light-emitting layer between the first electrode and the second electrode, wherein the light-emitting layer comprises a light-emitting substance and a first organic compound, wherein a difference between a sum of energy of the first organic compound in a ground state and energy of an oxygen molecule in a ground state and energy of a transition state formed by the first organic compound and the oxygen molecule is greater than or equal to 1.84 eV, and wherein a difference between the energy of the transition state formed by the first organic compound and the oxygen molecule and energy of an oxygen adduct of the first organic compound in a ground state is less than or equal to 0.87 eV.

2. The light-emitting device according to claim 1, wherein the energy of the oxygen adduct of the first organic compound in a ground state is higher than the sum of the energy of the first organic compound in a ground state and the energy of the oxygen molecule in a ground state, and wherein a difference between the energy of the oxygen adduct of the first organic compound in a ground state and the sum of the energy of the first organic compound in a ground state and the energy of the oxygen molecule in a ground state is greater than or equal to 0.97 eV.

3. The light-emitting device according to claim 1, wherein the first organic compound comprises a first partial structure and a second partial structure different from the first partial structure, wherein highest occupied molecular orbital distribution of the first organic compound is located on the first partial structure, and wherein the oxygen adduct is formed when an oxygen molecule is added to the second partial structure.

4. A light-emitting apparatus comprising:

the light-emitting device according to claim 1; and a transistor or a substrate.

5. An electronic device comprising:

the light-emitting apparatus according to claim 4; and a sensor unit, an input unit, or a communication unit.

6. A lighting device comprising:

the light-emitting apparatus according to claim 4; and a housing.

7. A light-emitting device comprising:

a first electrode;

a second electrode; and a light-emitting layer between the first electrode and the second electrode, wherein the light-emitting layer comprises a light-emitting substance and a first organic compound, wherein the first organic compound is represented by any one of General Formula (G1-1), General Formula (G1-2), and General Formula (G1-3), (G1-1)

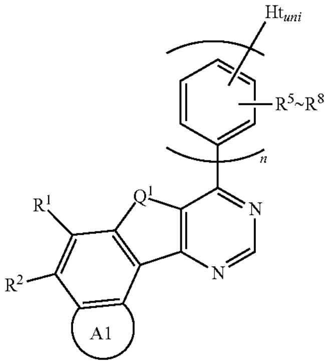

(G1-2)

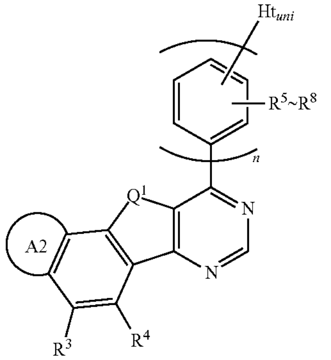

(G1-3)

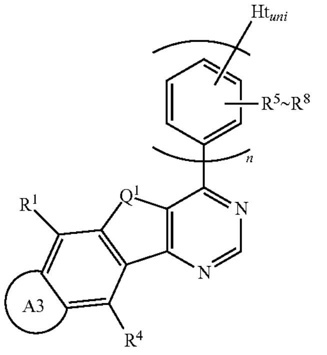

wherein, in the Formula (G1-1), General Formula (G1-2), and General Formula (G1-3):

$Q^1$ represents oxygen or sulfur;

each of $R^1$ to $R^8$ independently represents any one of hydrogen, a substituted or unsubstituted alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, and substituted or unsubstituted polycyclic saturated hydrocarbon having 7 to 10 carbon atoms;

n represents an integer of 0 to 4;

$Ht_{uni}$ represents a hole-transport skeleton;

each of A1, A2, and A3 is represented by any one of General Formulae (Ax-1) to (Ax-5);

(Ax-1)

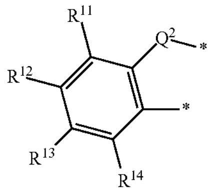

(Ax-2)

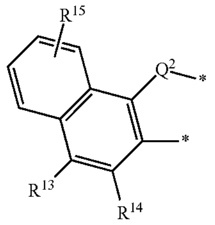

(Ax-3)

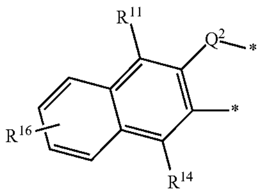

(Ax-4)

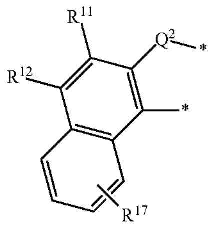

(Ax-5)

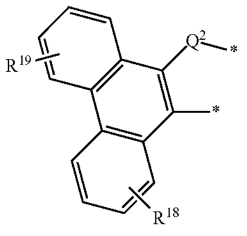

$Q^2$ represents oxygen or sulfur;

each of $R^{11}$ to $R^{14}$ independently represents any one of hydrogen, an alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, and substituted or unsubstituted polycyclic saturated hydrocarbon having 7 to 10 carbon atoms;

each of $R^{15}$ to $R^{19}$ represents 1 to 4 substituents and independently represents any one of hydrogen, a substituted or unsubstituted alkyl group having 1 to 6 carbon atoms, a substituted or unsubstituted aryl group having 6 to 18 carbon atoms, substituted or unsubstituted monocyclic saturated hydrocarbon having 5 to 7 carbon atoms, and substituted or unsubstituted polycyclic saturated hydrocarbon having 7 to 10 carbon atoms; and

* represents a bonding portion with any one of benzofuropyrimidine rings and benzothienopyrimidine rings in the General Formula (G1-1), General Formula (G1-2), and General Formula (G1-3), wherein a difference between a sum of energy of the first organic compound in a ground state and energy of an oxygen molecule in a ground state and energy of a transition state formed by the first organic compound and the oxygen molecule is greater than or equal to 1.84 eV, and wherein a difference between the energy of the transition state formed by the first organic compound and the oxygen molecule and energy of an oxygen adduct of the first organic compound in a ground state is less than or equal to 0.87 eV.

8. The light-emitting device according to claim 7, wherein the energy of the oxygen adduct of the first organic compound in a ground state is higher than the sum of the energy of the first organic compound in a ground state and the energy of the oxygen molecule in a ground state, and wherein a difference between the energy of the oxygen adduct of the first organic compound in a ground state and the sum of the energy of the first organic compound in a ground state and the energy of the oxygen molecule in a ground state is greater than or equal to 0.97 eV.

9. The light-emitting device according to claim 7, wherein the first organic compound comprises a first partial structure and a second partial structure different from the first partial structure, wherein highest occupied molecular orbital distribution of the first organic compound is located on the first partial structure, and wherein the oxygen adduct is formed when an oxygen molecule is added to the second partial structure.

10. A light-emitting apparatus comprising:

the light-emitting device according to claim 7; and a transistor or a substrate.

11. An electronic device comprising:

the light-emitting apparatus according to claim 10; and a sensor unit, an input unit, or a communication unit.

12. A lighting device comprising:

the light-emitting apparatus according to claim 10; and a housing.

* * * * *